United States Patent [19]
Havel

[11] Patent Number: 6,018,237
[45] Date of Patent: *Jan. 25, 2000

[54] VARIABLE COLOR DISPLAY SYSTEM

[75] Inventor: Karel Havel, Bramalea, Canada

[73] Assignee: Texas Digital Systems, Inc., College Station, Tex.

[ * ] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/910,080

[22] Filed: Aug. 12, 1997

Related U.S. Application Data

[62] Division of application No. 08/571,246, Dec. 12, 1995, Pat. No. 5,656,935, which is a division of application No. 08/187,350, Jan. 27, 1994, Pat. No. 5,475,300, which is a division of application No. 07/865,460, Apr. 9, 1992, Pat. No. 5,283,517, which is a division of application No. 07/628,328, Dec. 14, 1990, Pat. No. 5,122,733, which is a division of application No. 07/197,322, May 23, 1988, abandoned, which is a division of application No. 06/819,111, Jan. 15, 1996, Pat. No. 4,794,383.

[51] Int. Cl.[7] .............................. G01R 15/08; G09G 5/02
[52] U.S. Cl. .............................. 324/115; 345/83; 345/150
[58] Field of Search .................................. 324/115, 99 D, 324/96; 345/150, 83; 313/500, 501; 257/89, 90

[56] References Cited

U.S. PATENT DOCUMENTS

| | | | |
|---|---|---|---|
| 2,889,518 | 6/1959 | Hudson et al. | 324/115 |
| 3,595,991 | 7/1971 | Diller | 178/5.4 EL |
| 3,740,570 | 6/1973 | Kaelin et al. | 307/40 |
| 3,760,174 | 9/1973 | Boenning et al. | 240/1 R |
| 3,911,418 | 10/1975 | Takeda | 340/324 |
| 3,924,227 | 12/1975 | Stolov | 340/336 |
| 4,086,514 | 4/1978 | Havel | 313/500 |
| 4,360,804 | 11/1982 | Ohura | 340/703 |
| 4,488,149 | 12/1984 | Givens, Jr. | 340/762 |
| 4,559,480 | 12/1985 | Nobs | 315/324 |
| 4,720,709 | 1/1988 | Imamura et al. | |
| 4,740,818 | 4/1988 | Tsilibes et al. | 399/181 |
| 4,794,383 | 12/1988 | Havel | 345/150 |
| 4,831,326 | 5/1989 | Havel | 324/115 |

OTHER PUBLICATIONS

Wagner, Bill, Design Ideas, EDN, vol. 25, No. 19, p. 164, Oct. 20, 1980.

Landauer, R. W., IBM Technical Disclosure Bulletin, Electroluminescent Display, vol. 8, No. 11, Apr. 1966.

Smithline, L.M., "Dual light emitting diode synthesizes polychromatic light", Electronics, Aug. 16, 1979, p. 130.

Svestka, M. et al, "LED's change color to indicate balance voltage", Electronic Engineering, vol. 48, No. 576, p. 19, Feb. 1976.

Saitoh, T. et al. "Multi–color light emitting diodes with double junction structure". IEEE Transactions on Electron Devices, Feb. 1975, vol. ED–22, No. 2, pp. 29–32.

Yamaguchi, T. et al, "a High Brightness Gap Multicolor LED", IEEE Transactions on Electron Devices, vol. ED–28, No. 5, May 1981, pp. 588–592.

Baker, M., "Chip changes the color of light emitting diodes", Electronics, Apr. 7, 1981, pp. 158–159.

Rao, V., Two LED's blend and blink to indicate six states. Electronic Design, vol. 30, No. 16, p. 220, Aug. 5, 1982.

Kojima, T. "Recent flat panel development in Japan", held in San Diego, CA, Apr. 29–May 1, 1980. SID 80 Digest, pp. 22–23.

(List continued on next page.)

*Primary Examiner*—Ernest Karlsen
*Attorney, Agent, or Firm*—Akin, Gump, Strauss, Hsuer & Feld, L.L.P.

[57] ABSTRACT

A variable color display system exhibits a display unit in a color in accordance with the value of a limit. The color signals are developed in accordance with the value of the limit and applied to a color control input of the display system to control its color substantially continuously.

8 Claims, 69 Drawing Sheets

OTHER PUBLICATIONS

Niina, T. et al, "A multi–color GaP LED flat panel display device" Held New York, NY, USA, Apr. 28–30, 1981. 1981 SID International Symposium Digest of Papers, vol. XII (1981), pp. 140–141.

Niina, T. et al, "A multi–color LED flat panel display device for colorful displays of letters and figures". Proceedings of the SID, vol. 23, No. 2, pp. 73–76, 1982.

O'Mara, P.A. et al, "Microprocessor–controlled light emitting diode dark adaptometer". Medical & Biological Engineering and Computing, vol. 20, No. 1, pp. 70–76, 1982.

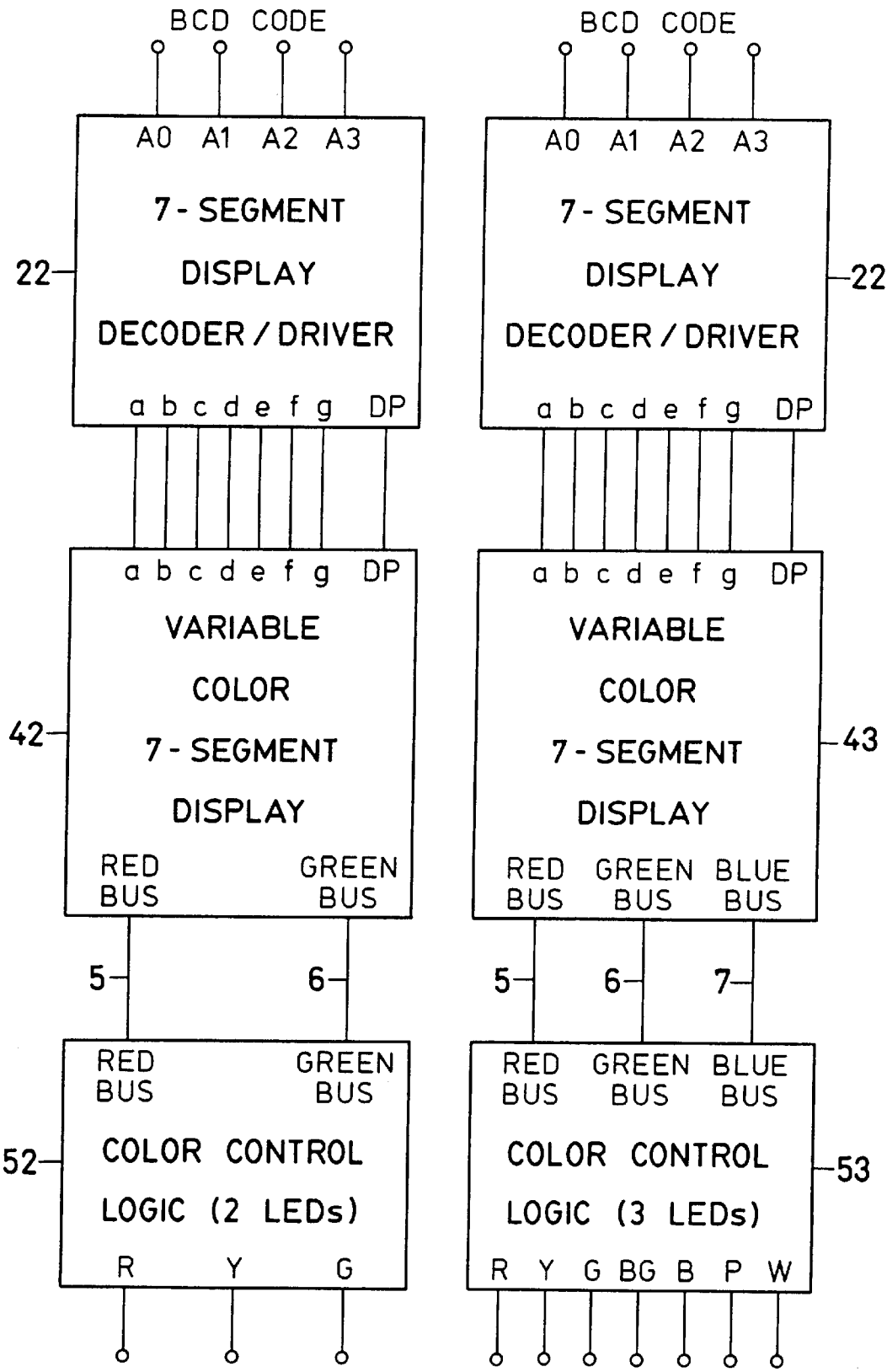

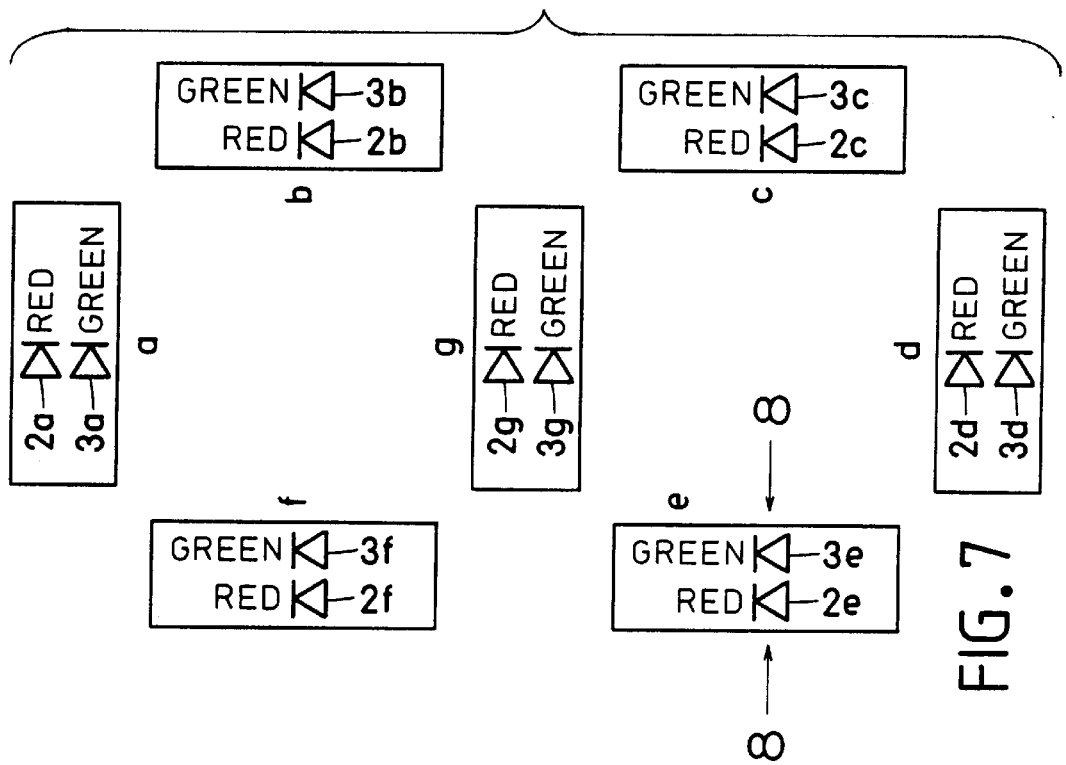
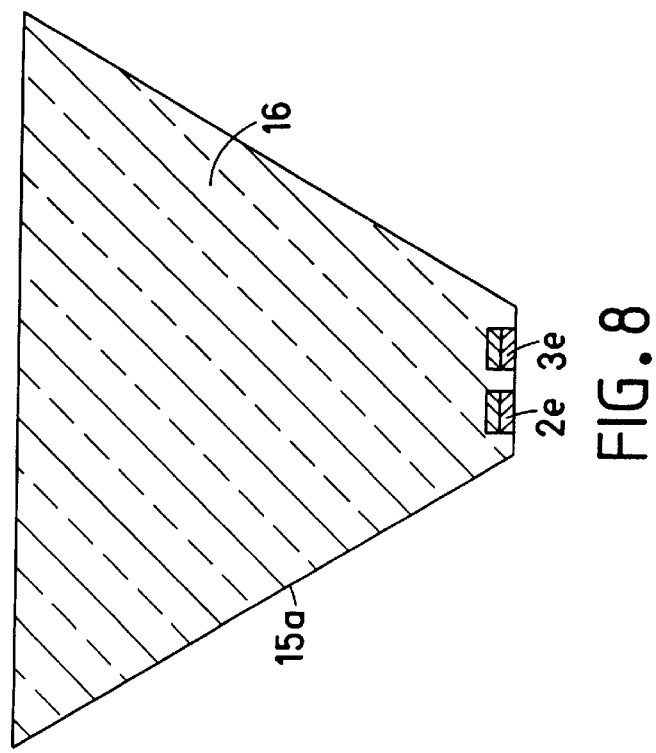
FIG. 7
FIG. 8

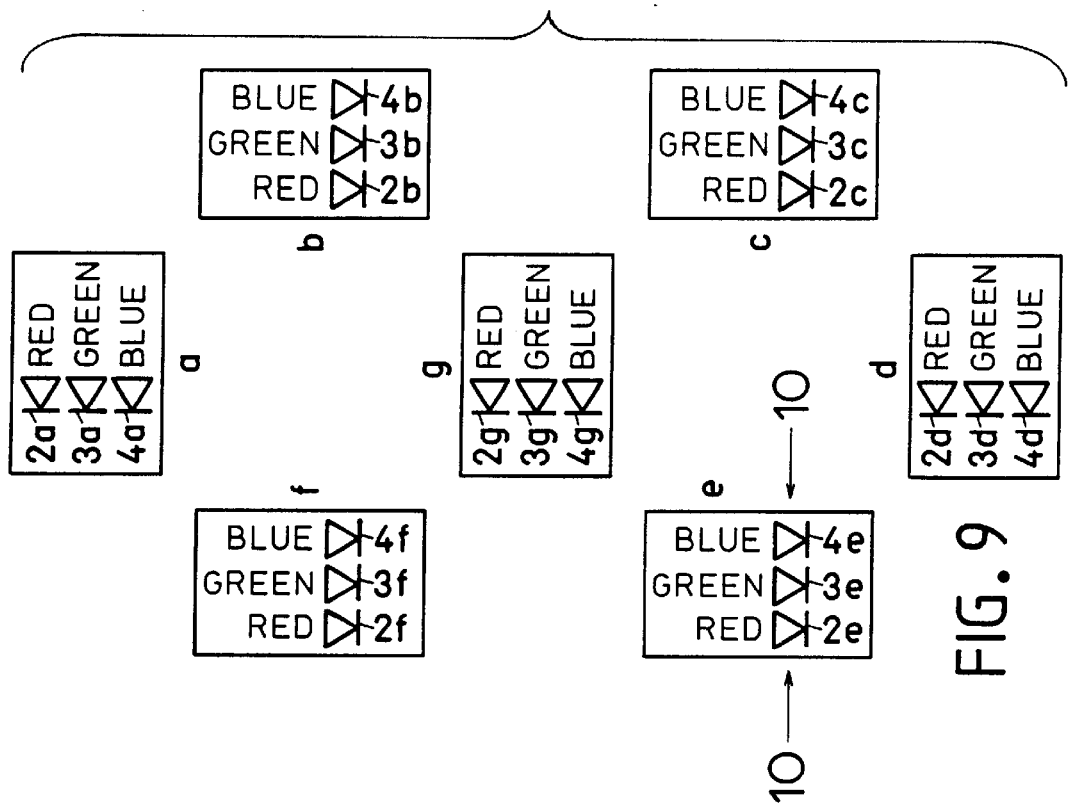
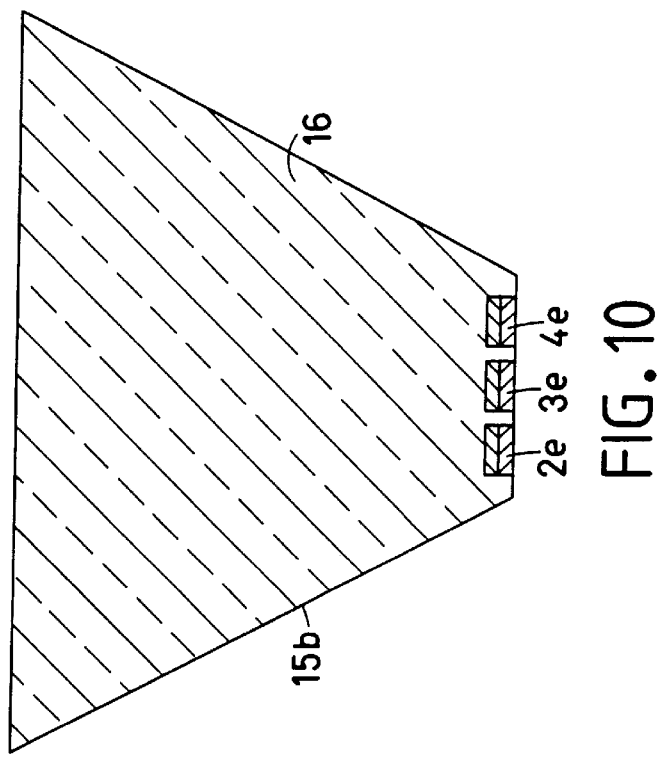

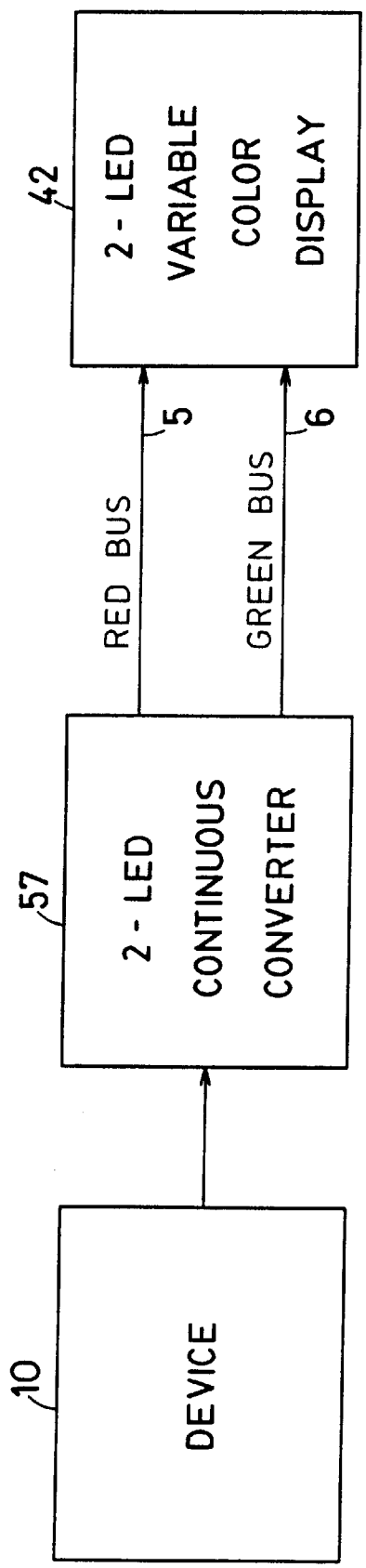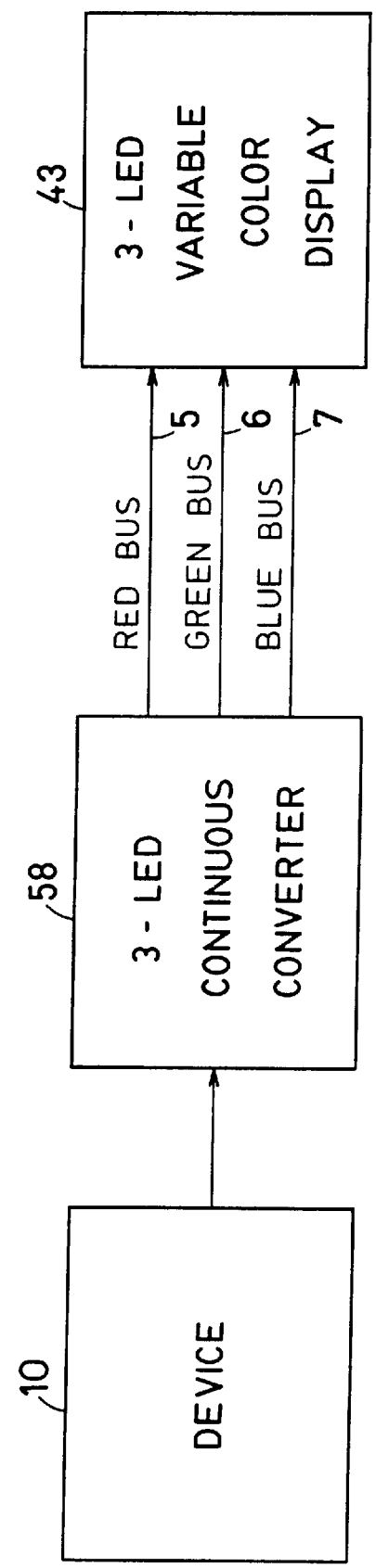

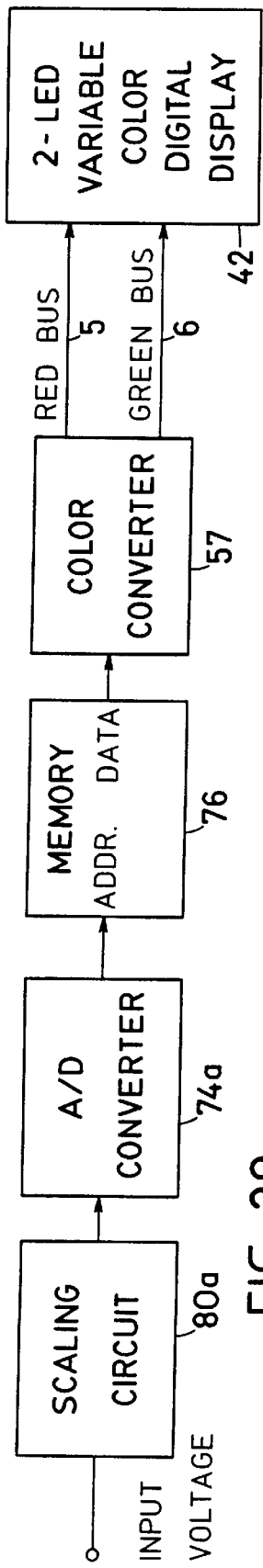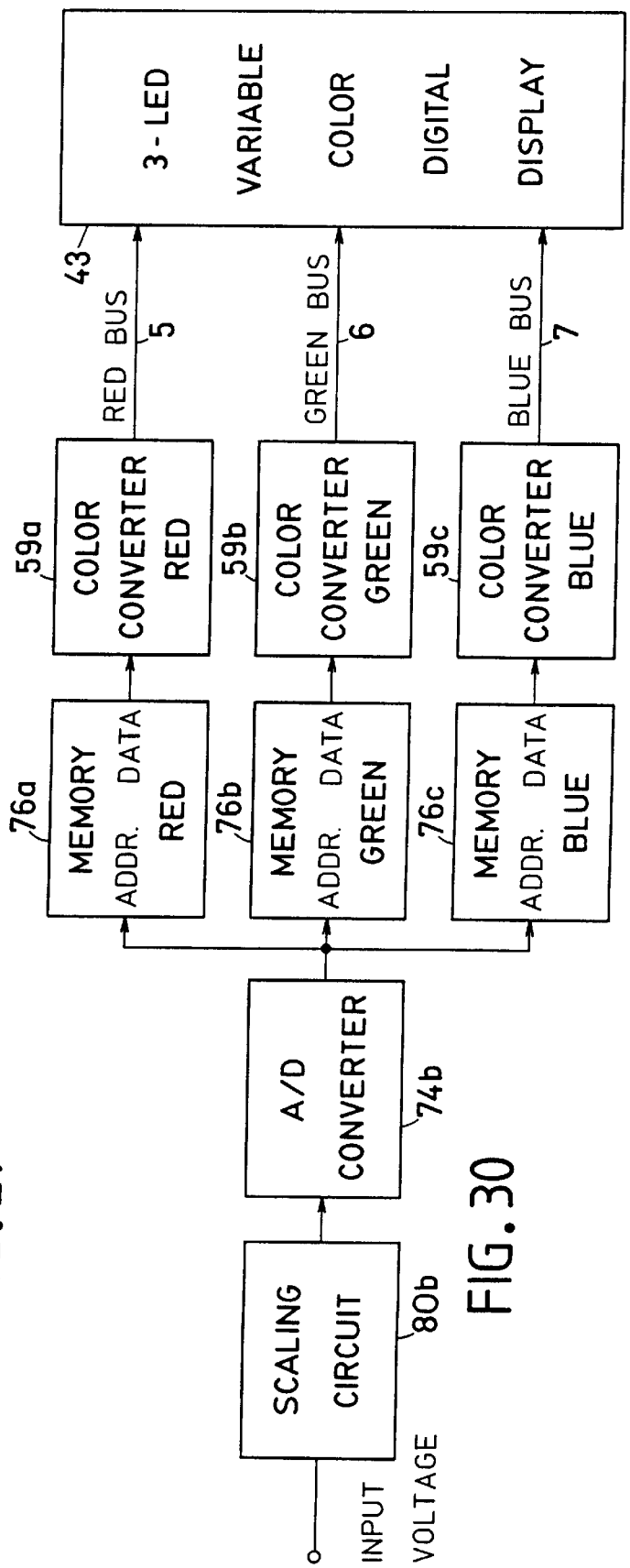
FIG. 29
FIG. 30

ICI CHROMATICITY DIAGRAM

RMS AND CREST FACTOR CHART

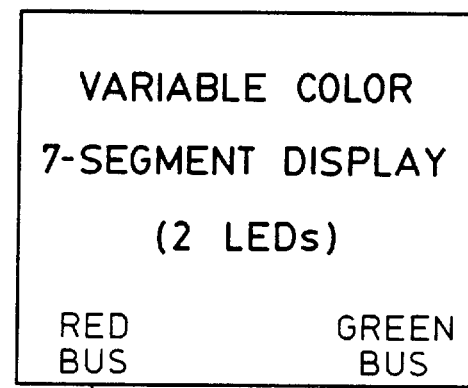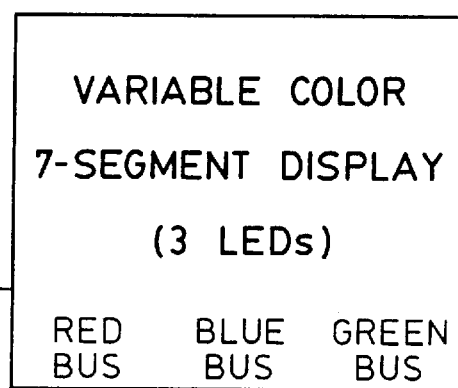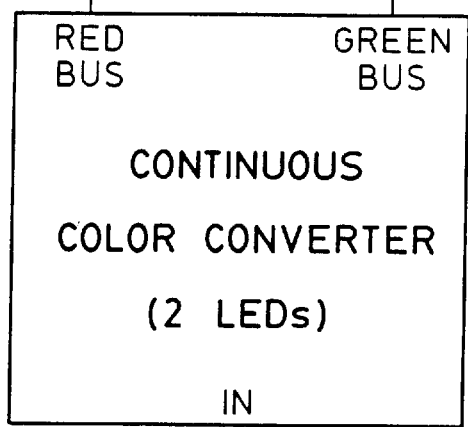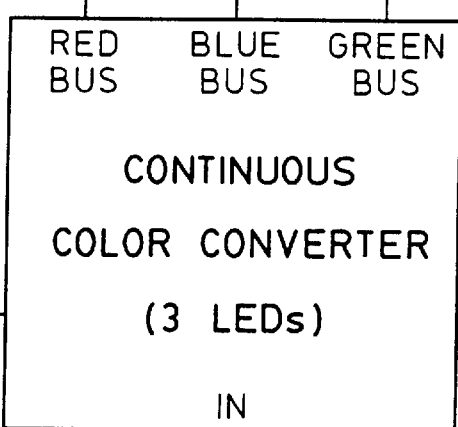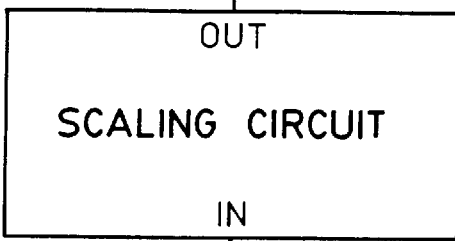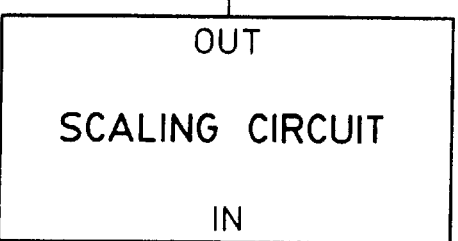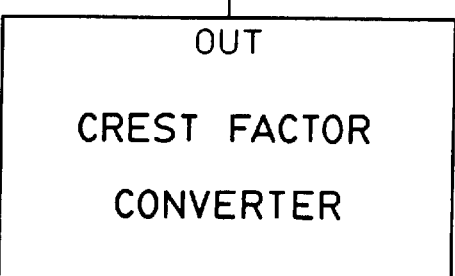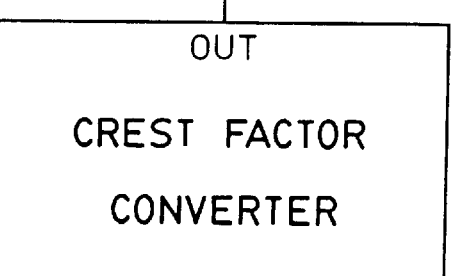
FIG. 84　　　　　　　　　FIG. 85 ured values in digital format and in a color unique to the
VARIABLE COLOR DISPLAY SYSTEM

CROSS-REFERENCE TO RELATED APPLICATIONS

This is a division of my application Ser. No. 08/571,246, filed on Dec. 12, 1995, entitled Variable Color Display System, now U.S. Pat. No. 5,656,935, which is a division of my application Ser. No. 08/187,350, filed on Jan. 27, 1994, entitled Variable Color Digital Multimeter, now U.S. Pat. No. 5,475,300 issued on Dec. 12, 1995, which is a division of my application Ser. No. 07/865,460, filed on Apr. 9, 1992, entitled Variable Color Digital Multimeter, now U.S. Pat. No. 5,283,517 issued on Feb. 1, 1994, which is a division of my application Ser. No. 07/628,328, filed on Dec. 14, 1990, entitled Variable Color Digital Multimeter, now U.S. Pat. No. 5,122,733 issued on Jun. 16, 1992, which is a division of my application Ser. No. 07/197,322, filed on May 23, 1988, entitled Variable Color Digital Multimeter, now abandoned, which is a division of my application Ser. No. 06/819,111, filed on Jan. 15, 1986, entitled Variable Color Digital Multimeter, now U.S. Pat. No. 4,794,383 issued on Dec. 27, 1988.

Reference is also made to my related applications Ser. No. 06/817,114, filed on Jan. 8, 1986, entitled Variable Color Digital Timepiece, now U.S. Pat. No. 4,647,217 issued on Mar. 3, 1987, Ser. No. 06/839,526, filed on Mar. 14, 1986, entitled Variable Color Display Telephone, now U.S. Pat. No. 4,726,059 issued on Feb. 16, 1988, and Ser. No. 06/940,100, filed on Dec. 10, 1986, entitled Digital Voltmeter with Variable Color Background, now U.S. Pat. No. 4,831,326 issued on May 16, 1989, which describe devices employing a variable color display.

BACKGROUND OF THE INVENTION

1. Field of the Invention

This invention relates to measuring devices utilizing a variable color digital display.

2. Description of the Prior Art

A display device that can change color and selectively display characters is described in my U.S. Pat. No. 4,086,514, issued on Apr. 25, 1978 and entitled Variable Color Display Device.

Multimeters with monochromatic digital display are well known and extensively used. Such multimeters, however, are capable of indicating value of only one measured quantity at a time. They are not capable of simultaneously indicating values of two different quantities, nor are they capable of indicating the relationship of instantly displayed measured value to values measured at other times, nor are they capable of indicating the relationship of the displayed measured value to measurement limits.

A hand held testing device for measuring different electrical quantities disclosed in U.S. Pat. No. 4,298,837, issued on Nov. 3, 1981 to Manfred Koslar, includes test prongs, function and range selectors, and display mounted within a handle such that they may be viewed together.

A digital ohmmeter with electrical continuity tester disclosed in U.S. Pat. No. 4,228,394, issued on Oct. 14, 1980 to John B. Crosby, includes a digital readout, for displaying the measured value of resistance, on which an Omega symbol may be energized to give a rapid indication of the continuity condition.

SUMMARY OF THE INVENTION

In a broad sense, it is the principal object of this invention to provide a measuring instrument with a variable color digital display.

The present invention provides a new dimension in the digital display art. Completely new, unexpected and heretofore impossible, features may be obtained when a well known monochromatic digital display is substituted with a variable color digital display. In the preferred embodiment, the invention was advantageously incorporated into a digital multimeter. However, the invention is not limited to measuring instruments and may be utilized in a wide variety of devices, without imposing any limitations.

It is another object of the invention to provide step variable 2-primary and 3-primary color control circuit which is capable of illuminating the display in a selected one of several possible colors.

It is further object of the invention to provide continuously variable 2-primary and 3-primary color converter for converting an input voltage to variable color which is capable of illuminating the display in any color of the spectrum, in accordance with the magnitude of the input voltage.

Among other objects of the invention are provision of a digital multimeter capable of selectively measuring values of several different measurement quantities and of indicating values of the selected quantity in digital format and in a color unique to the selected measured quantity; provision of a digital multimeter capable of measuring signals by several different measurement methods and of indicating measured values in digital format and in a color depending on the selected measurement method; provision of a digital multimeter capable of making measurements in several different measurement units and of indicating measured values in digital format and in a color depending on the selected measurement unit; provision of a digital multimeter capable of selectively measuring signal values from several different locations and of indicating measured values in digital format and in a color unique to the selected location; provision of a digital multimeter having several different measurement modes and capable of indicating measured values in digital format and in a color unique to the selected measurement mode; provision of a digital multimeter capable of performing several measurement functions and of indicating measured values in digital format and in a color unique to the selected measurement function; provision of a digital multimeter having selectable measurement ranges and capable of indicating measured values in digital format and in a color unique to the selected measurement range; provision of a digital multimeter having several measurement modifiers and capable of indicating measured values in digital format and in a color depending on the selected modifier; provision of a digital multimeter capable of selective measurement control and of indicating measured values in digital format and in a color depending on the selected control; provision of a digital multimeter capable of measuring time and of indicating measured values in digital format and in a color related to time; provision of a digital multimeter having a memory for storing reference values and a comparator for effecting a comparison between the reference values and measured values, and for accordingly causing measured values to be indicated in digital format and in a color depending on the results of the comparison; provision of a digital multimeter capable of performing repeated measurements and of comparing measured values with reference values and of counting the number of measurement errors, and for accordingly causing measured values to be indicated in digital format and in a color having relation to the number of previous measurement errors; provision of a digital multimeter capable of indicating measured values in digital format and in a color different for positive and negative results; provision of a variable color digital display system for emphasizing decimal point in displayed decimal numbers; provision of a variable color digital display system capable of displaying decimal numbers and integers in different colors; provision of a variable color digital barometer with memory, capable of indicating instant atmospheric pressure in digital format and in a color depending on previous measurements; and provision of a dual variable color digital voltmeter capable of simultaneously indicating two different measured values on a single display in different colors.

BRIEF DESCRIPTION OF THE DRAWINGS

In the drawings in which are shown several possible embodiments of the invention.

FIG. 5 is a block diagram of 2-primary color digital display.

FIG. 6 is a block diagram of 3-primary color digital display.

FIG. 7 is an enlarged detail of one digit of 2-primary color digital display.

FIG. 8 is an enlarged cross-sectional view of one display segment in FIG. 7, taken along the line 8—8.

FIG. 9 is an enlarged detail of one digit of 3-primary color digital display.

FIG. 10 is an enlarged cross-sectional view of one display segment in FIG. 9, taken along the line 10—10.

FIG. 27 is a block diagram of a continuously variable color display system utilizing two primary colors.

FIG. 28 is a block diagram of a continuously variable color display system utilizing three primary colors.

FIG. 29 is an expanded block diagram of FIG. 27.

FIG. 30 is an expanded block diagram of FIG. 28.

FIG. 84 is an expanded block diagram of 2-primary color converter for the crest factor converter.

FIG. 85 is an expanded block diagram of 3-primary color converter for the crest factor converter.

Throughout the drawings, like characters indicate like parts.

Brief Description of the Tables

In the tables which show examples of the relationship between an input voltage, memory contents, and resulting color in the color converter of the present invention, TABLE 1 shows the characteristic of a step variable 2-primary color converter.

TABLE 2 shows a rainbow-like characteristic of a continuously variable 3-primary color converter.

Throughout the tables, memory addresses and data are expressed in a well known hexadecimal notation.

Description of the Preferred Embodiments

Figure 1:
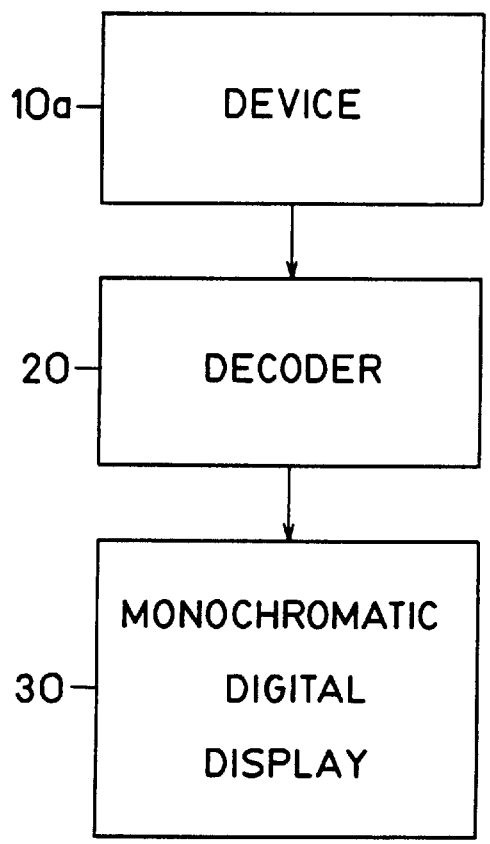
FIG. 1 is a block diagram of a typical prior art monochromatic digital display system.

Referring now, more particularly, to the drawings, in FIG. 1 is shown a block diagram of a typical prior art digital display system which usually includes a device 10a for developing digital data, a suitable decoder 20 for converting the digital data into a displayable code, and a monochromatic digital display 30 for indicating the digital data visually.

Figure 2:
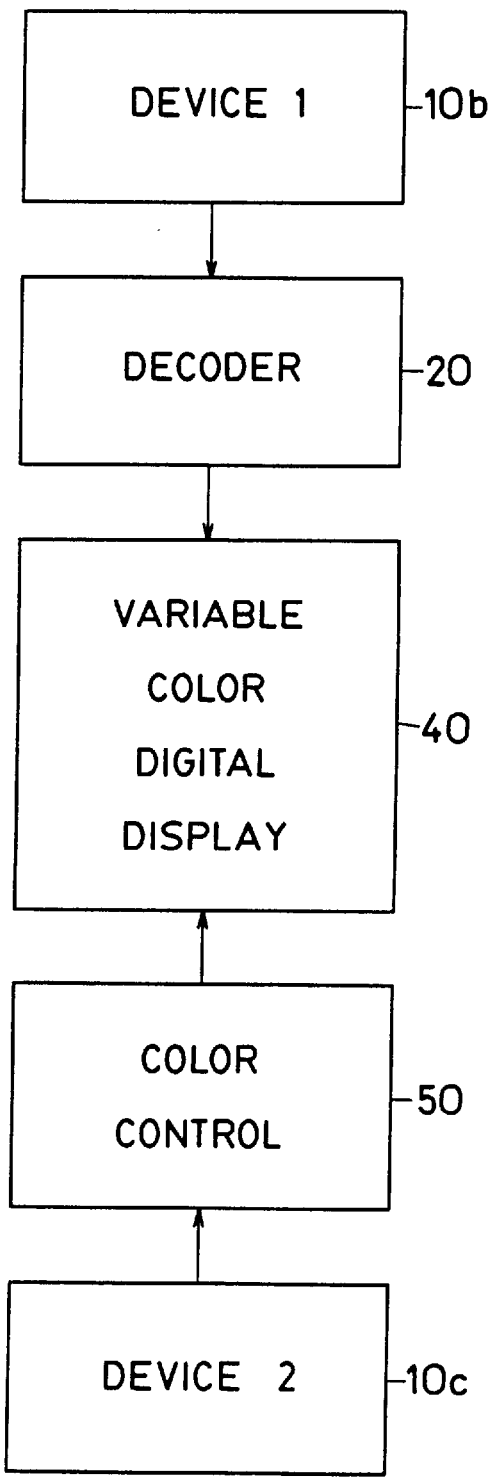
FIG. 2 is a generalized block diagram of a variable color digital display system for the practice of the present invention.

As shown in FIG. 2, the present invention resides in the substitution of a commercially well known monochromatic digital display with a variable color digital display 40, and in the addition of a color control 50 for controlling the color of display 40. The variable color digital display system of this invention can simultaneously indicate the values of two different quantities, from the outputs of respective devices 10b, 10c, by causing the value of the first quantity to be indicated on display 40 in digital format, and by controlling the color of display 40 in accordance with the value of the second quantity.

Figure 3:
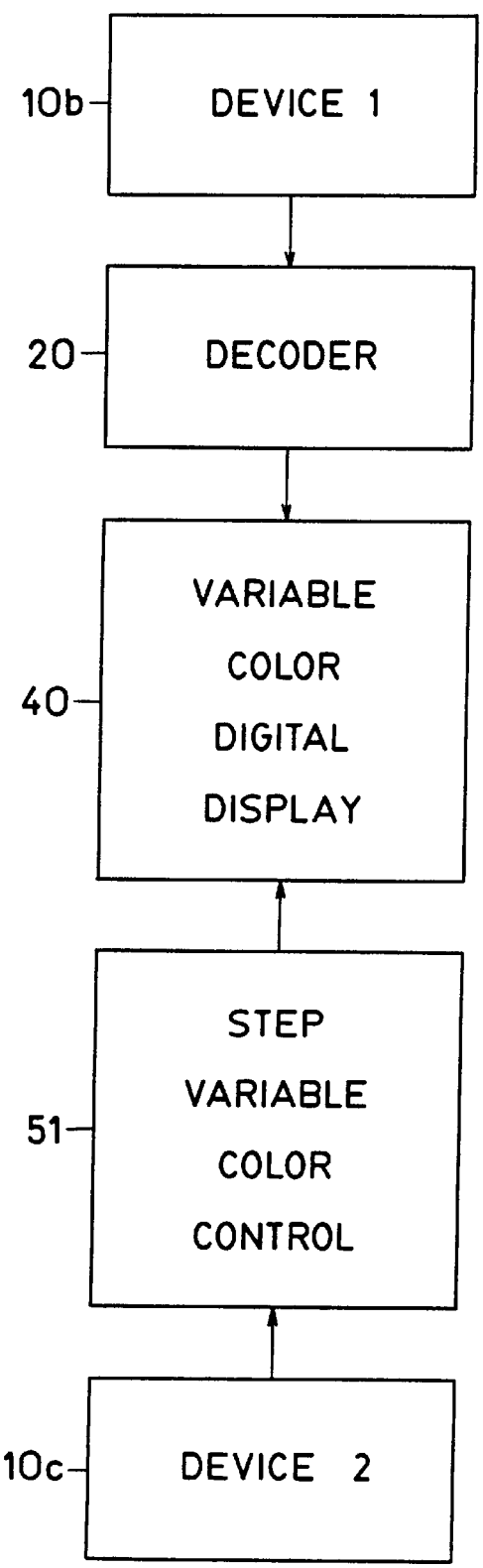
FIG. 3 is a block diagram of a step variable color display system.

In FIG. 3 is shown a block diagram of another embodiment of a variable color digital display system of the present invention, characterized by a step variable color control 51.

Figure 4:
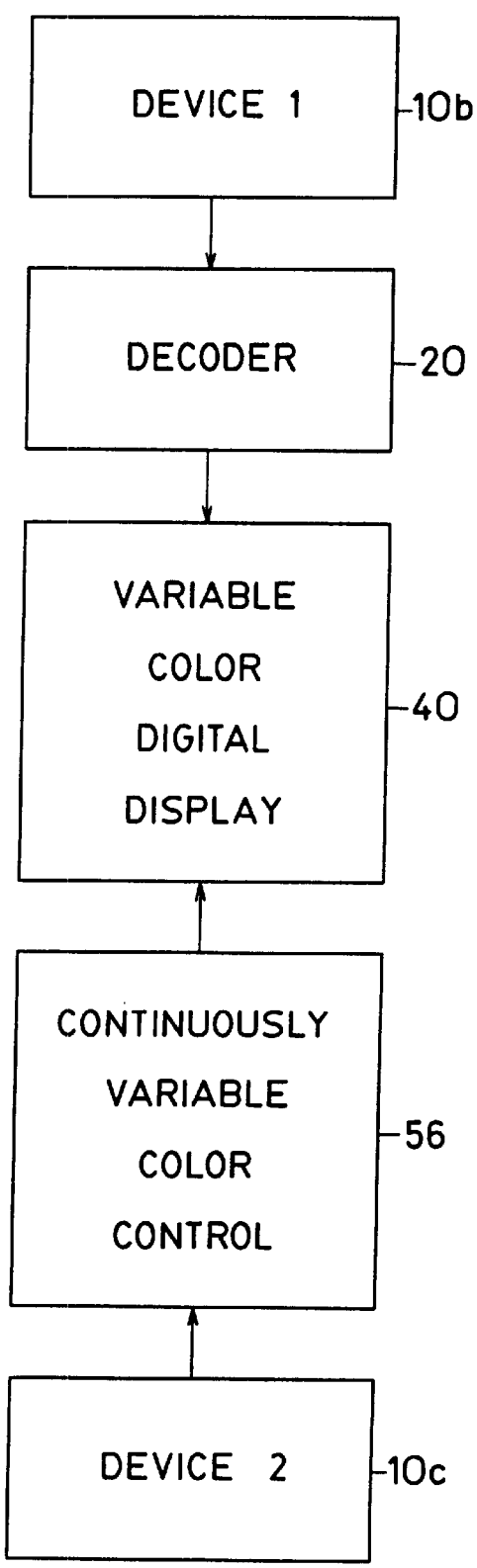
FIG. 4 is a block diagram of a continuously variable color display system.

In FIG. 4 is shown a block diagram of still another embodiment of a variable color digital display system, characterized by a continuously variable color control 56.

In FIG. 5 is shown a block diagram of a 2-primary color display system including a commercially well known 7-segment display decoder driver 22, a variable color 7-segment display element 42, and a 2-primary color control logic circuit 52. The decoder driver 22 accepts a 4-bit BCD (binary coded decimal) code at its inputs A0, A1, A2, A3 and develops output drive signals at its outputs a, b, c, d, e, f, g, and DP (decimal point) to drive respective segments of 7-segment display element 42. The color control logic circuit 52 accepts color control logic signals at its inputs R (red), Y (yellow), and G (green) and develops at its outputs drive signals for red bus 5 and green bus 6, respectively, to illuminate display element 42 in a selected color.

In FIG. 6 is shown a block diagram of a 3-primary color display system including a 7-segment display decoder driver 22, variable color 7-segment display element 43, and a 3-primary color control logic circuit 53. The color control logic circuit 53 accepts color control logic signals at its inputs R (red), Y (yellow), G (green), BG (blue-green), B (blue), P (purple), and W (white) and develops at its outputs drive signals for red bus 5, green bus 6, and blue bus 7, respectively, to illuminate display element 43 in a selected color.

In FIG. 7, the 2-primary color display element includes seven elongated display segments a, b, c, d, e, f, and g, arranged in a conventional pattern, which may be selectively energized in different combinations to display the desired digits. Each display segment includes a pair of LEDs (light emitting diodes): red LED 2 and green LED 3, which are closely adjacent such that the light signals emitted therefrom are substantially superimposed upon each other to mix the colors. To facilitate the illustration, the LEDs are designated by segment symbols, e.g., the red LED in the segment a is designated as 2a, etc.

In FIG. 8, red LED 2e and green LED 3e are placed on the base of a segment body 15a which is filled with a transparent light scattering material 16. When forwardly biased, LEDs 2e and 3e emit light signals of red and green colors, respectively, which are scattered within transparent material 16, thereby blending the red and green light signals into a composite light signal that emerges at the upper surface of segment body 15a. The color of the composite light signal may be controlled by varying the portions of the red and green light signals.

In FIG. 9, each display segment of the 3-primary color display element includes a triad of LEDs: red LED 2, green LED 3, and blue LED 4, which are closely adjacent such that the light signals emitted therefrom are substantially superimposed upon one another to mix the colors.

In FIG. 10, red LED 2e, green LED 3e, and blue LED 4e are placed on the base of a segment body 15b which is filled with a transparent light scattering material 16. Red LEDs are typically manufactured-by diffusing a p-n junction into a GaAsP epitaxial layer on a GaAs substrate; green LEDs typically use a GaP epitaxial layer on a GaP substrate; blue LEDs are typically made from SiC material.

When forwardly biased, LEDs 2e, 3e, and 4e emit light signals of red, green, and blue colors, respectively, which are scattered within transparent material 16, thereby blending the red, green, and blue light signals into a composite light signal that emerges at the upper surface of segment body 15b. The color of the composite light signal may be controlled by varying the portions of the red, green, and blue light signals.

Figure 11:
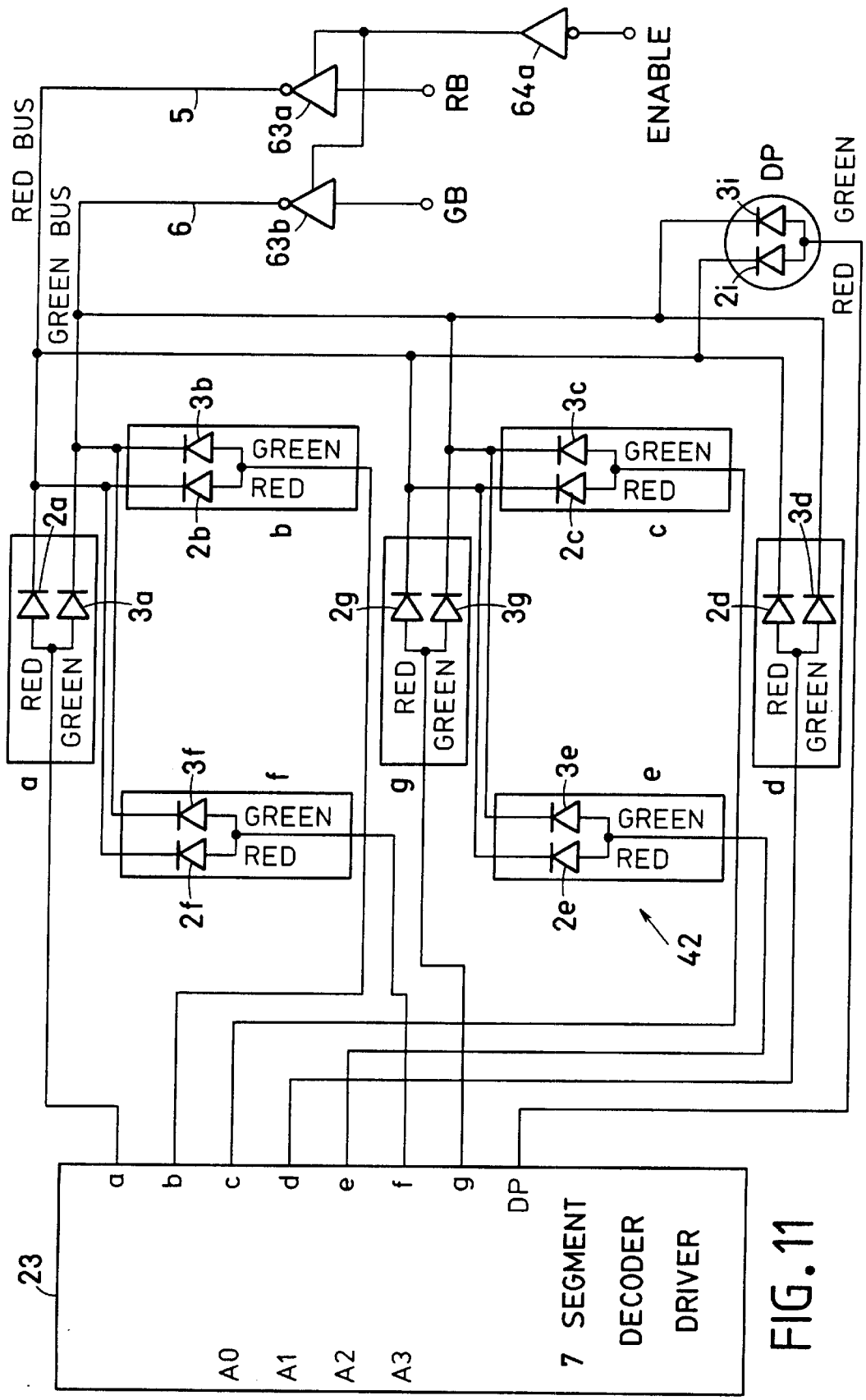
FIG. 11 is a schematic diagram of one digit of 2-primary color control circuit of this invention.

In FIG. 11 is shown a schematic diagram of a 2-primary color common cathodes 7-segment display element 42 which can selectively display various digital fonts in different colors on display segments a, b, c, d, e, f, g, and DP (Decimal Point). The anodes of all red and green LED pairs are interconnected in each display segment and are electrically connected to respective outputs of a commercially well known common-cathode 7-segment decoder driver 23. The cathodes of all red LEDs 2a, 2b, 2c, 2d, 2e, 2f, 2g, and 2i are interconnected to a common electric path referred to as a red bus 5. The cathodes of all green LEDs 3a, 3b, 3c, 3d, 3e, 3f, 3g, and 3i are interconnected to a like common electric path referred to as a green bus 6.

The red bus 5 is connected to the output of a tri-state inverting buffer 63a, capable of sinking sufficient current to forwardly bias all red LEDs 2a to 2i in display element 42. The green bus 6 is connected to the output of a like buffer 63b. The two buffers 63a and 63b can be simultaneously enabled by applying a low logic level signal to the input of inverter 64a, and disabled by applying a high logic level signal thereto. When buffers 63a and 63b are enabled, the conditions of red bus 5 and green bus 6 can be selectively controlled by applying suitable logic control signals to the bus control inputs RB (red bus) and GB (green bus), to illuminate display element 42 in a selected color. When buffers 63a and 63b are disabled, both red bus 5 and green bus 6 are effectively disconnected to cause display element 42 to be completely extinguished.

Figure 12:
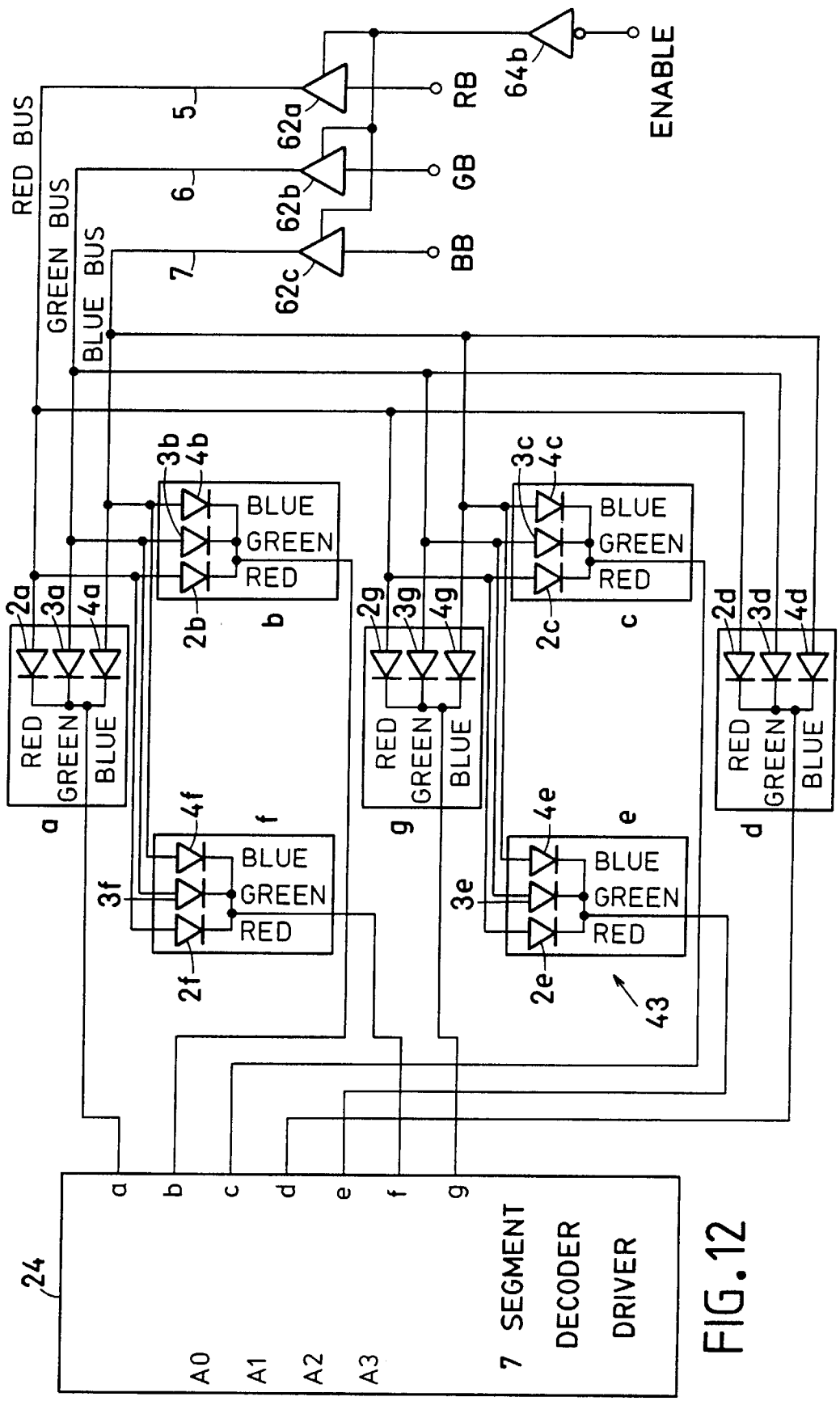
FIG. 12 is a schematic diagram of one digit of 3-primary color control circuit of this invention.

In FIG. 12 is shown a schematic diagram of a 3-primary color common anodes 7-segment display element 43 which can selectively display digital fonts in different colors. The cathodes of all red, green, and blue LED triads in each display segment are interconnected and electrically connected to respective outputs of a commercially well known common anode 7-segment decoder driver 24. The anodes of all red LEDs 2a, 2b, 2c, 2d, 2e, 2f, and 2g are interconnected to form a common electric path referred to as a red bus 5. The anodes of all green LEDs 3a, 3b, 3c, 3d, 3e, 3f, and 3g are interconnected to form a like common electric path referred to as a green bus 6. The anodes of all blue LEDs 4a, 4b, 4c, 4d, 4e, 4f, and 4g are interconnected to form a like common electric path referred to as a blue bus 7.

The red bus 5 is connected to the output of a non-inverting tri-state buffer 62a, capable of sourcing sufficient current to illuminate all red LEDs 2a to 2g in display element 43. The green bus 6 is connected to the output of a like buffer 62b. The blue bus 7 is connected to the output of a like buffer 62c. The three buffers 62a, 62b, and 62c can be simultaneously enabled, by applying a low logic level signal to the input of inverter 64b, and disabled by applying a high logic level signal thereto. When buffers 62a, 62b, and 62c are enabled, the conditions of red bus 5, green bus 6, and blue bus 7 can be selectively controlled by applying valid combinations of logic level signals to the bus control inputs RB (red bus), GB (green bus), and BB (blue bus), to illuminate display element 43 in a selected color. When buffers 62a, 62b, and 62c are disabled, red bus 5, green bus 6, and blue bus 7 are effectively disconnected to cause display element 43 to be completely extinguished.

Step Variable Color Control

Figure 13:
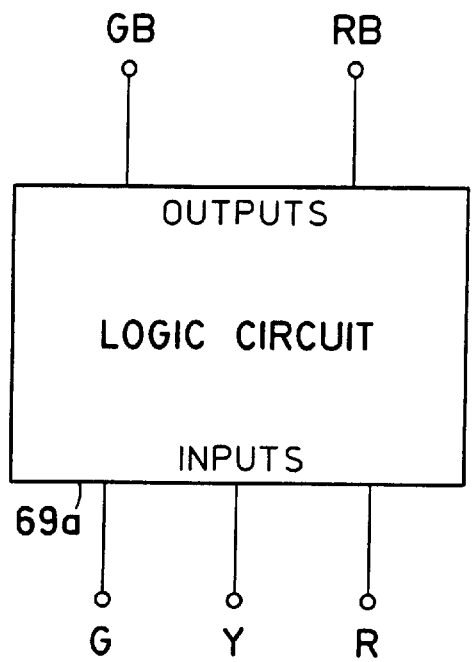
FIG. 13 is a block diagram of a color control logic circuit for controlling 2-primary color display.

In FIG. 13 is shown a logic circuit 69a for developing drive signals for red bus 5 and green bus 6, to control the color of display element 42 shown in FIG. 11. Two voltage levels, referred to as logic high and low, are used throughout the description of the digital circuits. The color of display element 42 may be controlled by applying valid combinations of logic level signals to its color control inputs R (red), Y (yellow), and G (green). The logic circuit 69a combines the input signals in a logic fashion and develops output drive signals RB (red bus) and GB (green bus), for activating red bus 5 and green bus 6, respectively, of display element 42.

Figure 14:
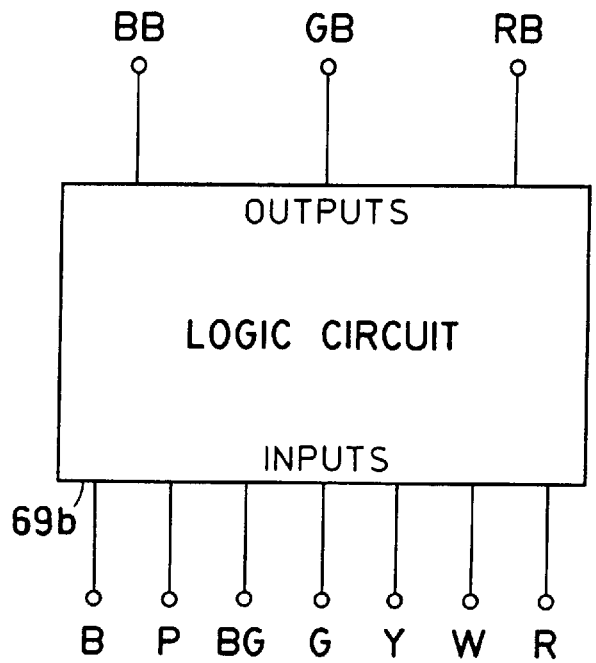
FIG. 14 is a block diagram of a color control logic circuit for controlling 3-primary color display.

In FIG. 14 is shown a like logic circuit 69b for developing drive signals for red bus 5, green bus 6, and blue bus 7, to control the color of display element 43 shown in FIG. 12. The color of display element 43 may be controlled by applying valid combinations of logic level signals to its color control inputs B (blue), P (purple), BG (blue-green), G (green), Y (yellow), W (white), and R (red). The logic circuit 69b combines the input signals in a logic fashion and develops output drive signals RB (red bus), GB (green bus), and BB (blue bus), for activating red bus 5, green bus 6, and blue bus 7, respectively, of display element 43.

Figure 15:
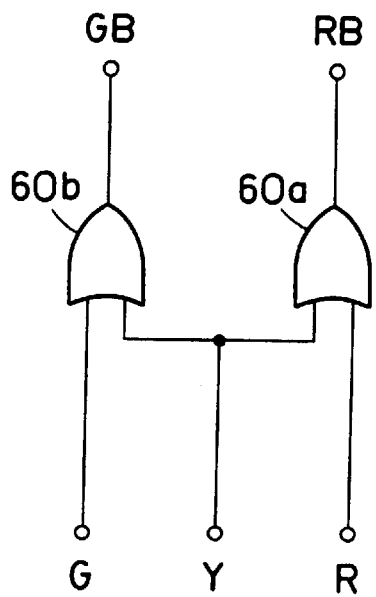
FIG. 15 is a schematic diagram of a color control logic circuit for controlling 2-primary color display.
Figure 16:
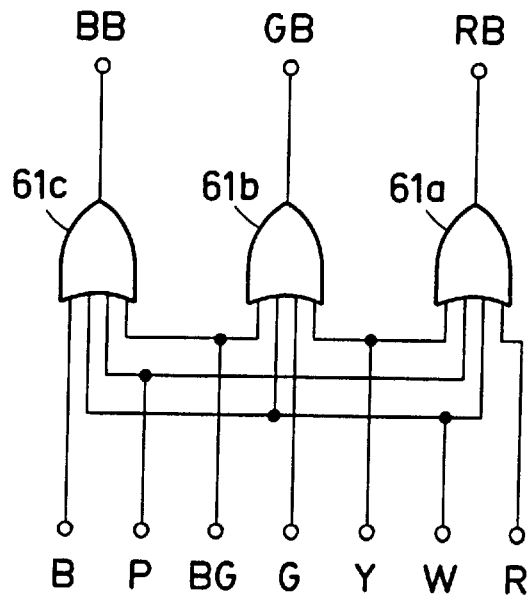
FIG. 16 is a schematic diagram of a color control logic circuit for controlling 3-primary color display.

Exemplary schematic diagrams of the color control logic circuits shown in FIGS. 15 and 16 consider active high logic levels, which means that only the selected color control input is maintained at a high logic level, while all remaining color control inputs are maintained at a low logic level. The circuit in FIG. 15 is a detail of the color control logic circuit 69a employing 2-input logic OR gates 60a and 60b, interposed between the color control inputs R, Y, G and bus control outputs RB, GB, in a manner which will become more apparent from the description below. A like circuit in FIG. 16 is a detail of the color control logic circuit 69b employing 4-input logic OR gates 61a, 61b, and 61c similarly interposed between the color control inputs B, P, BG, G, Y, W, R and bus control outputs RB, GB, BB. It will be obvious to those skilled in the art that other types of logic devices may be effectively used.

Figure 17:
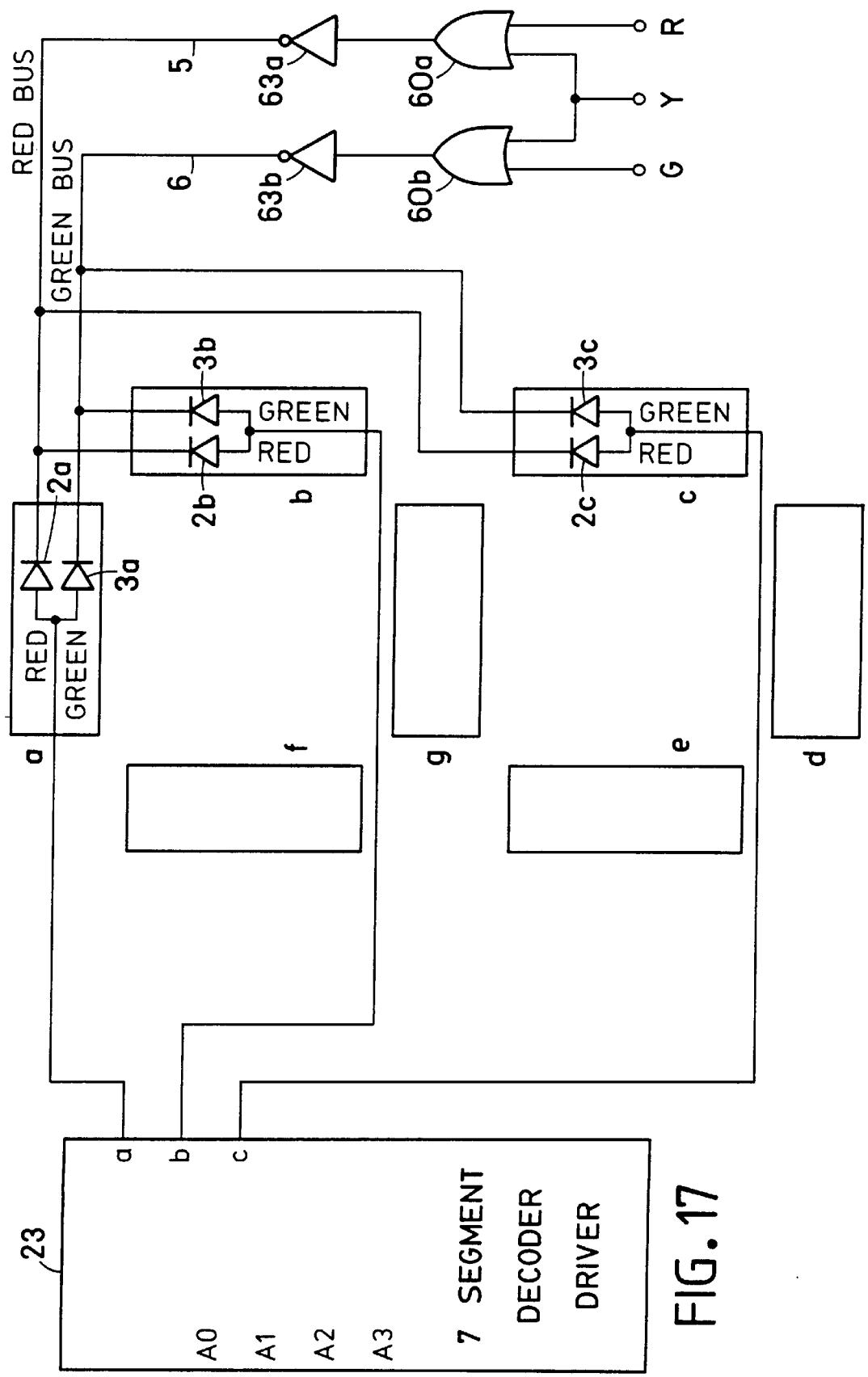
FIG. 17 is a simplified schematic diagram, similar to FIG. 11, showing how number '7' can be displayed in three different colors.

The operation of display element 42 shown in FIG. 11 will be now explained by the example of illuminating a digit '7' in three different colors. A simplified schematic diagram to facilitate the explanation is shown in FIG. 17. Any digit between 0 and 9 can be selectively displayed by applying the appropriate BCD code to the inputs A0, A1, A2, and A3 of common-cathode 7-segment decoder driver 23. The decoder driver 23 develops at its outputs a, b, c, d, e, f, g, and DP drive signals for energizing selected groups of the segments to thereby visually display the selected number, in a manner well known to those having ordinary skill in the art. To display decimal number '7', a BCD code 0111 is applied to the inputs A0, A1, A2, and A3. The decoder driver 23 develops high voltage levels at its outputs a, b, and c, to illuminate equally designated segments a, b, and c, and low voltage levels at all remaining outputs (not shown), to extinguish all remaining segments d, e, f, and g.

To illuminate display element 42 in red color, the color control input R is raised to a high logic level, and the color control inputs Y and G are maintained at a low logic level. As a result, the output of OR gate 60a rises to a high logic level, thereby causing the output of buffer 63a to drop to a low logic level. The current flows from the output a of decoder driver 23, via red LED 2a and red bus 5, to current sinking output of buffer 63a. Similarly, the current flows from the output b of decoder driver 23, via red LED 2b and red bus 5, to the output of buffer 63a. The current flows from the output c of decoder driver 23, via red LED 2c and red bus 5, to the output of buffer 63a. As a result, segments a, b, and c illuminate in red color, thereby causing a visual impression of a character '7'. The green LEDs 3a, 3b, and 3c remain extinguished because the output of buffer 63b is at a high logic level, thereby disabling green bus 6.

To illuminate display element 42 in green color, the color control input G is raised to a high logic level, while the color control inputs R and Y are maintained at a low logic level. As a result, the output of OR gate 60b rises to a high logic level, thereby causing the output of buffer 63b to drop to a low logic level. The current flows from the output a of decoder driver 23, via green LED 3a and green bus 6, to current sinking output of buffer 63b. Similarly, the current flows from the output b of decoder driver 23, via green LED 3b and green bus 6, to the output of buffer 63b. The current flows from the output c of decoder driver 23, via green LED 3c and green bus 6, to the output of buffer 63b. As a result, segments a, b, and c illuminate in green color. The red LEDs 2a, 2b, and 2c remain extinguished because the output of buffer 63a is at a high logic level, thereby disabling red bus 5.

To illuminate display element 42 in yellow color, the color control input Y is raised to a high logic level, while the color inputs R and G are maintained at a low logic level. As a result, the outputs of both OR gates 60a and 60b rise to a high logic level, thereby causing the outputs of both buffers 63a and 63b to drop to a low logic level. The current flows from the output a of decoder driver 23, via red LED 2a and red bus 5, to current sinking output of buffer 63a, and, via green LED 3a and green bus 6, to current sinking output of buffer 63b. Similarly, the current flows from the output b of decoder driver 23, via red LED 2b and red bus 5, to the output of buffer 63a, and, via green LED 3b and green bus 6, to the output of buffer 63b. The current flows from the output c of decoder driver 23, via red LED 2c and red bus 5, to the output of buffer 63a, and, via green LED 3c and green bus 6, to the output of buffer 63b. As a result of blending light of red and green colors in each segment, segments a, b, and c illuminate in substantially yellow color.

Figure 18:
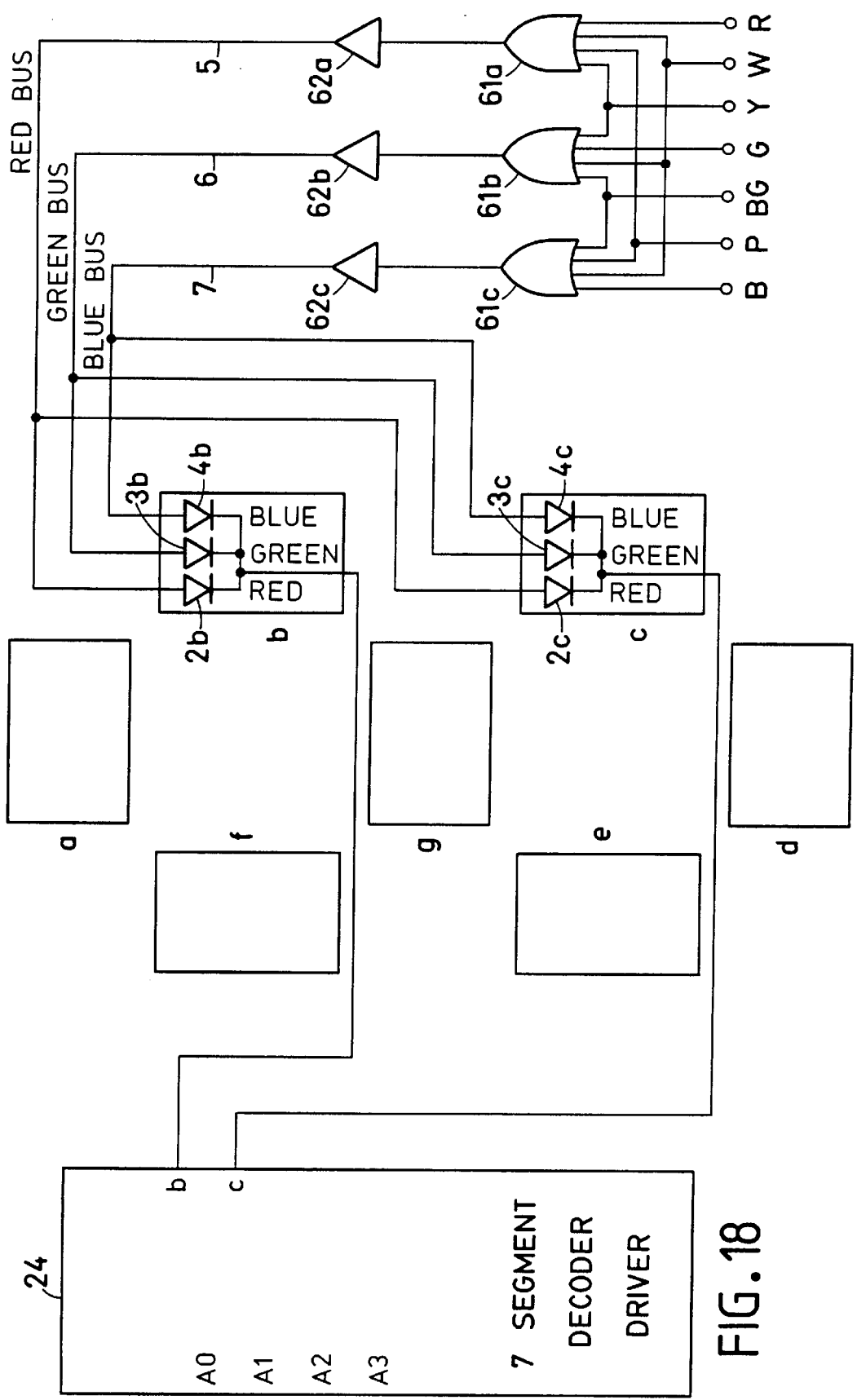
FIG. 18 is a simplified schematic diagram, similar to FIG. 12, showing how number '1' can be displayed in seven different colors.

The operation of display element 43 shown in FIG. 12 will be now explained by the example of illuminating a digit '1' in seven different colors. A simplified schematic diagram to facilitate the explanation is shown in FIG. 18. To display decimal number '1', a BCD code 0001 is applied to the inputs A0, A1, A2, and A3 of common anode 7-segment decoder driver 24. The decoder driver 24 develops low voltage levels at its outputs b and c, to illuminate equally designated segments b and c, and high voltage levels at all remaining outputs (not shown), to extinguish all remaining segments a, d, e, f, and g.

To illuminate display element 43 in red color, the color control input R is raised to a high logic level, while all remaining color control inputs are maintained at a low logic level. As a result, the output of OR gate 61a rises to a high logic level, thereby causing the output of buffer 62a to rise to a high logic level. The current flows from the output of buffer 62a, via red bus 5 and red LED 2b, to the output b of decoder driver 24, and, via red LED 2c, to the output c of decoder driver 24. As a result, segments b and c illuminate in red color, thereby causing a visual impression of a character '1'. The green LEDs 3b, 3c and blue LEDs 4b, 4c remain extinguished because green bus 6 and blue bus 7 are disabled.

To illuminate display element 43 in green color, the color control input G is raised to a high logic level, while all remaining color control inputs are maintained at a low logic level. As a result, the output of OR gate 61b rises to a high logic level, thereby causing the output of buffer 62b to rise to a high logic level. The current flows from the output of buffer 62b, via green bus 6 and green LED 3b, to the output b of decoder driver 24, and, via green LED 3c, to the output c of decoder driver 24. As a result, segments b and c illuminate in green color.

To illuminate display element 43 in blue color, the color control input B is raised to a high logic level, while all remaining color control inputs are maintained at a low logic level. As a result, the output of OR gate 61c rises to a high logic level, thereby causing the output of buffer 62c to rise to a high logic level. The current flows from the output of buffer 62c, via blue bus 7 and blue LED 4b, to the output b of decoder driver 24, and, via blue LED 4c, to the output c of decoder driver 24. As a result, segments b and c illuminate in blue color.

To illuminate display element 43 in yellow color, the color control input Y is raised to a high logic level, while all remaining color control inputs are maintained at a low logic level. As a result, the outputs of OR gates 61a and 61b rise to a high logic level, thereby causing the outputs of buffers 62a and 62b to rise to a high logic level. The current flows from the output of buffer 62a, via red bus 5 and red LED 2b, to the output b of decoder driver 24, and, via red LED 2c, to the output c of decoder driver 24. The current also flows from the output of buffer 62b, via green bus 6 and green LED 3b, to the output b of decoder driver 24, and, via green LED 3c, to the output c of decoder driver 24. As a result of blending light of red and green colors in each segment, the segments b and c illuminate in substantially yellow color.

To illuminate display element 43 in purple color, the color control input P is raised to a high logic level, while all remaining color control inputs are maintained at a low logic level. As a result, the outputs of OR gates 61a and 61c rise to a high logic level, thereby causing the outputs of buffers 62a and 62c to rise to a high logic level. The current flows from the output of buffer 62a, via red bus 5 and red LED 2b, to the output b of decoder driver 24, and, via red LED 2c, to the output c of decoder driver 24. The current also flows from the output of buffer 62c, via blue bus 7 and blue LED 4b, to the output b of decoder driver 24, and, via blue LED 4c, to the output c of decoder driver 24. As a result of blending light of red and blue colors in each segment, segments b and c illuminate in substantially purple color.

To illuminate display element 43 in blue-green color, the color control input BG is raised to a high logic level, while all remaining color control inputs are maintained at a low logic level. As a result, the outputs of OR gates 61b and 61c rise to a high logic level, thereby causing the outputs of buffers 62b and 62c to rise to a high logic level. The current flows from the output of buffer 62b, via green bus 6 and green LED 3b, to the output b of decoder driver 24, and, via green LED 3c, to the output c of decoder driver 24. The current also flows from the output of buffer 62c, via blue bus 7 and blue LED 4b, to the output b of decoder driver 24, and, via blue LED 4c, to the output c of decoder driver 24. As a result of blending light of green and blue colors in each segment, segments b and c illuminate in substantially blue-green color.

To illuminate display element 43 in white color, the color control input W is raised to a high logic level, while all remaining color control inputs are maintained at a low logic level. As a result, the outputs of OR gates 61a, 61b, and 61c rise to a high logic level, thereby causing the outputs of buffers 62a, 62b, and 62c to rise to a high logic level. The current flows from the output of buffer 62a, via red bus 5 and red LED 2b, to the output b of decoder driver 24, and, via red LED 2c, to the output c of decoder driver 24. The current also flows from the output of buffer 62b, via green bus 6 and green LED 3b, to the output b of decoder driver 24, and, via green LED 3c, to the output c of decoder driver 24. The current also flows from the output of buffer 62c, via blue bus 7 and blue LED 4b, to the output b of decoder driver 24, and, via blue LED 4c, to the output c of decoder driver 24. As a result of blending light of red, green, and blue colors in each segment, segments b and c illuminate in substantially white color.

Since the outputs of decoder driver 24 may be overloaded by driving a triad of LEDs in parallel in display element 43, rather than a single LED in a monochromatic display, it would be obvious to employ suitable buffers to drive respective color display segments (not shown).

Figure 19:
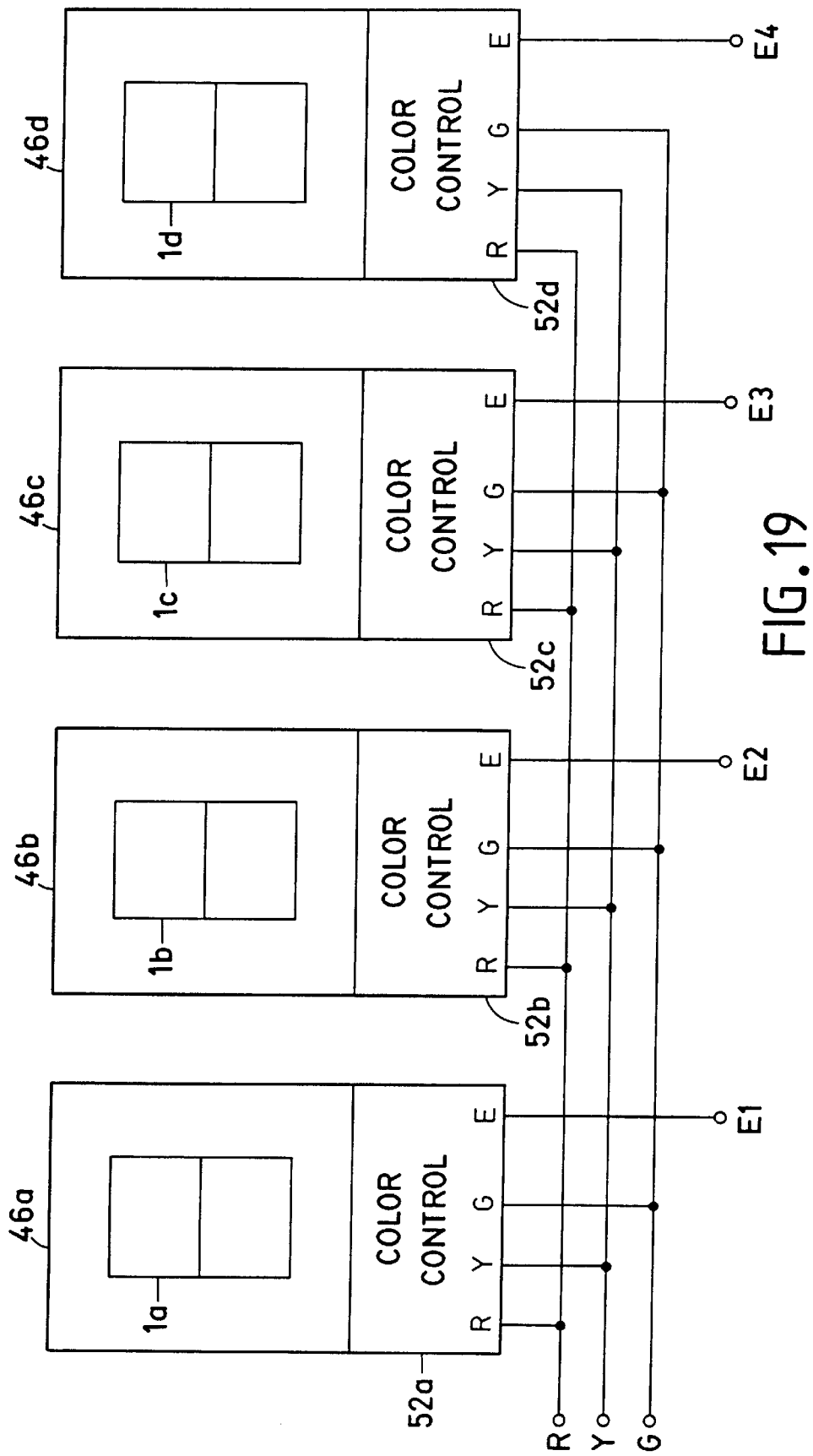
FIG. 19 is a block diagram of 2-primary color 4-digit display.

To illustrate how the present invention can be utilized in a multi-element variable color display configuration, in FIG. 19 is shown a detail of the interconnection in a 2-primary color 4-digit display having display segments 1a, 1b, 1c, and id arranged in a 7-segment font. The color control inputs R, Y, and G of color controls 52a, 52b, 52c, and 52d of all display elements 46a, 46b, 46c, and 46d are respectively interconnected, and enable inputs E1, E2, E3, and E4 are used to control the conditions of respective display elements 46a, 46b, 46c, and 46d. A high logic level at the enable input E extinguishes the particular display element 46a, 46b, 46c, or 46d; a low logic level therein illuminates display element 46a, 46b, 46c, or 46d in a color determined by the instant conditions of the color control inputs R, Y, and G.

Figure 20:
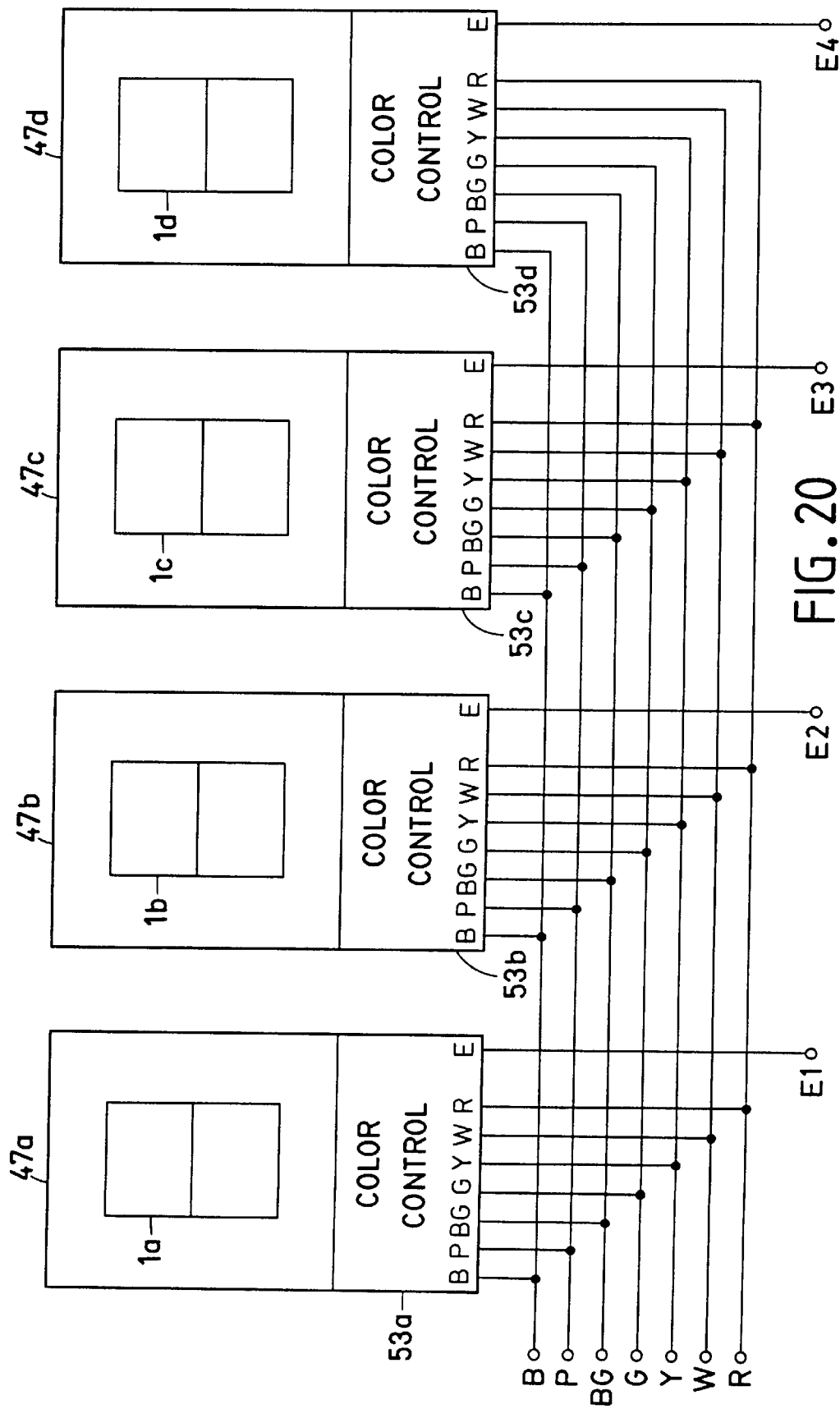
FIG. 20 is a block diagram of 3-primary color 4-digit display.

In FIG. 20 is shown a like detail of the interconnection in a 3-primary color 4-digit display having display segments 1a, 1b, 1c, and id arranged in a 7-segment font. Similarly, the color control inputs B, P, BG, G, Y, W, and R of color controls 53a, 53b, 53c, and 53d of all display elements 47a, 47b, 47c, and 47d are interconnected, and the conditions of respective display elements 47a, 47b, 47c, and 47d are controlled by enable inputs E1, E2, E3, and E4. A high logic level at the enable input E extinguishes the particular display element 47a, 47b, 47c, or 47d; a low logic level therein illuminates display element 47a, 47b, 47c, or 47d in a color determined by the instant conditions of the color control inputs B, P, BG, G, Y, W, and R.

The exemplary color control circuits described herein will cooperate equally well with a multi-element variable color display constructed either in common cathodes or in common anodes configuration.

The enable inputs E1, E2, E3, E4 may be utilized to control the variable color multi-digit display in a multiplexed configuration, wherein the color codes for the display digits are presented in a sequence, one at a time, at a relatively fast rate, while the particular display digit is enabled.

Figure 21:
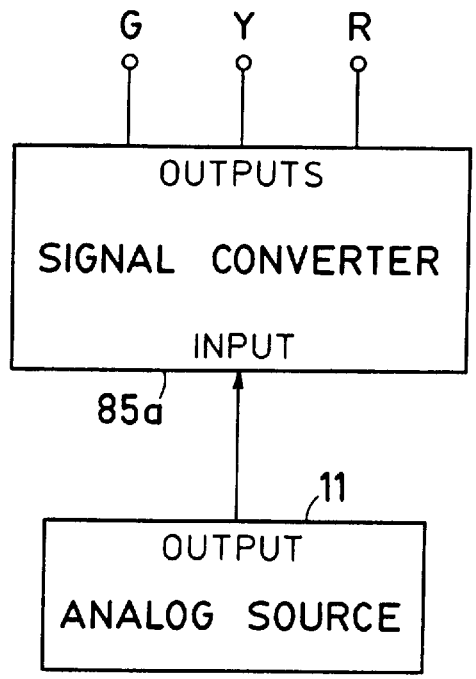
FIG. 21 is a block diagram of a signal converter for 2-primary color display.

In FIG. 21 is shown a block diagram of a signal converter for developing color control logic signals for 2-primary color display. The signal converter 85a accepts at its input voltage from an analog source 11 and develops at its outputs color control logic signals R, Y, G, having relation to the magnitude of instant input analog voltage, for controlling the color of variable color display element 42, shown in FIGS. 11 and 15, in accordance with the magnitude of input voltage.

Figure 22:
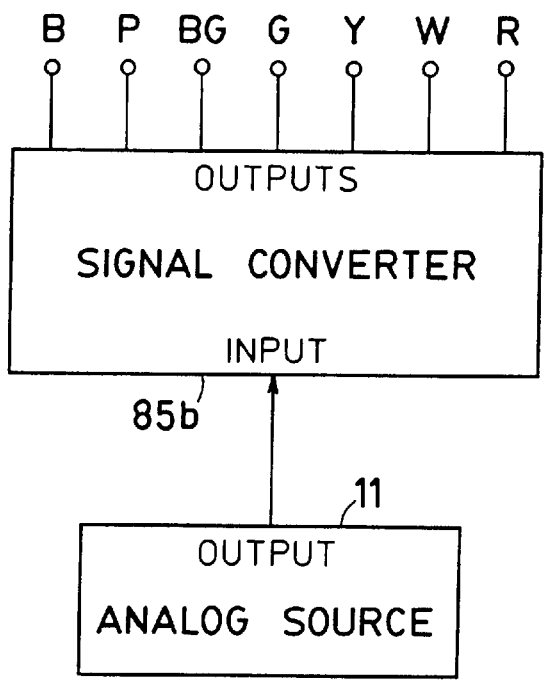
FIG. 22 is a block diagram of a signal converter for 3-primary color display.

In FIG. 22 is shown a block diagram of a like signal converter for developing color control logic signals for 3-primary color display. The signal converter 85b accepts at its inputs voltage from analog source 11 and develops output color control logic signals B, P, BG, G, Y, W, R, related to the magnitude of instant input analog voltage, for controlling the color of variable color display element 43, shown in FIGS. 12 and 16, in accordance with the magnitude of input voltage.

Figure 23:
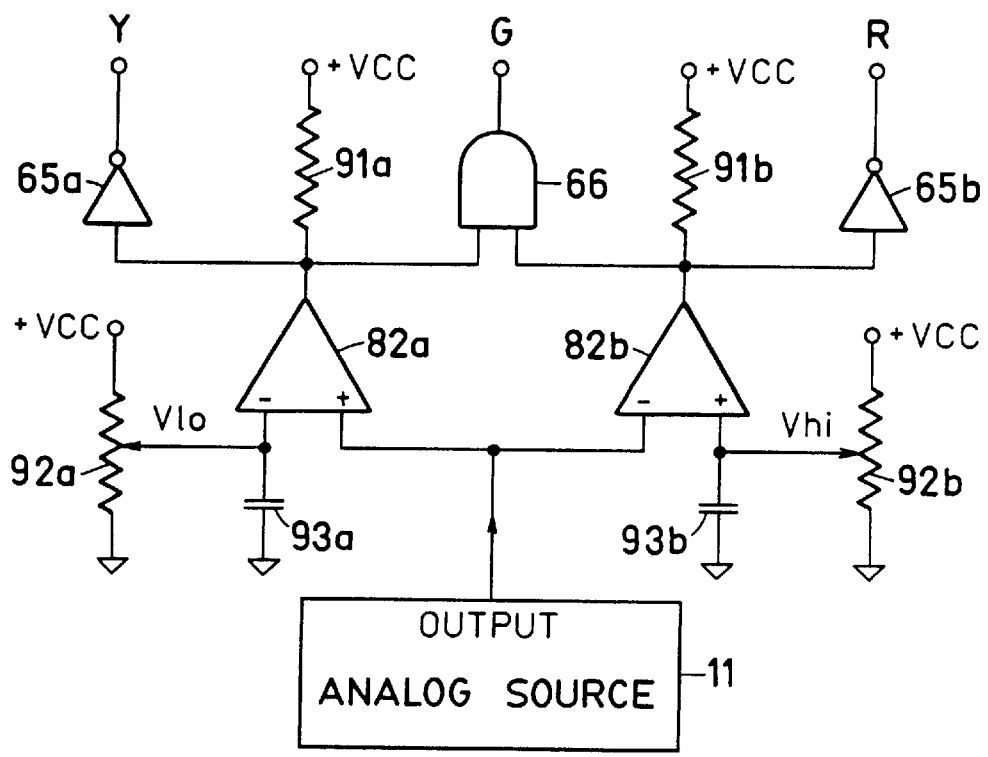
FIG. 23 is a schematic diagram of a comparator circuit for 2-primary color display.

In FIG. 23, the output voltage of analog source 11 is applied to interconnected inputs of two analog comparators 82a and 82b, in a classic 'window' comparator configuration. When the voltage developed by analog source 11 is lower than the low voltage limit V1, set by a potentiometer 92a, the output of comparator 82a drops to a low logic level, thereby forcing the output of inverter 65a to rise to a high logic level, to activate the color control logic input Y, to thereby illuminate display element 42 in yellow color.

When the voltage developed by analog source 11 is higher than the high voltage limit Vhi, set by a potentiometer 92b, the output of comparator 82b drops to a low logic level, thereby forcing the output of inverter 65b to rise to a high logic level, to activate the color control logic input R, to thereby illuminate display element 42 in red color.

When the voltage developed by analog source 11 is between the low voltage limit Vlo and high voltage limit Vhi, the outputs of comparators 82a and 82b rise to a high logic level, thereby causing the output of AND gate 66 to rise to a high logic level, to activate the color control logic input G, to illuminate display element 42 in green color.

Figure 24:
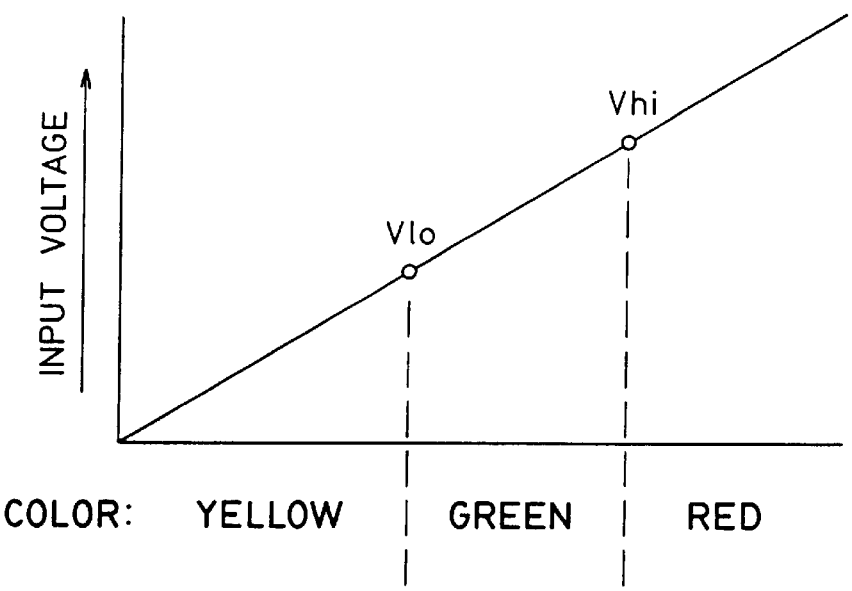
FIG. 24 is a graph showing the relationship between the inputs and outputs of the comparator circuit in FIG. 23.

FIG. 24 is a graph depicting the relationship between the input voltage of the comparator circuit shown in FIG. 23 and the color of display element 42 shown in FIG. 11. The display element 42 illuminates in yellow color for the input voltage lower than the limit Vlo, in green color for the input voltage between the limits Vlo and Vhi, and in red color for the input voltage higher than the limit Vhi.

Figure 25:
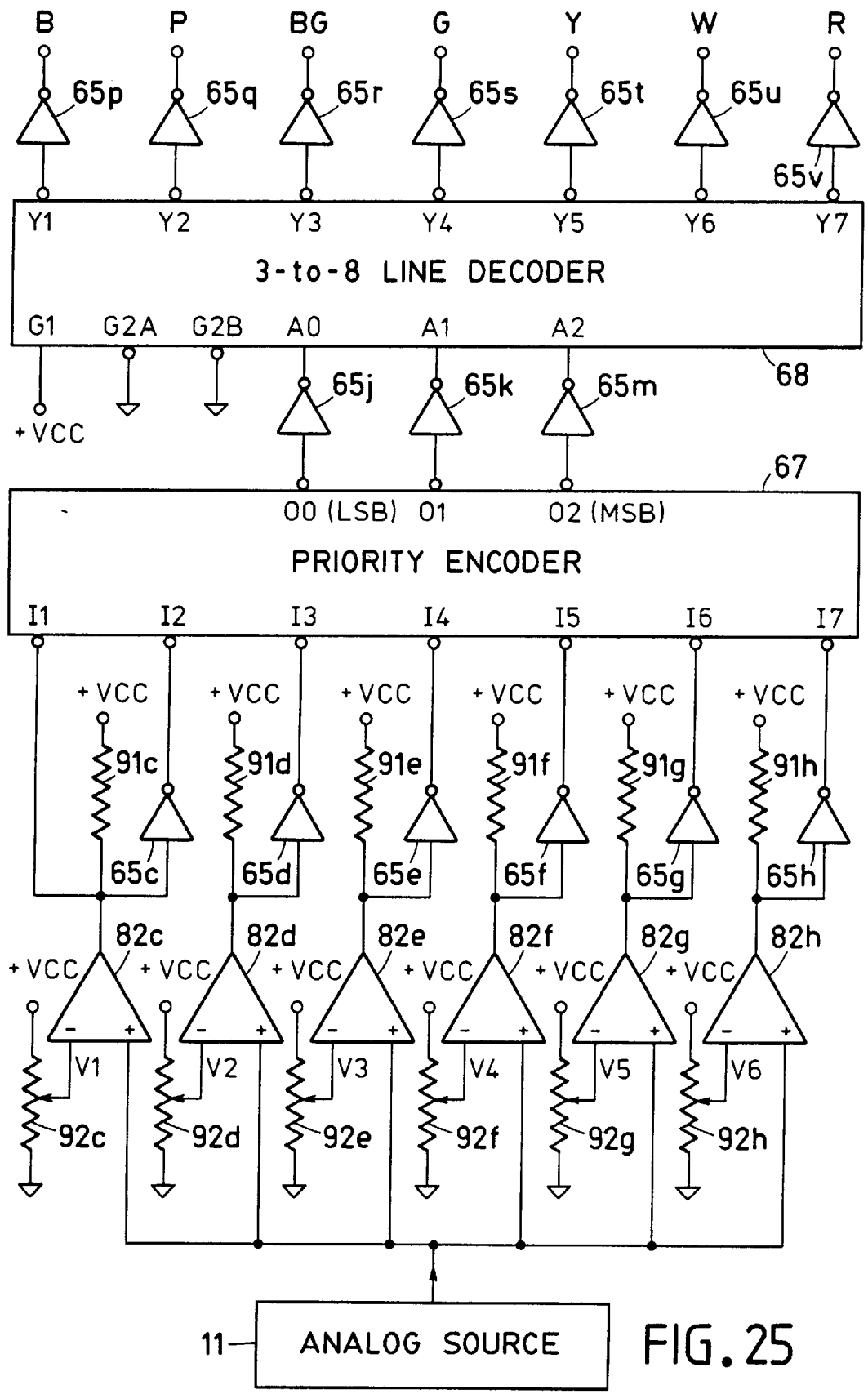
FIG. 25 is a schematic diagram of a comparator circuit for 3-primary color display.

In FIG. 25, the output voltage of analog source 11 is applied to interconnected '+' inputs of six analog comparators 82c, 82d, 82e, 82f, 82g, 82h, connected in a well known 'multiple aperture window' configuration. There are six progressively increasing voltage limits V1 to V6, set by respective potentiometers 92c to 92h. The outputs of comparators 82c to 82h are respectively connected, via inverters 65c to 65h, to the inputs I1 to I7 of a priority encoder 67. Each of the inputs I1 to I7 has assigned a certain priority (from I1 being the lowest priority progressively to I7 being the highest one). The priority encoder 67 develops at its outputs O0, O1, O2 a code identifying the highest priority input activated. The outputs of priority encoder 67 are respectively connected, via inverters 65j to 65m, to the inputs A0, A1, and A2 of a 3-to-8 line decoder 68, to decode the outputs of priority encoder 67 into seven mutually exclusive active logic low outputs Y1 to Y7. The outputs Y1 to Y7 are respectively connected, via inverters 65p to 65v, to the color control logic inputs B, P, BG, G, Y, W, R of display element 43.

When the output voltage of analog source 11 is lower than the lowest voltage limit V1, the output of comparator 82c drops to a low logic level, thereby activating the input I1 of priority encoder 67. The code 110 developed at the outputs O0, O1, O2 is inverted by inverters 65j to 65m to yield the code 001 which produces a low logic level at the output Y1, to force, via inverter 65p, the color control input B to a high logic level for causing display element 43 to illuminate in blue color.

When the output voltage of analog source 11 is between the adjacent voltage limits, e.g., V4 and V5, the output of comparator 82f rises to a high logic level, thereby activating the input I5 of priority encoder 67. The code 100 developed at the inputs of decoder 68 produces a high logic level at the color control logic input Y, and display element 43 illuminates in yellow color.

Figure 26:
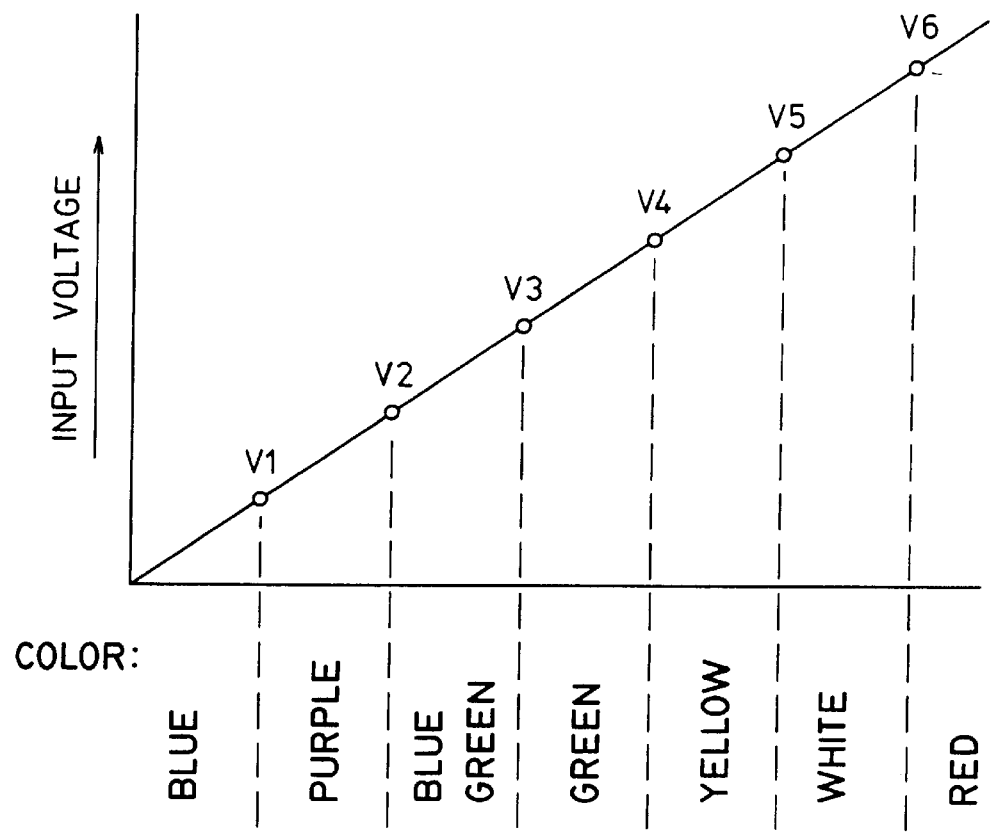
FIG. 26 is a graph showing the relationship between the inputs and outputs of the comparator circuit in FIG. 25.

FIG. 26 is a graph depicting the relationship between the input voltage of the comparator circuit shown in FIG. 25 and the color of display element 43 shown in FIG. 12. The display element 42 illuminates in blue color for the input voltage lower than the limit V1, in purple color for the input voltage between the limits V1 and V2, in blue-green color for the input voltage between the limits V2 and V3, in green color for the input voltage between the limits V3 and V4, in yellow color for the input voltage between the limits V4 and V5, in white color for the input voltage between the limits V5 and V6, and in red color for the input voltage higher than the limit V6.

It would be obvious to those having ordinary skill in the art, in the view of this disclosure, that the color sequences could be readily changed by differently interconnecting the outputs of the comparator circuit with the color control logic inputs of display element 43.

Continuously Variable Color Converter

FIG. 27 is a block diagram of a 2-LED continuously variable color display system, which includes a device 10 for developing electric signals and 2-LED color converter 57 for controlling red bus 5 and green bus 6, respectively, of 2-LED variable color display element 42 in accordance with the electric signals.

FIG. 28 is a block diagram of a 3-LED continuously variable color display system which differs from the like system shown in FIG. 27 in that a 3-LED color converter 58 is utilized to control red bus 5, green bus 6, and blue bus 7, respectively, of 3-LED variable color display element 43, in accordance with electric signals developed by device 10.

The display system shown in FIG. 29 utilizes a scaling circuit 80a which scales input analog voltage levels to a voltage range suitable for an A/D converter 74a, which in turn develops at its outputs a digital code having relation to the value of the input analog voltage. The output lines of A/D converter 74a are connected to the address inputs of a memory 76 having a plurality of addressable locations which contain data indicating the portions of red color for several different values of the input analog voltage. The output data of memory 76 are applied to the inputs of color converter 57 which will develop control signals for red bus 5 and green bus 6, respectively, of variable color display element 42.

The display system shown in FIG. 30 utilizes a scaling circuit 80b and an A/D converter 74b for converting the instant value of an input analog voltage to a digital code.

The outputs of A/D converter 74b are connected, in parallel, to the address inputs of memory 76a, which contains data indicating the portions of red color, to the address inputs of memory 76b, which contains data indicating the portions of green color, and to the address inputs of memory 76c, which contains data indicating the portions of blue color. The output data of memory 76a are applied to red color converter 59a which will develop control signals for red bus 5 of variable color display element 43. The output data of memory 76b are applied to green color converter 59b which will develop control signals for green bus 6 of display element 43. The output data of memory 76c are applied to blue color converter 59c which will develop control signals for blue bus 7 of display element 43.

Figure 31:
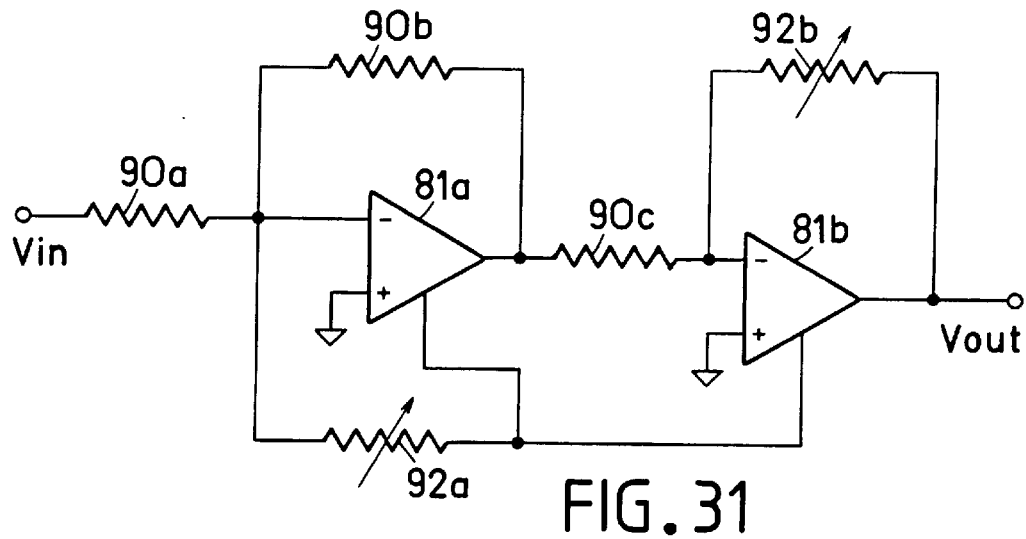
FIG. 31 is a schematic diagram of a scaling circuit.

FIG. 31 is a schematic diagram of a scaling circuit capable of shifting and amplifying the input voltage levels. The circuit utilizes two operational amplifiers 81a and 81b in a standard inverting configuration. The amplifier 81a is set for a unity gain by using resistors 90a and 90b of equal values; potentiometer 92a is adjusted to set a desired offset voltage. The amplifier 81b sets the gain by adjusting feedback potentiometer 92b to a desired value with respect to resistor 90c. As a result, an input voltage, which may vary between arbitrary limits Vlow and Vhigh, may be scaled and shifted to the range between 0 Volts and 9.961 Volts, to facilitate the use of a commercially available A/D converter.

Figure 32:
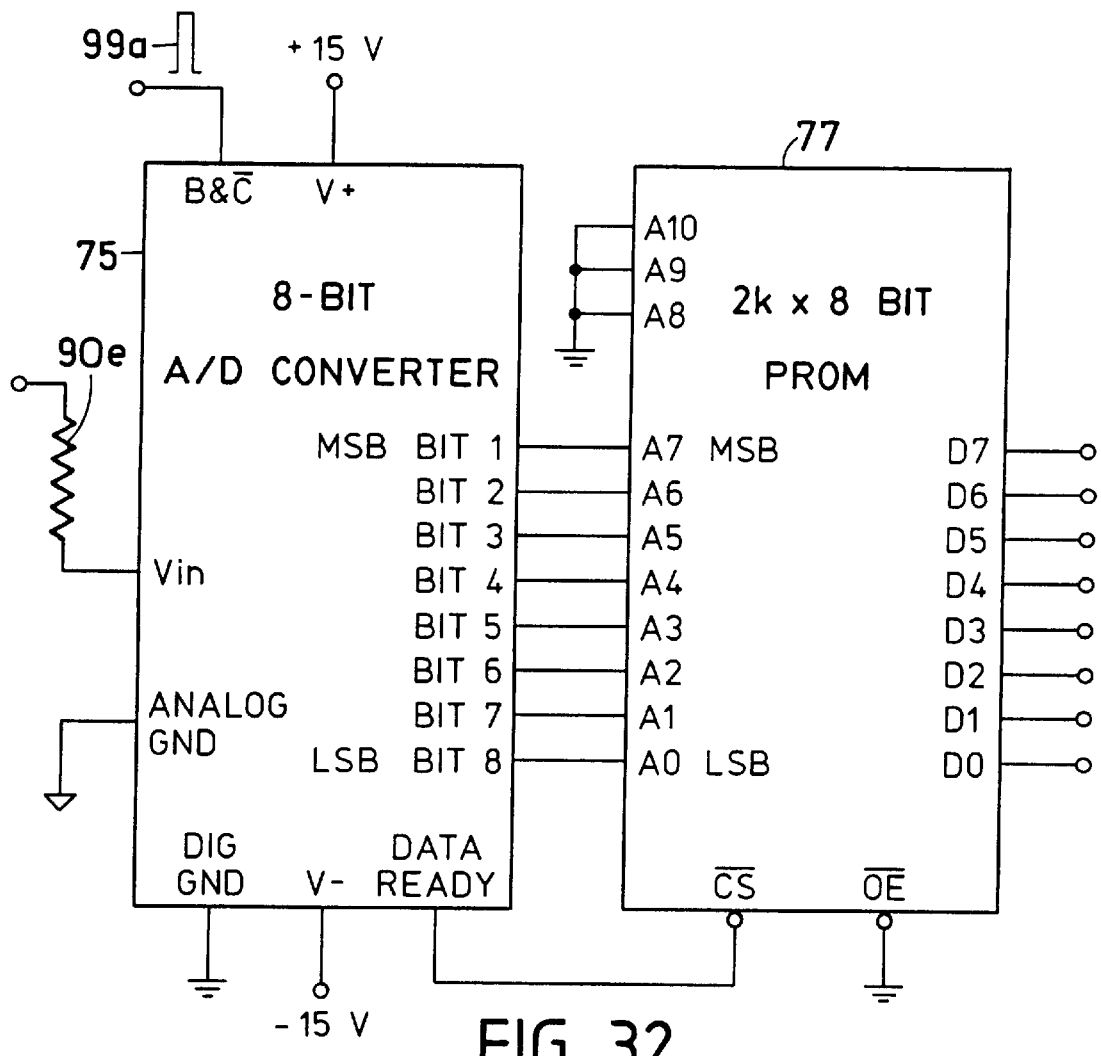
FIG. 32 is a schematic diagram of an A/D converter and memory combination of FIGS. 29 and 30.

FIG. 32 is a schematic diagram of an A/D (analog-to-digital) converter 75 which is capable of converting input analog voltage, applied via resistor 90e to its input Vin, to 8-bit digital data for addressing a memory 77. The conversion may be initiated from time to time by applying a short positive pulse 99a to the Blank and Convert input B&C. A/D converter 75 will thereafter perform a conversion of the instant input voltage to 8-bit data indicative of its value. When the conversion is completed, the Data Ready output DR drops to a low logic level, thereby indicating that the data are available at the outputs Bit 1 to Bit 8, which are respectively connected to address inputs A0 to A7 of memory 77. When the DR output drops to a low logic level, the Chip Select input CS of memory 77 is activated, memory 77 is enabled, and the data, residing at the address selected by the instant output of A/D converter 75, will appear at its data outputs D0 to D7.

Figure 33:
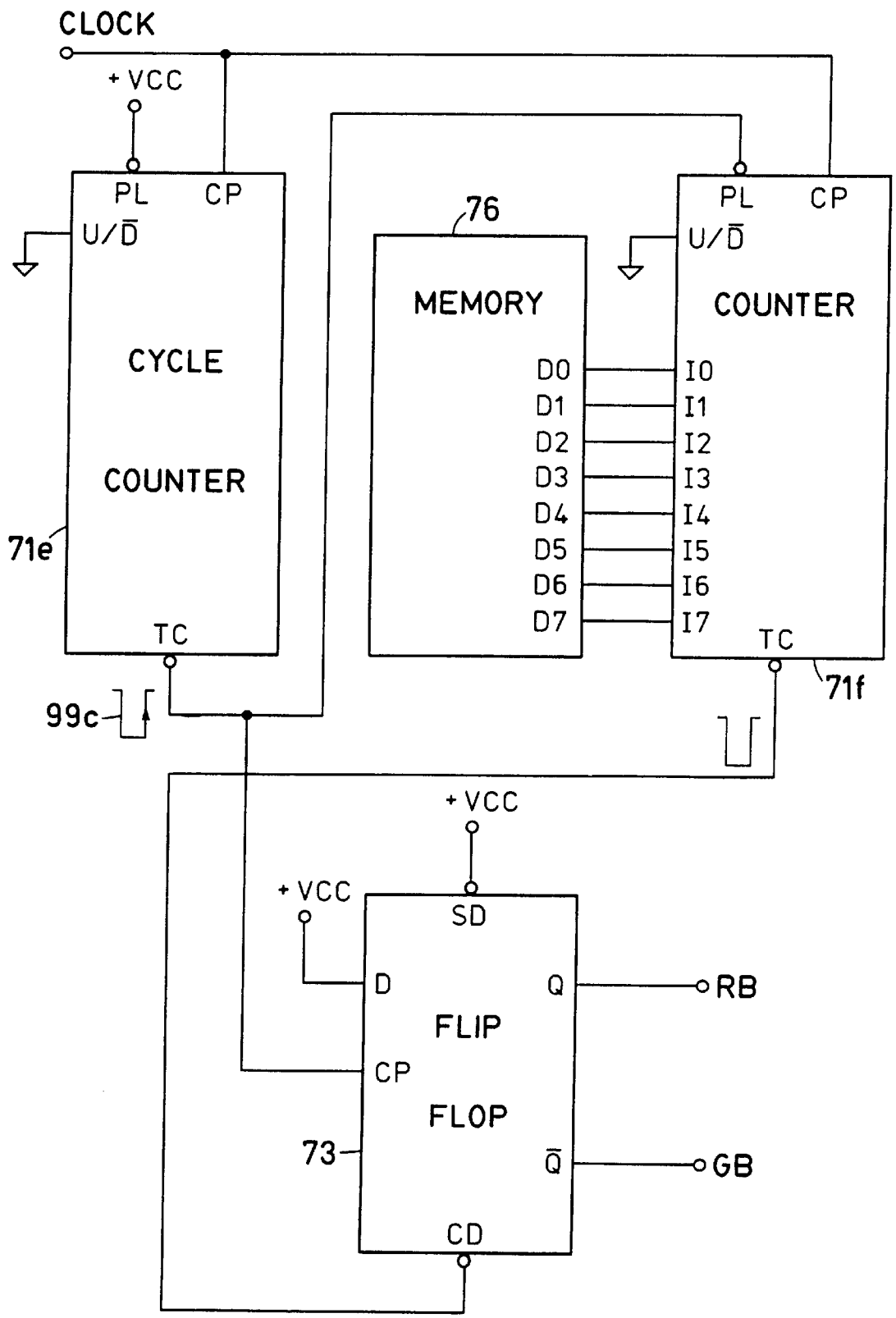
FIG. 33 is a schematic diagram of a memory and color converter combination of FIG. 29.
Figure 34:
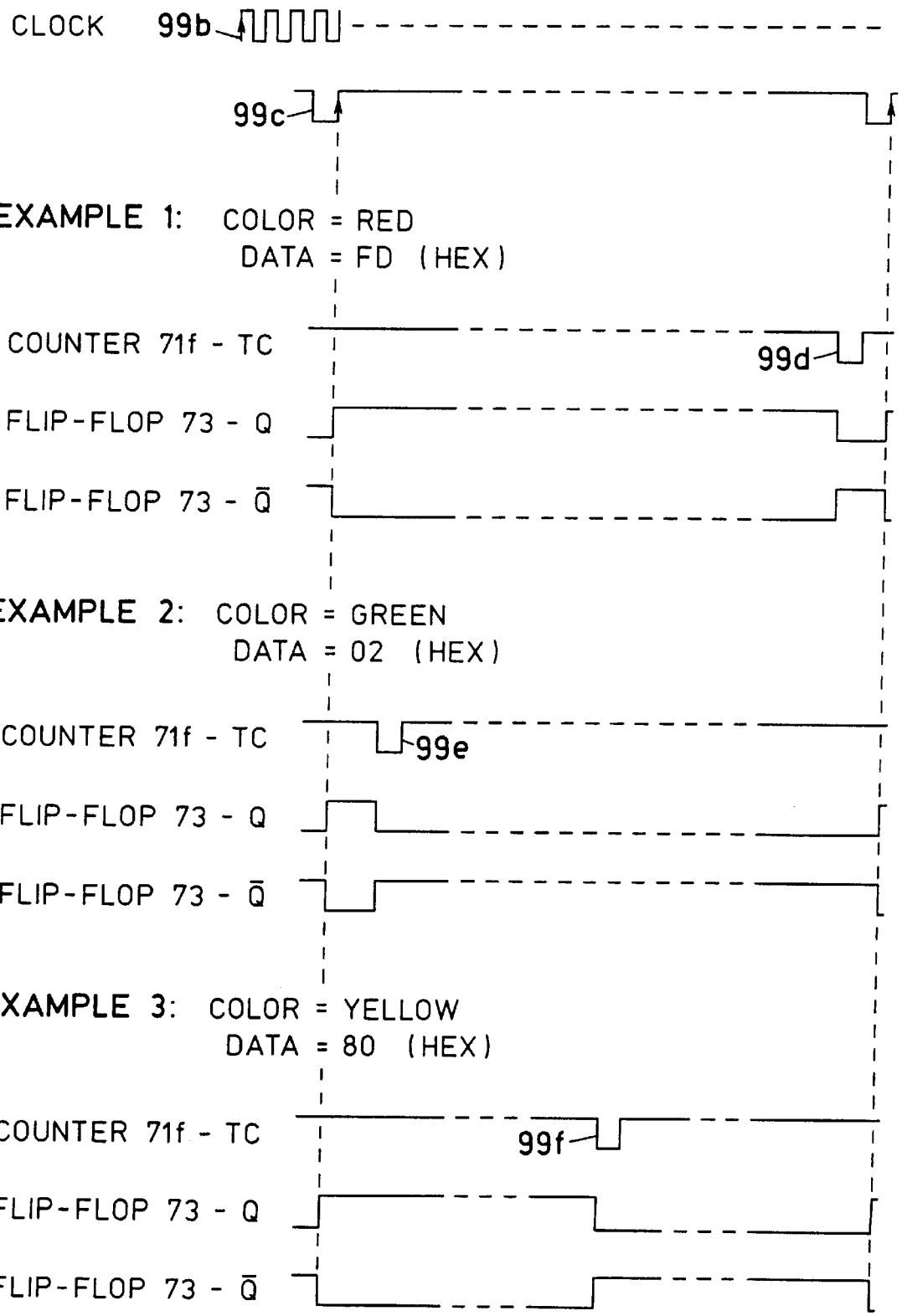
FIG. 34 is a timing diagram of the circuit shown in FIG. 33.

The description of the schematic diagram in FIG. 33 should be considered together with its accompanying timing diagram shown in FIG. 34. A clock signal 99b of a suitable frequency (e.g., 10 kHz), to provide a flicker-free display, is applied to the Clock Pulse inputs CP of 8-bit binary counters 71e and 71f to step them down. At the end of each counter cycle, which takes 256 clock cycles to complete, the Terminal Count output TC of counter 71e drops to a low logic level for one clock cycle, to thereby indicate that the lowest count was reached. The negative pulse 99c at the TC output of counter 71e, which is connected to the Parallel Load input PL of counter 71f, causes the instant data at the outputs of memory 76 to be loaded into counter 71f. The data at memory 76 represent the portion of red color; the portion of green color is complementary. The rising edge of the TC pulse 99c triggers flip-flop 73 into its set condition wherein its output Q rises to a high logic level.

The counter 71f will count down, from the loaded value, until it reaches zero count, at which moment its TC output drops to a low logic level. The negative pulse at the TC output of counter 71f, which is connected to the Clear Direct input CD of flip-flop 73, causes the latter to be reset and to remain in its reset condition until it is set again at the beginning of the next 256-count cycle. It is thus obvious that the Q output of flip-flop 73 is at a high logic level for a period of time proportional to the data initially loaded into counter 71f. The complementary output $\overline{Q}$ is at a high logic level for a complementary period of time.

The Q and $\overline{Q}$ outputs of flip-flop 73 are connected to red bus 5 and green bus 6, respectively, via suitable buffers 63a and 63b, shown in detail in FIG. 11, to respectively energize red bus 5 and green bus 6 for variable time periods, depending on the data stored in memory 76.

By referring now, more particularly, to the timing diagram shown in FIG. 34, in which the waveforms are compressed to facilitate the illustration, the EXAMPLE 1 considers the memory data 'FD', in a standard hexadecimal notation, to generate light of substantially red color. At the beginning of the counter cycle, pulse 99c loads data 'FD' into counter 71f. Simultaneously, flip-flop 73 is set by the rising edge of pulse 99c. The counter 71f will be thereafter stepped down by clock pulses 99b, until it reaches zero count, 2 clock cycles before the end of the counter cycle. At that instant a short negative pulse 99d is produced at its output TC to reset flip-flop 73, which will remain reset for 2 clock cycles and will be set again by pulse 99c at the beginning of the next counter cycle, which will repeat the process. It is readily apparent that flip-flop 73 was set for 254 clock cycles, or about 99% of the time, and reset for 2 clock cycles, or about 1% of the time. Accordingly, red bus 5 of display element 42 is energized for about 99% of the time, and green bus 6 is energized for the remaining about 1% of the time. As a result, display element 42 illuminates in substantially red color.

The EXAMPLE 2 considers the memory data '02' (HEX) to generate light of substantially green color. At the beginning of the counter cycle, data '02' are loaded into counter 71f, and, simultaneously, flip-flop 73 is set. The counter 71f will count down and will reach zero count after 2 clock cycles. At that instant it produces at its output TC a negative pulse 99e to reset flip-flop 73. It is readily apparent that flip-flop 73 was set for 2 clock cycles, or about 1% of the time, and reset for 254 clock cycles, or about 99% of the time. Accordingly, red bus 5 of display element 42 is energized for about 1% of the time, and green bus 6 is energized for the remaining about 99% of the time. As a result, display element 42 illuminates in substantially green color.

The EXAMPLE 3 considers the memory data '80' (HEX) to generate light of substantially yellow color. At the beginning of the counter cycle, data '80' are loaded into counter 71f, and, simultaneously, flip-flop 73 is set. The counter 71f will count down and will reach zero count after 128 clock cycles. At that instant it produces at its output TC a negative pulse 99f to reset flip-flop 73. It is readily apparent that flip-flop 73 was set for 128 clock cycles, or about 50% of the time, and reset for 128 clock cycles, or about 50% of the time. Accordingly, red bus 5 of display element 42 is energized for about 50% of the time, and green bus 6 is energized for the remaining about 50% of the time. As a result of blending substantially equal portions of red and green colors, display element 42 illuminates in substantially yellow color.

Figure 35:
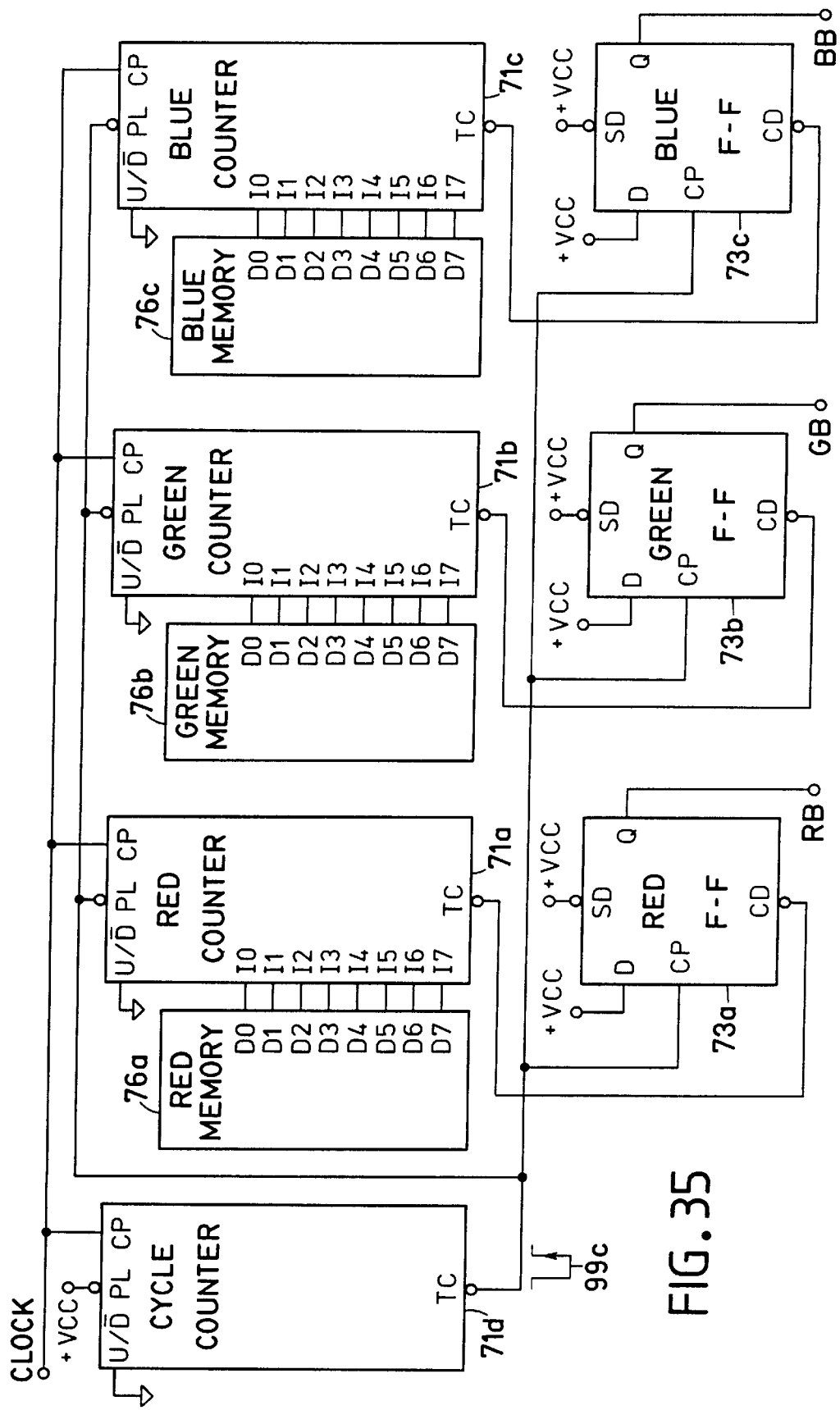
FIG. 35 is a schematic diagram of a memory and color converter combination of FIG. 30.
Figure 36:
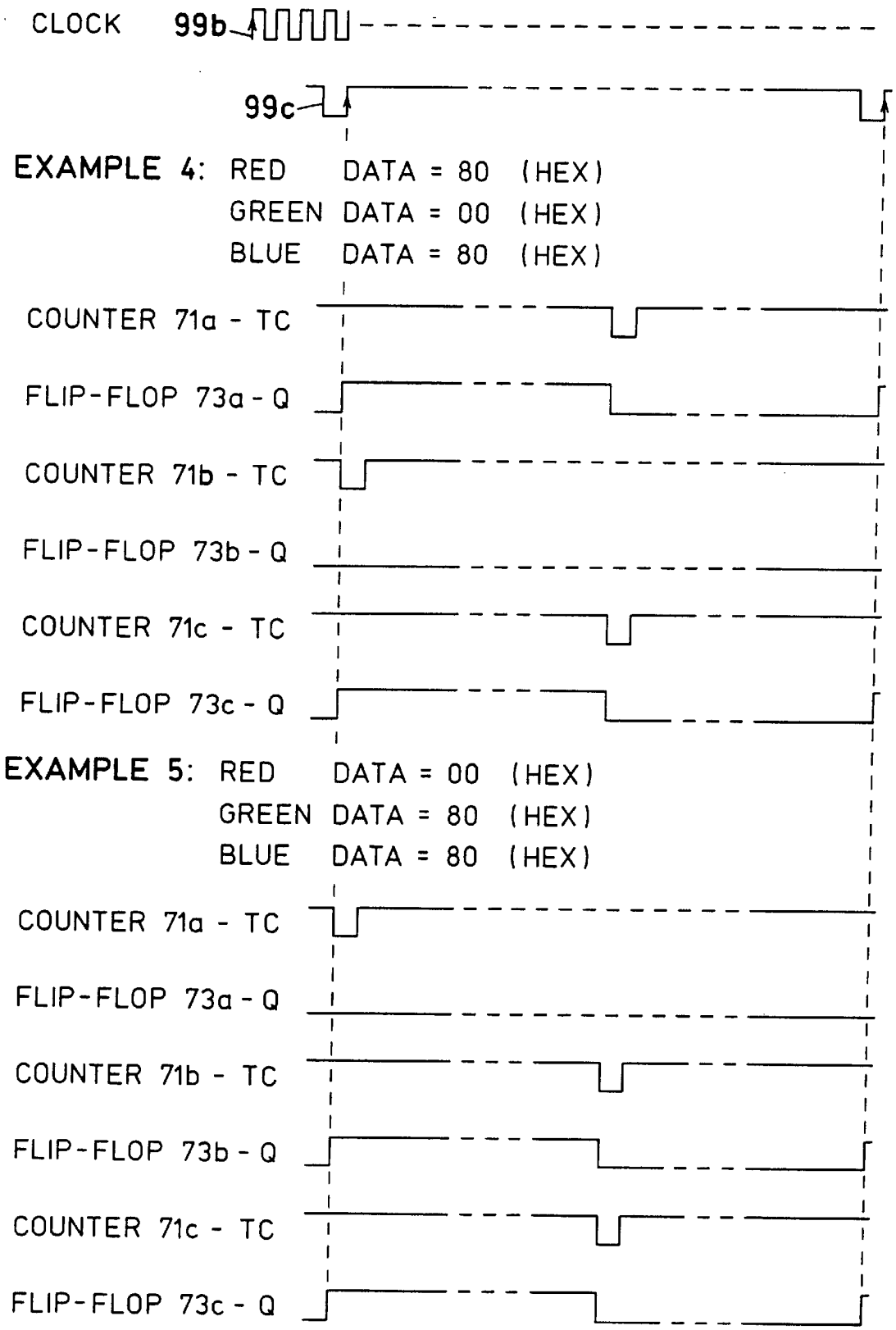
FIG. 36 is a timing diagram of the circuit shown in FIG. 35.
Figure 37:
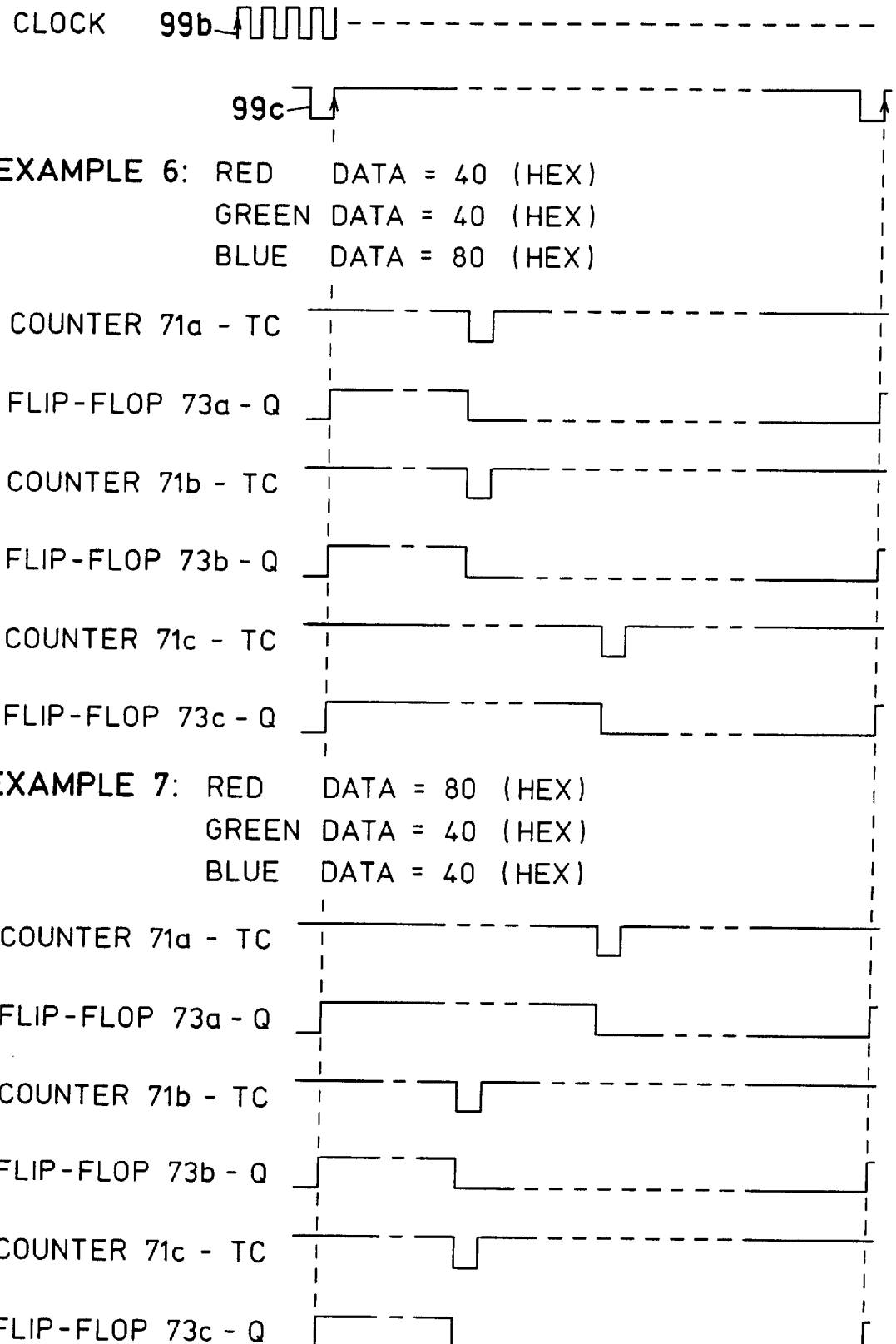
FIG. 37 is a continuation of the timing diagram of FIG. 36.

The description of the schematic diagram of a 3-LED color converter in FIG. 35 should be considered together with its accompanying timing diagrams shown in FIGS. 36 and 37. A clock signal 99b is applied to the CP inputs of counters 71d, 71a, 71b, and 71c to step them down. Every 256 counts a negative pulse 99c is generated at the TC output of counter 71d, to load data into counters 71a, 71b, and 71c from respective memories 76a, 76b, and 7c, and to set flip-flops 73a, 73b, and 73c. The data in red memory 76a represent the portions of red color, the data in green memory 76b represent the portions of green color, and the data in blue memory 76c represent the portions of blue color to be blended.

The counters 71a, 71b, and 71c will count down, from the respective loaded values, until zero counts are reached. When the respective values of the loaded data are different, the length of time of the count-down is different for each counter 71a, 71b, and 71c. When a particular counter 71a, 71b, or 71c reaches zero count, its TC output momentarily drops to a low logic level, to reset its associated flip-flop (red counter 71a resets its red flip-flop 73a, green counter 71b resets its associated green flip-flop 73b, and blue counter 71c resets its associated blue flip-flop 71c). Eventually, all three flip-flops 73a, 73b, and 71c will be reset. The Q outputs of flip-flops 73a, 73b, and 71c are connected to red bus 5, green bus 6, and blue bus 7, respectively, via suitable buffers 62a, 62b, and 62c, shown in FIG. 12, to respectively energize red bus 5, green bus 6, and blue bus 7 for variable periods of time.

By referring now more particularly to the timing diagram shown in FIGS. 36 and 37, the EXAMPLE 4 considers red memory data '80', green memory data '00', and blue memory data '80', all in hexadecimal notation, to generate light of substantially purple color. At the beginning of the counter cycle, pulse 99c simultaneously loads data '80' from red memory 76a into red counter 71a, data '00' from green memory 76b into green counter 71b, and data '80' from blue memory 76c into blue counter 71c. The counters 71a, 71b, and 71c will be thereafter stepped down. The red counter 71a will reach its zero count after 128 clock cycles; green counter 71b will reach its zero count immediately; blue counter 71c will reach its zero count after 128 clock cycles.

It is readily apparent that red flip-flop 73a was set for 128 clock cycles, or about 50% of the time, green flip-flop 73b was never set, and blue flip-flop 71c was set for 128 clock cycles, or about 50% of the time.

Accordingly, red bus 5 of display element 43 is energized for about 50% of the time, green bus 6 is never energized, and blue bus 7 is energized for about 50% of the time. As a result of blending substantially equal portions of red and blue colors, display element 43 illuminates in substantially purple color.

The EXAMPLE 5 considers red memory data '00', green memory data '80', and blue memory data '80', to generate light of substantially blue-green color. At the beginning of the counter cycle, data '00' are loaded into red counter 71a, data '80' are loaded into green counter 71b, and data '80' are loaded into blue counter 71c. The red counter 71a will reach its zero count immediately, green counter 71b will reach its zero count after 128 clock periods, and so will blue counter 71c.

The red flip-flop 73a was never set, green flip-flop 73b was set for 128 clock pulses, or about 50% of the time, and so was blue flip-flop 71c. Accordingly, green bus 6 of display element 43 is energized for about 50% of the time, and so is blue bus 7. As a result, display element 43 illuminates in substantially blue-green color.

The EXAMPLE 6 considers red memory data '40', green memory data '40', and blue memory data '80', to generate light of substantially cyan color. At the beginning of the counter cycle, the data '40' are loaded into red counter 71a, data '40' are loaded into green counter 71b, and data '80' are loaded into blue counter 71c. The red counter 71a will reach its zero count after 64 clock cycles, and so will green counter 71b. The blue counter 71c will reach its zero count after 128 clock cycles.

The red flip-flop 73a was set for 64clock cycles, or about 25% of the time, and so was green flip-flop 73b. The blue flip-flop 71c was set for 128 clock cycles, or about 50% of the time. Accordingly, red bus 5 and green bus 6 of display element 43 are energized for about 25% of the time, and blue bus 7 is energized for about 50% of the time. As a result of blending about 50% of blue color, 25% of red color, and 25% of green color, display element 43 illuminates in substantially cyan color.

The EXAMPLE 7 considers red memory data '80', green memory data '40', and blue memory data '40', to generate light of substantially magenta color. At the beginning of the counter cycle, the data '80' are loaded into red counter 71a, data '40' are loaded into green counter 71b, and data '40' are loaded into blue counter 71c. The red counter 71a will reach its zero count after 128 clock cycles, green counter 71b will reach its zero count after 64 clock cycles, and so will blue counter 71c.

The red flip-flop 73a was set for 128 clock cycles, or about 50% of the time, green flip-flop 73b and blue flip-flop 71c were set for 64clock cycles, or about 25% of the time. Accordingly, red bus 5 of display element 43 is energized for about 50% of the time, green bus 6 and blue bus 7 are energized for about 25% of the time. As a result, display element 43 illuminates in substantially magenta color.

Figure 38:
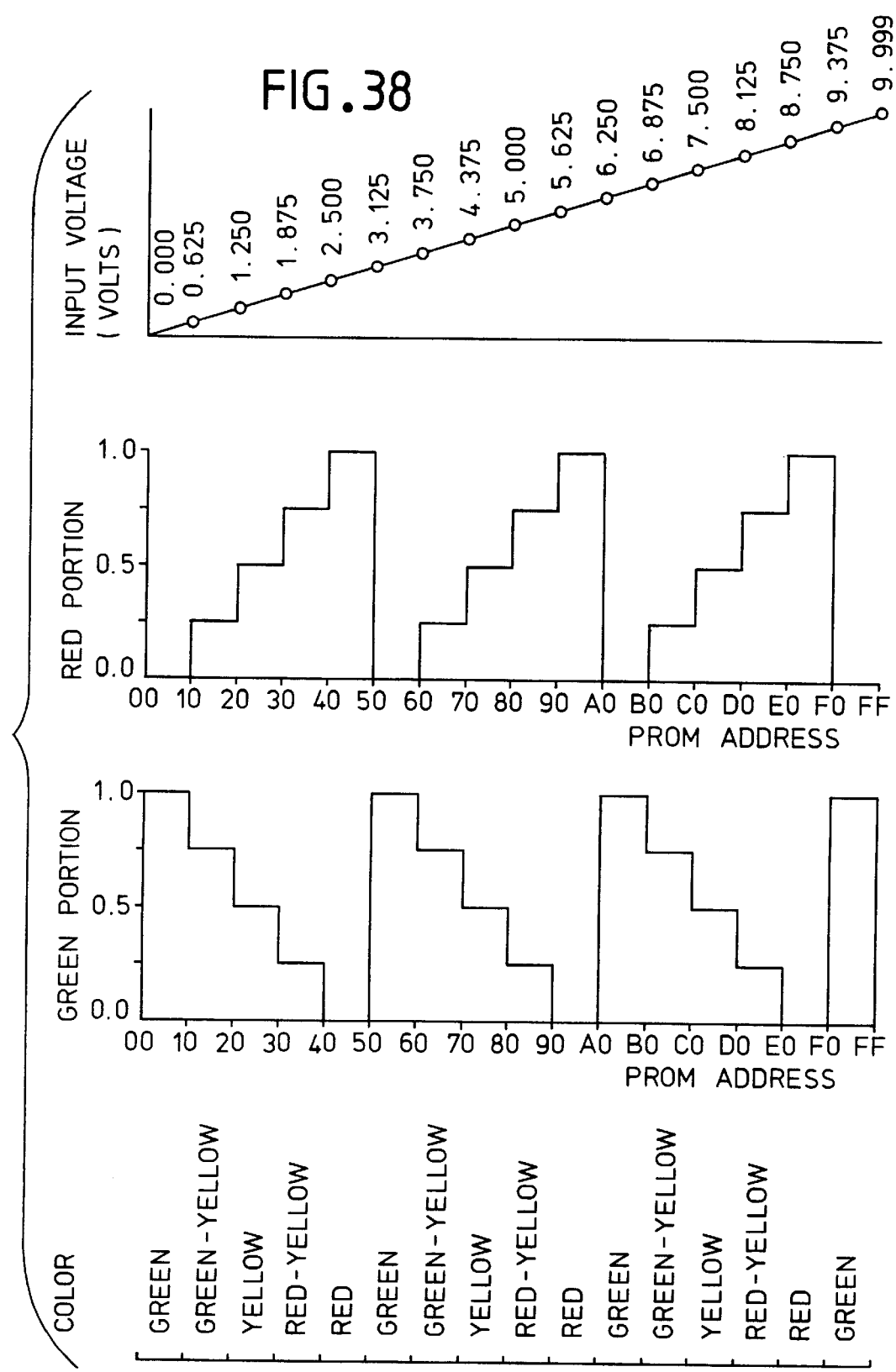
FIG. 38 is a graphic representation of TABLE 1.
Figure 39:
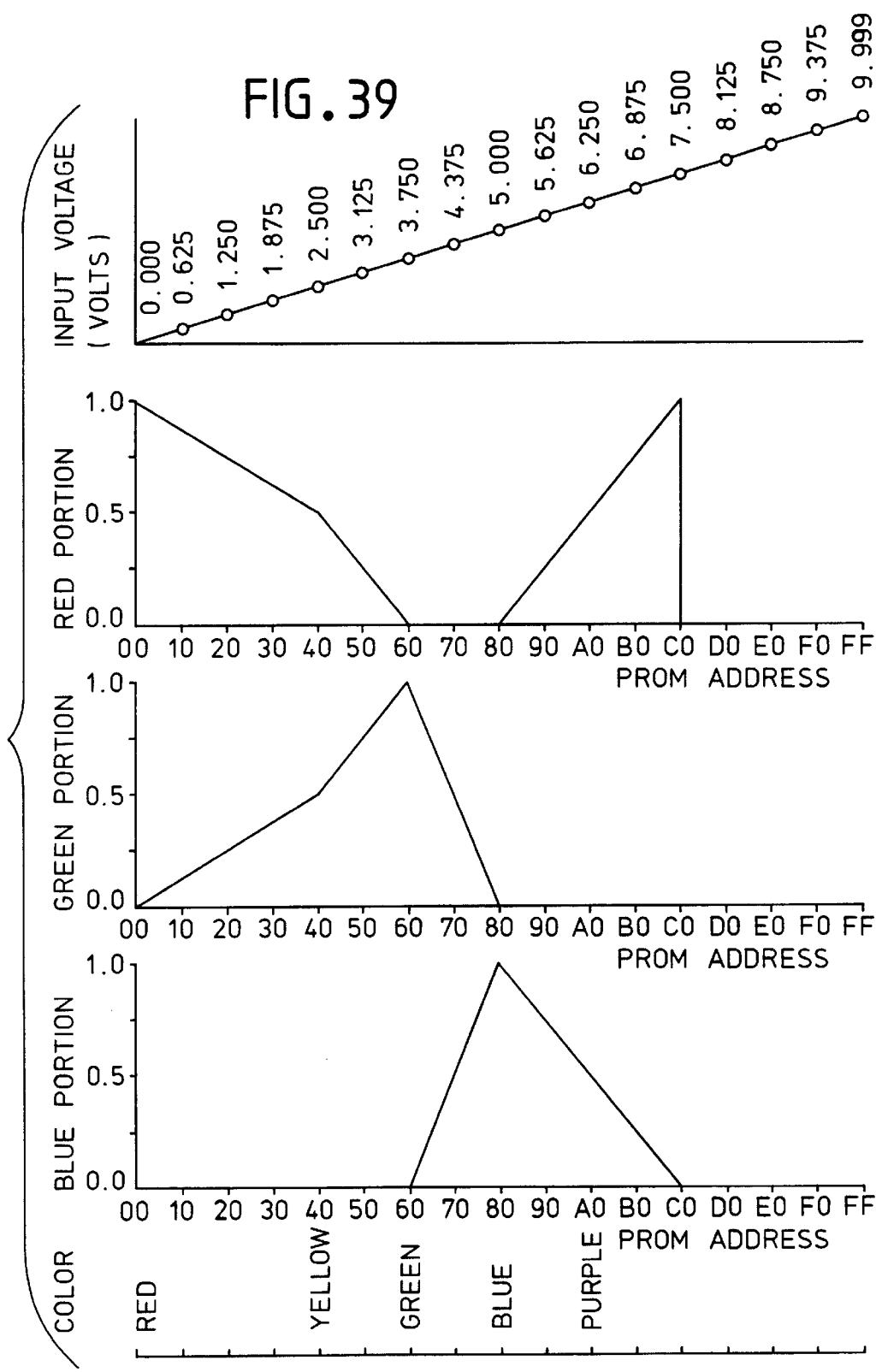
FIG. 39 is a graphic representation of TABLE 2.

By referring now more particularly to FIGS. 38 and 39, which are graphic representations of TABLES 1 and 2, respectively, the data at each memory address are digital representation of the portion of the particular primary color. All examples consider an 8-bit wide PROM (Programmable Read Only Memory). However, the principles of the invention could be applied to other types of memories.

In FIG. 38, RED PORTION indicates the portion of red primary color; GREEN PORTION indicates the portion of green primary color. The RED PORTION for a particular memory address was calculated by dividing the actual value of data residing at that address by the maximum possible data 'FF' (HEX). The GREEN PORTION for the same memory address is complementary; it was obtained by subtracting the calculated value of the RED PORTION from number 1.0.

In FIG. 38 is shown the characteristic of a 2-primary color converter, defined in TABLE 1, for developing color variable in steps: pure green for input voltages less than 0.625 V, substantially yellow for voltages between 1.25 V and 1.875 V, pure red for voltages between 2.5 V and 3.125 V, and of intermediate colors therebetween, this sequence being repeated three times over the voltage range.

In FIG. 39, RED PORTION indicates the portion of red primary color; GREEN PORTION indicates the portion of green primary color; BLUE PORTION indicates the portion of blue primary color. The RED PORTION for a particular memory address was calculated by dividing the value of red data residing at such address by the maximum possible data 'FF' (HEX). Similarly, the GREEN PORTION for that memory address was obtained by dividing the value of green data by 'FF' (HEX). The BLUE PORTION was obtained by dividing the value of blue data by 'FF' (HEX).

In FIG. 39 is shown the characteristic of 3-primary color converter, defined in TABLE 2, for developing color continuously variable from pure red, through substantially orange and yellow, pure green, pure blue, to substantially purple, in a rainbow-like fashion.

In the examples of the characteristics of color converters shown in TABLE 1 and TABLE 2, the data values stored in red memory 76a, green memory 76b, and blue memory 76c are so designed that the sums of the red data, green data, and blue data are constant for all memory addresses, to provide uniform light intensities for all colors. It is further contemplated that data stored in red memory 76a, green memory 76b, and blue memory 76c may be modified in order to compensate for different efficiencies of red, green, and blue LEDs. By way of an example, data values for a low efficiency LED may be proportionally incremented such that the time of energization is proportionally increased, to effectively provide equal luminances for LEDs of unequal efficiencies.

Figure 40:
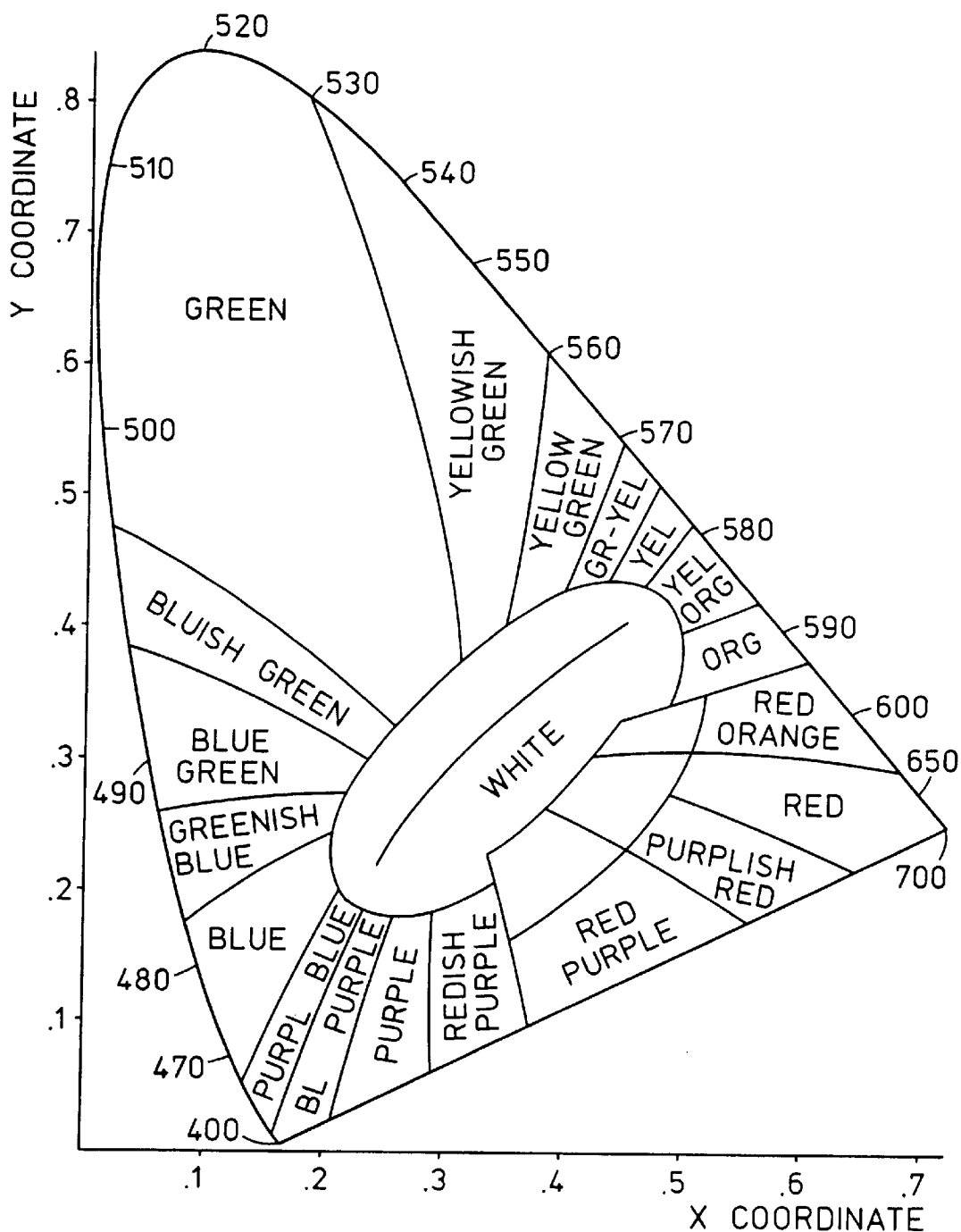
FIG. 40 is a graph of the ICI chromaticity diagram.

With reference to FIG. 40 there is shown the ICI (International Committee on Illumination) chromaticity diagram designed to specify a particular color in terms of x and y coordinates. Pure colors are located along the horseshoe-like periphery. Reference numbers along the periphery indicate wavelength in nanometers. When relative portions of three primary colors are known, the color of light produced by blending their emissions can be determined by examining the x and y values of ICI coordinates.

Digital Multimeter

Figure 41:
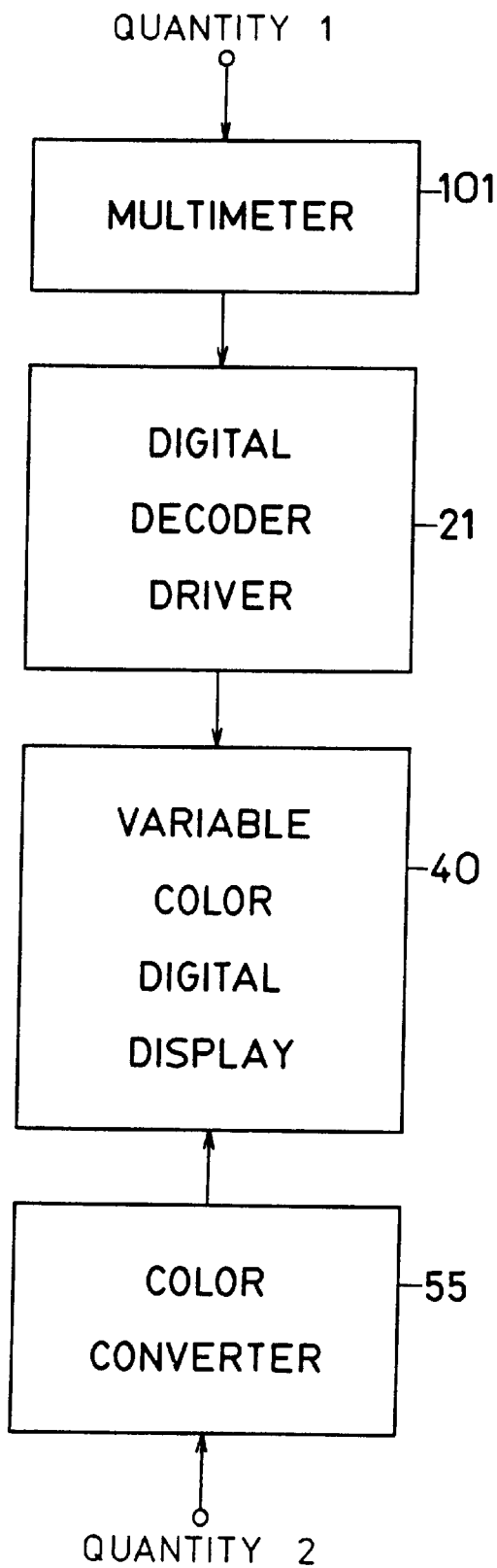
FIG. 41 is a block diagram of a multimeter with variable color digital display.

FIG. 41 is a generalized block diagram of a multimeter with variable color digital display which includes a multimeter 101 for measuring values of a QUANTITY 1, digital decoder driver 21 for converting the output data of multimeter 101 to a displayable code, and variable color digital display 40 for indicating the measured values in digital format. The invention resides in the addition of a color converter 55 for converting values of a QUANTITY 2 to color control signals and for accordingly controlling the color of display 40. The display 40 thus simultaneously indicates values of QUANTITY 1, in digital format, and values of QUANTITY 2, in variable color.

Figure 42:
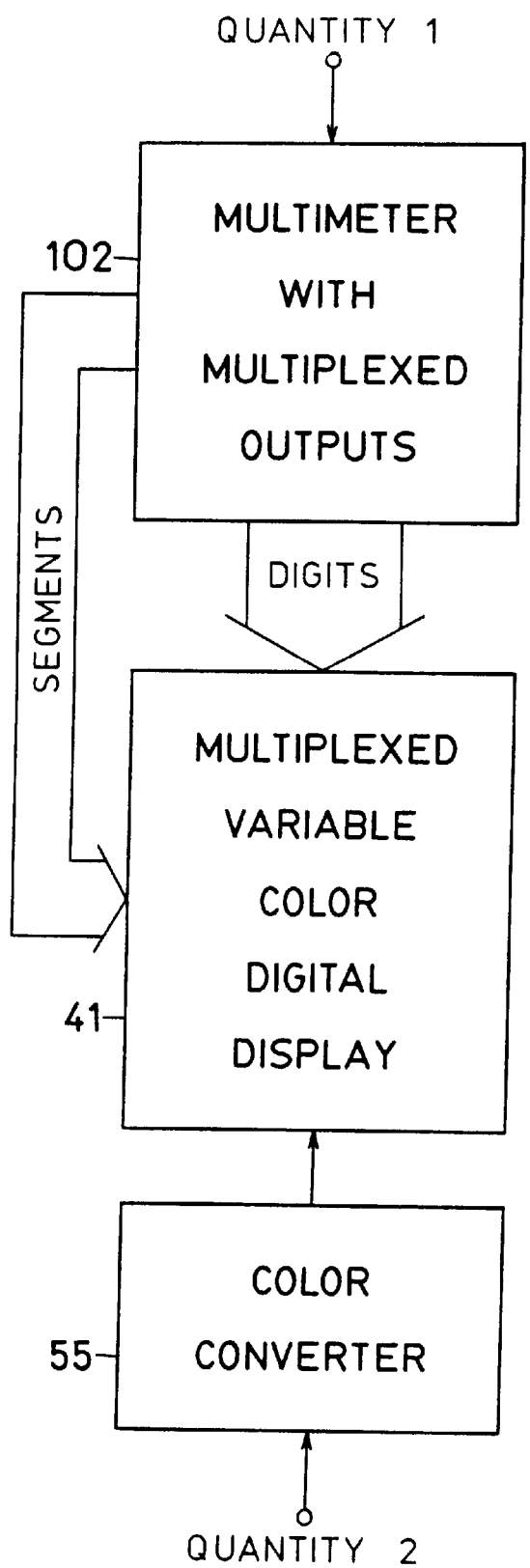
FIG. 42 is a block diagram of a multimeter with multiplexed variable color digital display.

FIG. 42 is a generalized block diagram of a like multimeter system with a multiplexed variable color digital display 41, which differs from the diagram of FIG. 41 in that multimeter with multiplexed outputs 102 develops multiplexed signals to directly drive multiplexed variable color digital display 41.

Figure 43:
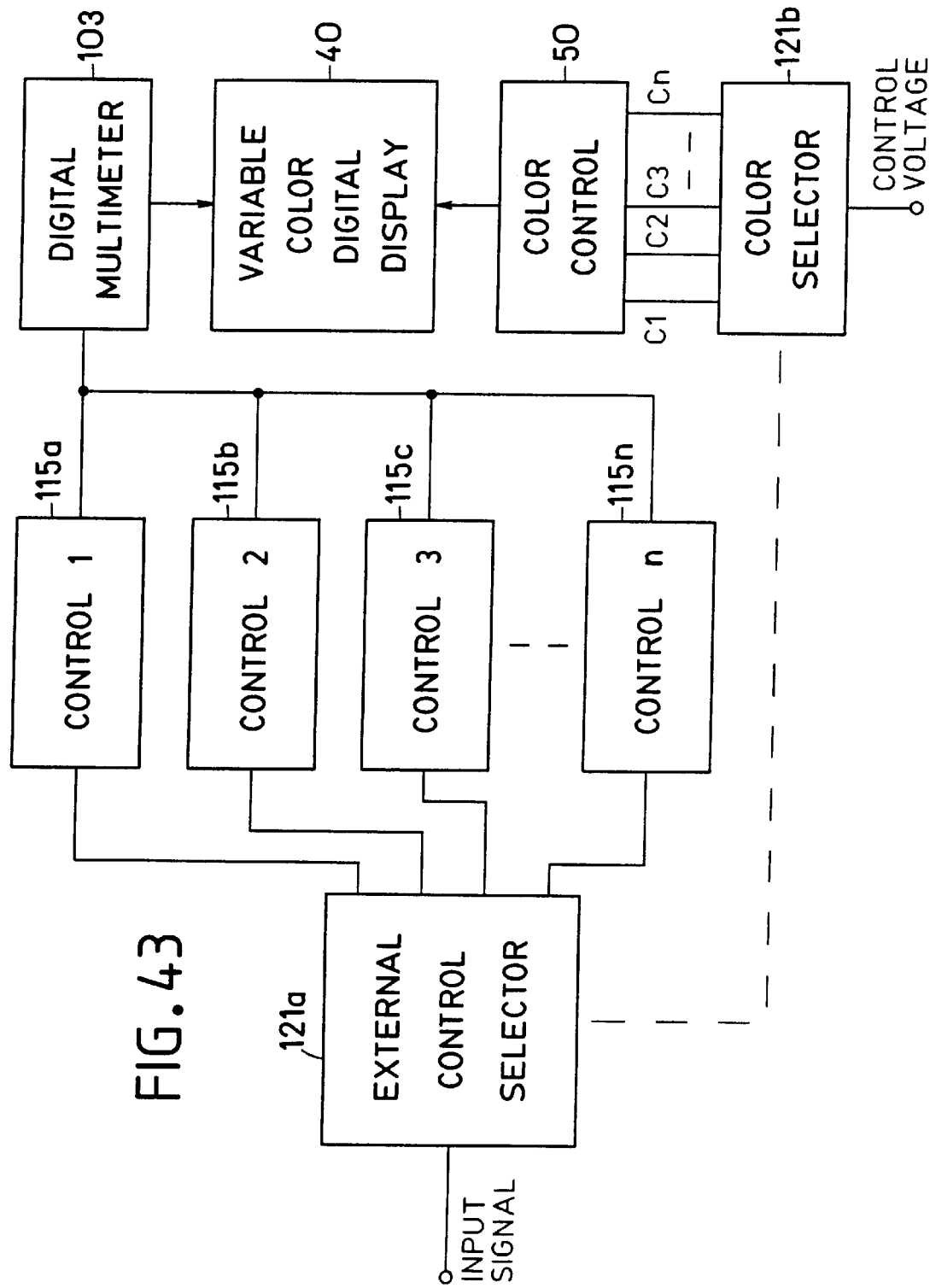
FIG. 43 is a block diagram of a digital multimeter with a display that can change color in accordance with external control.

A digital multimeter shown in a block diagram configuration in FIG. 43 is capable of selectively setting certain of its external controls 115a, 115b, 115c to 115n by an external control selector 121a. The invention resides in the addition of associated color selector 121b for causing variable color digital display 40 to illuminate in a color corresponding to the selected external control 115a, 115b, 115c, or 115n. The measurements performed with different external controls are displayed in respectively different colors. The selectors 121a and 121b may include relays, mechanical switches, electronic and optical elements, devices for executing program of instructions, and the like. The association between selectors 121a and 121b may be, in its simplest form, a direct coupling, whereby selector 121b is always in the same position as selector 121a, or a more sophisticated association in space, time, hardware, and software. The external controls 115a, 115b, 115c to 115n may comprise measurement modes, such are local, remote, 2-wire, and 4-wire; measurement functions, such are DC voltage, AC voltage, DC current, AC current, resistance, capacitance, and inductance; measurement ranges for selectively scaling measured signals, and the like.

Figure 44:
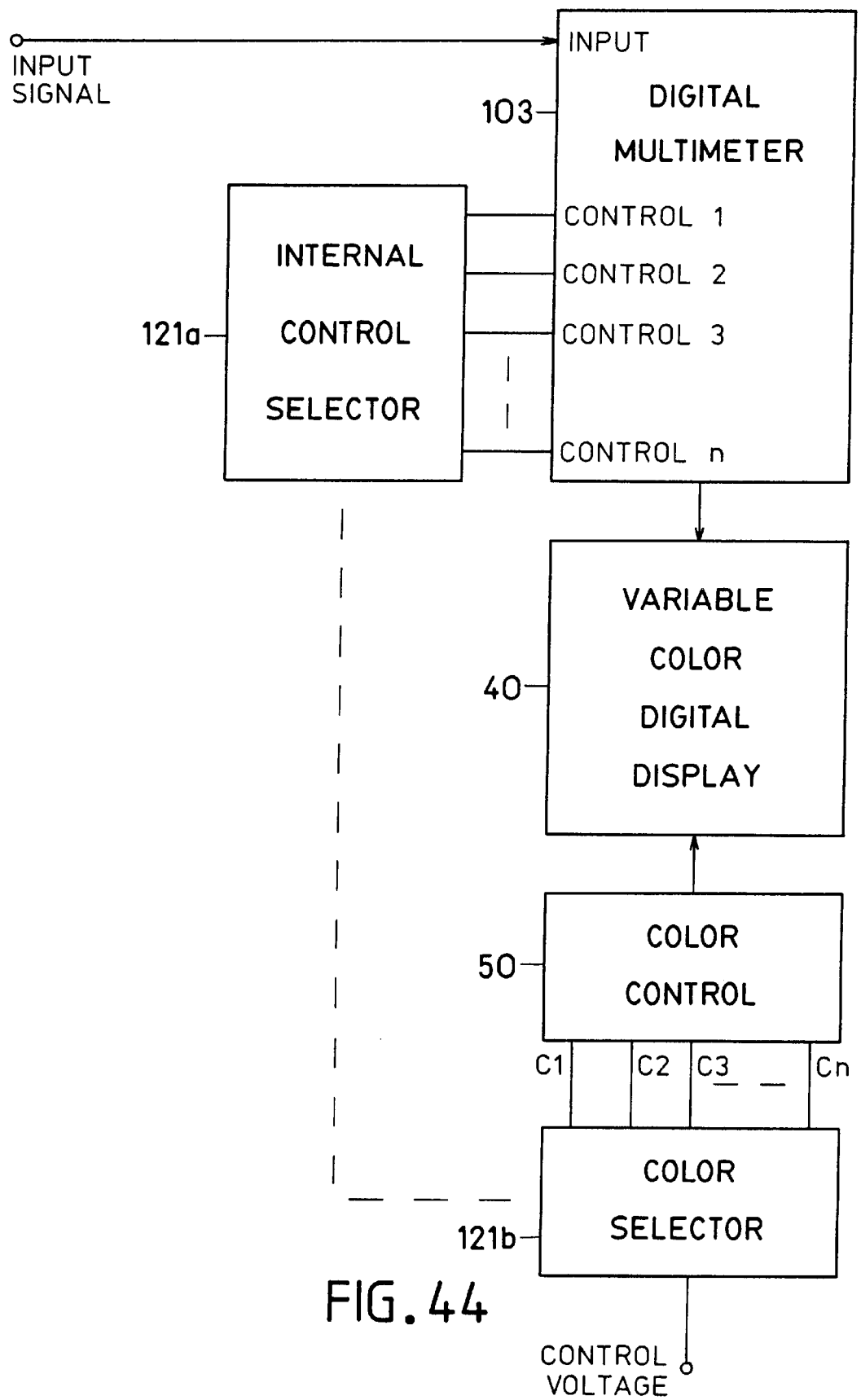
FIG. 44 is a block diagram of a digital multimeter with a display that can change color in accordance with internal control.

In FIG. 44 is shown a block diagram of a like digital multimeter capable of selectively setting certain of its internal measurement controls, referred to as CONTROL 1, CONTROL 2, CONTROL 3 to CONTROL N, by an internal control selector 121a. The associated color selector 121b causes display 40 to illuminate in a color corresponding to the selected internal control, such that the measurements performed with different internal controls are displayed in respectively different colors. The internal controls may comprise measurement modifiers, such are single, continuous, synchronous, and asynchronous triggering, sample rate, filter, offset, external reference, and scaling; measurement methods, units, and the like.

Figure 45:
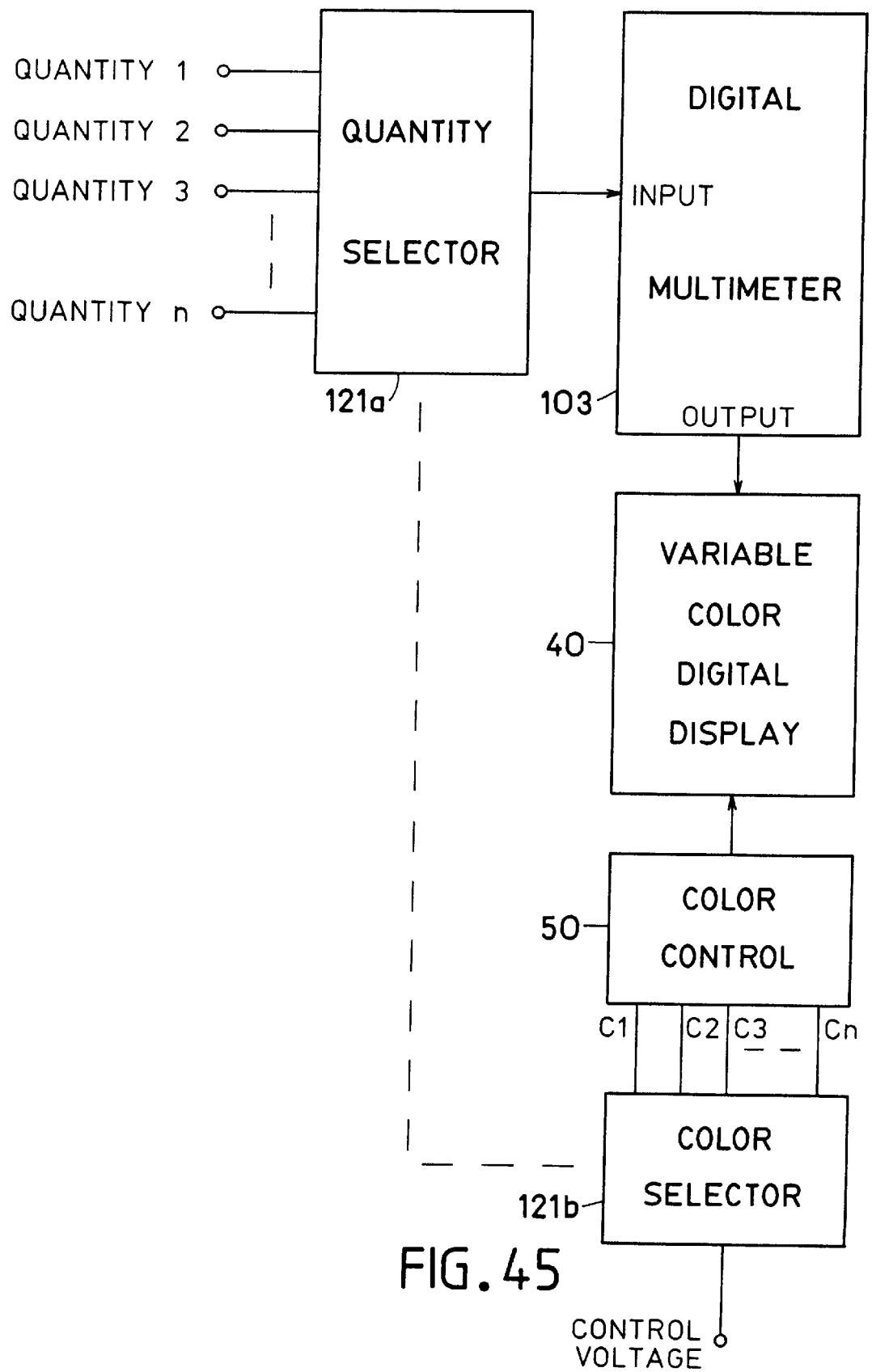
FIG. 45 is a block diagram of a digital multimeter with a display that can change color in accordance with measurement quantity.

FIG. 45 is a block diagram of a digital multimeter with measurement quantity selection. The operation of the multimeter may be explained by the example of setting quantity selector 121a to its second position, thereby selecting QUANTITY 2 to the input of digital multimeter 103.

The associated color selector 121b is also in its second position, thereby applying the control voltage to the input C2 of color control 50, to cause the measured values of QUANTITY 2 to be indicated on display 40 in the color C2. The measurements of different quantities are indicated in respectively different colors.

Figure 46:
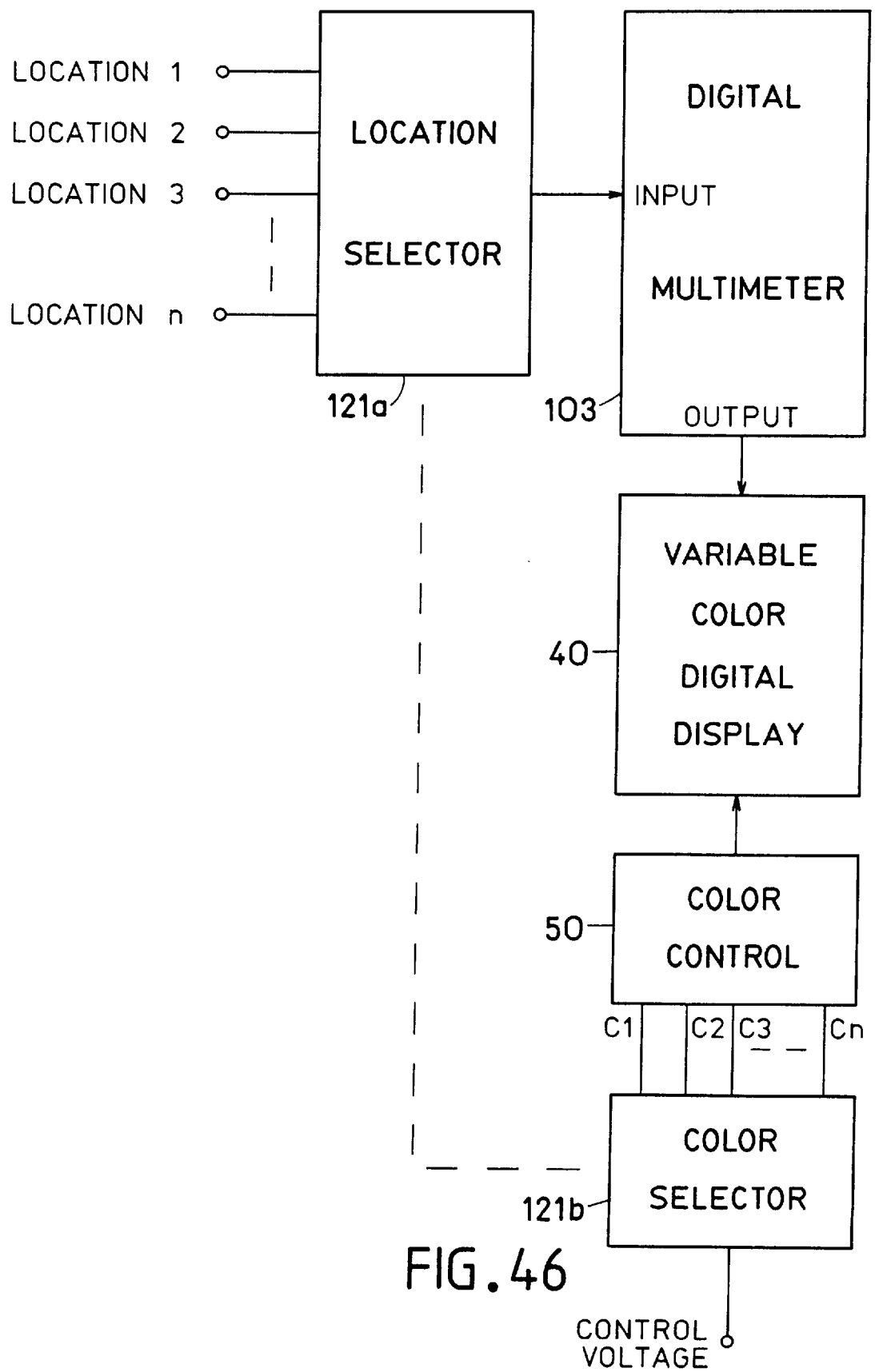
FIG. 46 is a block diagram of a digital multimeter with a display that can change color in accordance with measurement location.

FIG. 46 is a block diagram of a digital multimeter with input location selection. The operation of the multimeter may be explained by the example of setting location selector 121a to its third position, thereby selecting for the input of multimeter 103 signals from LOCATION 3. The associated color selector 121b is also in its third position, thereby applying the control voltage to the input C3 of color control 50, to cause the measured values from LOCATION 3 to be indicated on display 40 in the color C3. The measurements from different locations are indicated in respectively different colors.

Figure 47:
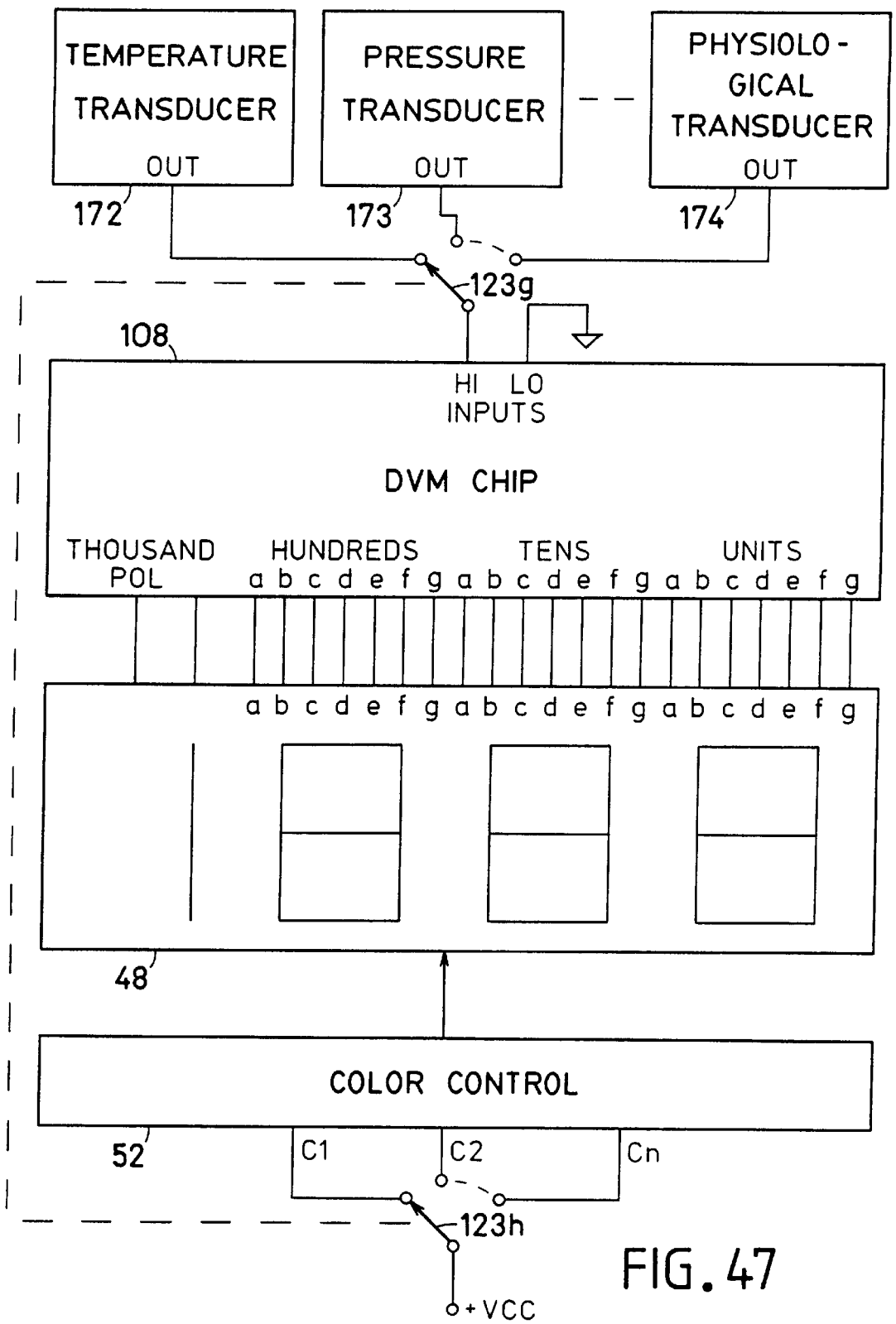
FIG. 47 is a simplified schematic diagram of a variable color digital multimeter for measuring outputs of different transducers.

In FIG. 47 is shown an exemplary simplified schematic diagram of a digital multimeter for selectively measuring values of several different quantities from outputs of a temperature transducer 172, which converts temperature to voltage, pressure transducer 173, which converts atmospheric pressure to voltage, and physiological transducer 174, which converts physiological information to voltage. The term transducer, as used throughout the description of the invention, is used in its widest sense so as to include every type of a device for performing a conversion of one form of energy to another. The principles of the invention may be applied to various displacement, motion, force, pressure, sound, flow, temperature, humidity, weight, magnetic, and physiological transducers, and the like.

When switch 123g is in its first position, thereby selecting temperature transducer 172, digital voltmeter 108 measures the output voltage of transducer 172, which is proportional to ambient temperature, and display 48 indicates the measured temperature in digital format. The associated switch 123h is also in its first position, thereby connecting the control voltage +VCC to the input C1 of color control 52, to cause the display 48 to illuminate in the color C1. When switch 123g is in its second position, thereby selecting pressure transducer 173, display 48 indicates the measured atmospheric pressure in digital format and in the color C2. When switch 123g is in its last position, thereby selecting physiological transducer 174, display 48 indicates the measured physiological information, such as blood pressure, heart beat, and the like, in digital format and in the color Cn. Measured values of different quantities are thus displayed in respectively different colors.

Figure 48:
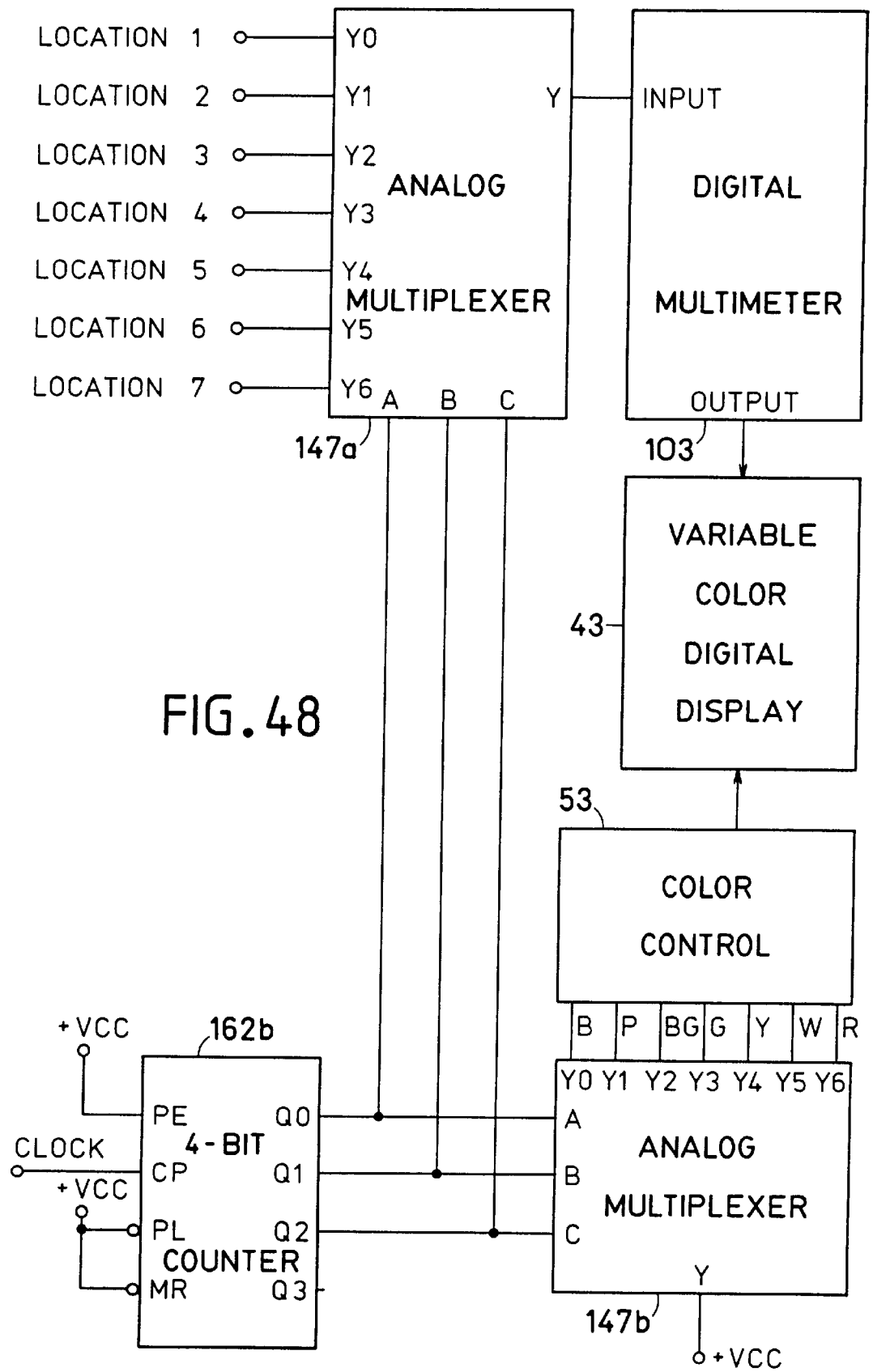
FIG. 48 is a simplified schematic diagram of a variable color digital multimeter for measuring signals from different locations.

In FIG. 48 is shown an exemplary simplified schematic diagram of a digital multimeter capable of measuring signals from seven different locations, designated as LOCATION 1 to LOCATION 7, and of indicating the measured results in seven different colors, respectively. The outputs Q0, Q1, Q2 of a 4-bit binary counter 162b, which may be from time to time incremented by a clock pulse, are connected, in parallel, to the address inputs A, B, C of analog multiplexers 147a and 147b, respectively, to cause analog multiplexer 147a to internally route signals from its selected input, e.g., Y1, to its output Y, and, simultaneously, to apply the control voltage +VCC from the terminal Y of analog multiplexer 147b, via its selected terminal, e.g., Y1, to one of the inputs B, P, BG, G, Y, W, or R of color control 53. The measured signals from the selected location are indicated on display 40 in digital format and in a color unique to the selected location. The indicated color sequences are merely exemplary; it would be obvious to devise other color sequences by differently interconnecting the terminals Y1 to Y7 of analog multiplexer 147b with the inputs B to R of color control 53.

Figure 49:
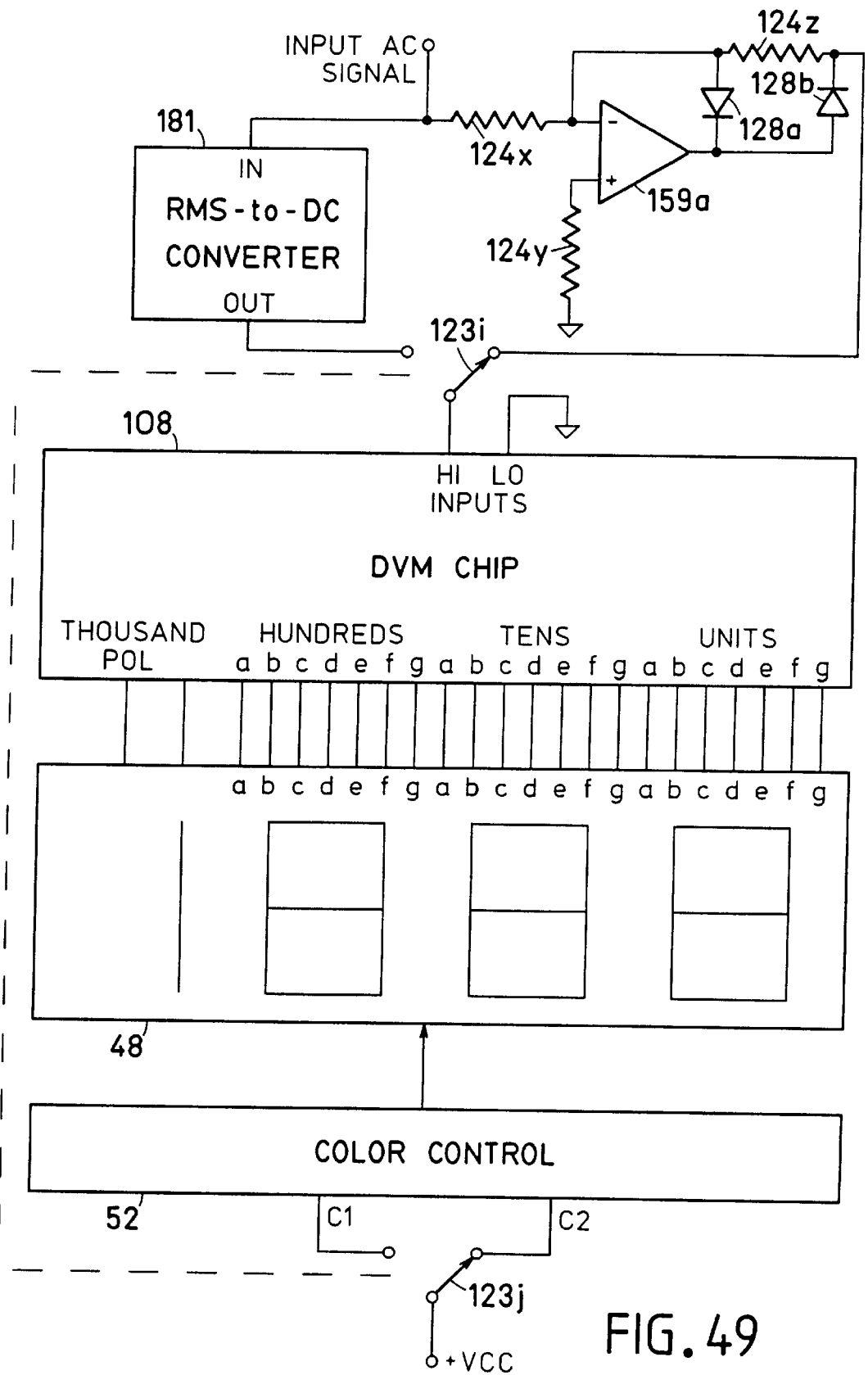
FIG. 49 is a simplified schematic diagram of a variable color digital multimeter for measuring signals by different methods.

In FIG. 49 is shown a simplified schematic diagram of an AC digital voltmeter for selectively measuring an RMS (Root Mean Square) or MAV (Mean Average Value) of a measured waveform. An RMS measurement provides a power content of the measured signal, as will be more fully explained later, for a waveform of any shape. Since the MAV measured value may differ from the RMS value for certain waveform shapes, it would be desirable to know which measurement method is employed. A switch 123i selects either the output of RMS converter 181 or the output of the precision rectifier circuit, consisting of an op amp 159a, resistors 124x, 124y, 124z and diodes 128a, 128b, to the input of digital voltmeter 108. An associated switch 123j selects one of the inputs C1 or C2 of color control 52, in accordance with the selection of the measurement method. The display 48 indicates the magnitude of the measured AC waveform in digital format and in a color unique to the selected measurement method.

Figure 50:
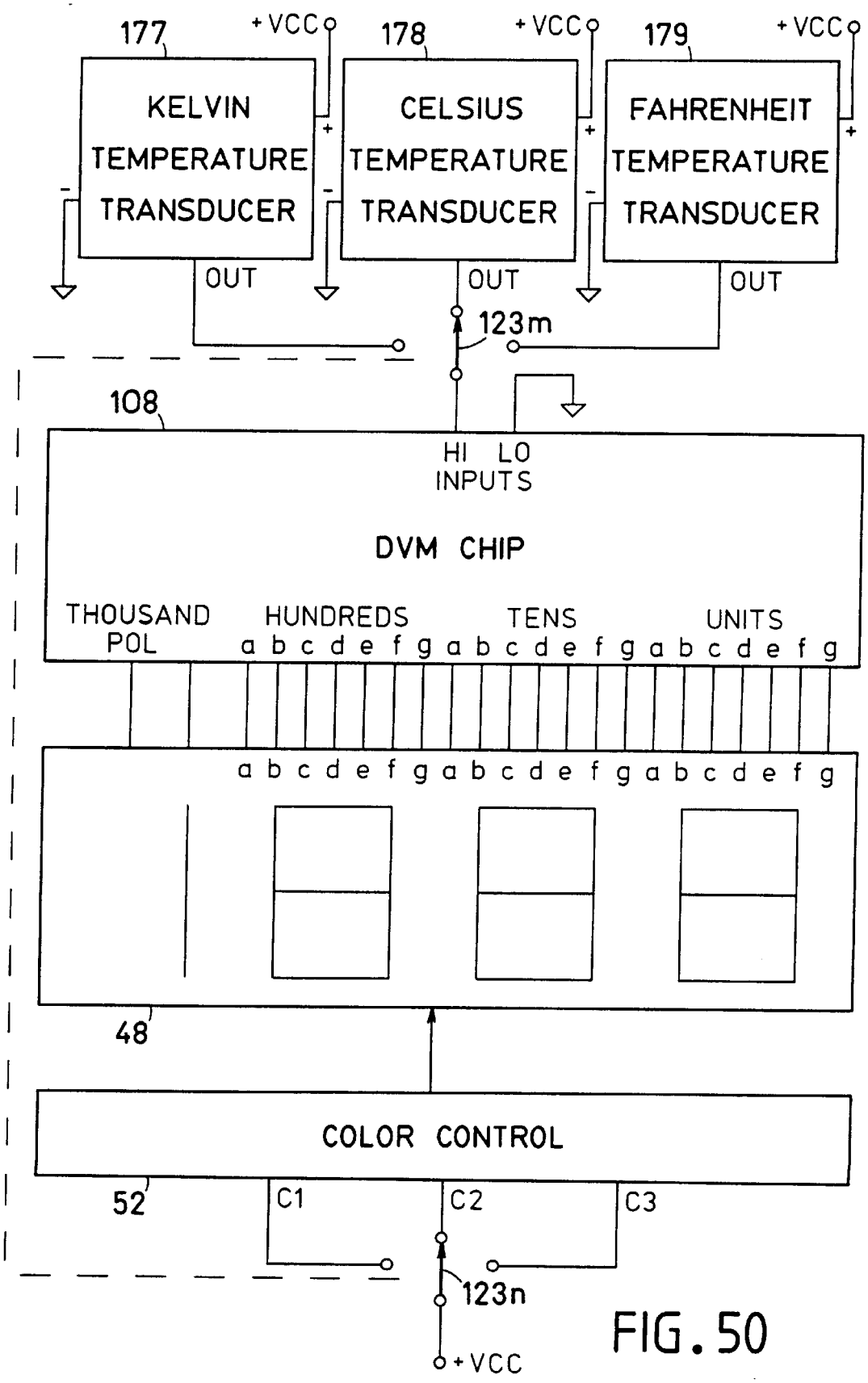
FIG. 50 is a simplified schematic diagram of a variable color digital thermometer.

In FIG. 50 is shown a simplified schematic diagram of a digital thermometer which can selectively measure temperature in the Kelvin, Celsius, or Fahrenheit scale, by connecting the output of one of temperature transducers 177, 178 and 179, via a switch 123m, to the input of digital voltmeter 108. An associated switch 123n applies the control voltage +VCC to one of the inputs C1, C2, and C3 of color control 52, to thereby illuminate display 48 in a color unique to the selected temperature scale. The output voltage of Kelvin temperature transducer 177 is linearly proportional to temperature in the Kelvin scale. The output voltage of like Celsius temperature transducer 178 is linearly proportional to temperature in the Celsius scale. The output voltage of like Fahrenheit temperature transducer 179 is linearly proportional to temperature in the Fahrenheit scale.

Figure 51:
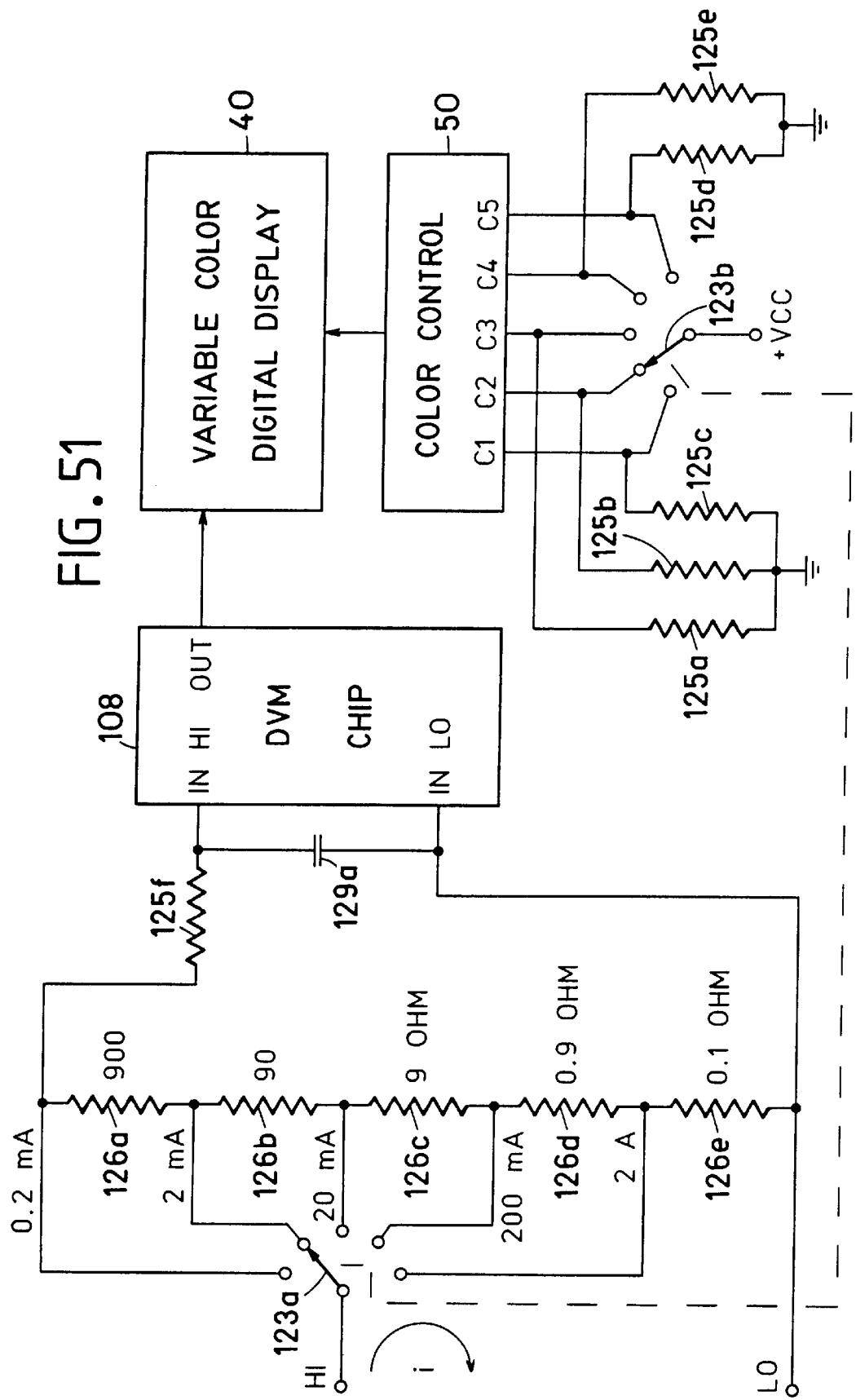
FIG. 51 is a simplified schematic diagram of a digital ampermeter with variable color range indication.

In FIG. 51 is shown a simplified schematic diagram of a digital ampermeter with variable color range indication. The precision shunt resistors 126a, 126b, 126c, 126d, and 126e, connected in series, convert measured current to voltage, which is applied via resistor 125f to the input terminal IN HI of digital voltmeter 108. The current range is selectable by a rotary switch 123a, in a manner well known to those skilled in the art. The invention resides in the addition of a second rotary switch 123b, associated with switch 123a such that both switches are always in the same position, to connect the reference voltage +VCC to the selected input C1, C2, C3, C4, or C5 of color control 50, which are tied to ground via suitable pull down resistors 125a, 125b, 125c, 125d, and 125e, in accordance with the selected current range. By way of an example, display 40 may indicate measured current values on 0.2 mA range in blue color, on 2 mA range in purple color, on 20 mA range in green color, on 200 mA range in yellow color, and on 2 A range in red color.

Figure 52:
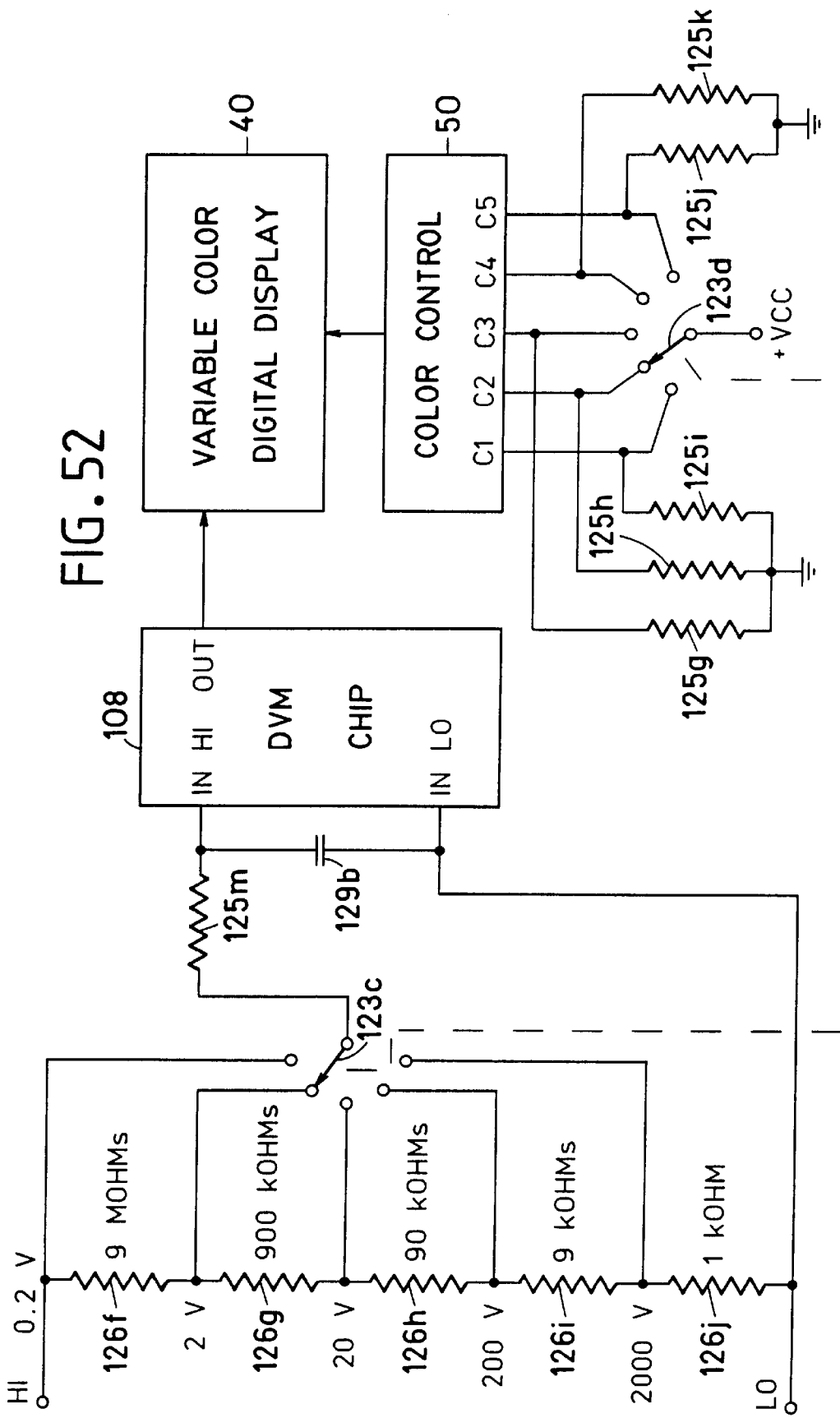
FIG. 52 is a simplified schematic diagram of a digital voltmeter with variable color range indication.

In FIG. 52 is shown a simplified schematic diagram of a digital voltmeter with variable color range indication. The precision voltage attenuating resistors 126f, 126g, 126h, 126i, and 126j are connected in series, and the voltage range is selected by a rotary switch 123c, in a manner well understood by those skilled in the art. The invention resides in the addition of a second rotary switch 123d, associated with switch 123c, to apply the reference voltage +VCC to the selected input C1, C2, C3, C4, or C5 of color control 50. By way of an example, display 40 may indicate measured values on 0.2 V range in white color, on 2 V range in yellow color, on 20 V range in green color, on 200 V range in blue-green color, and on 2000 V range in red color.

Figure 53:
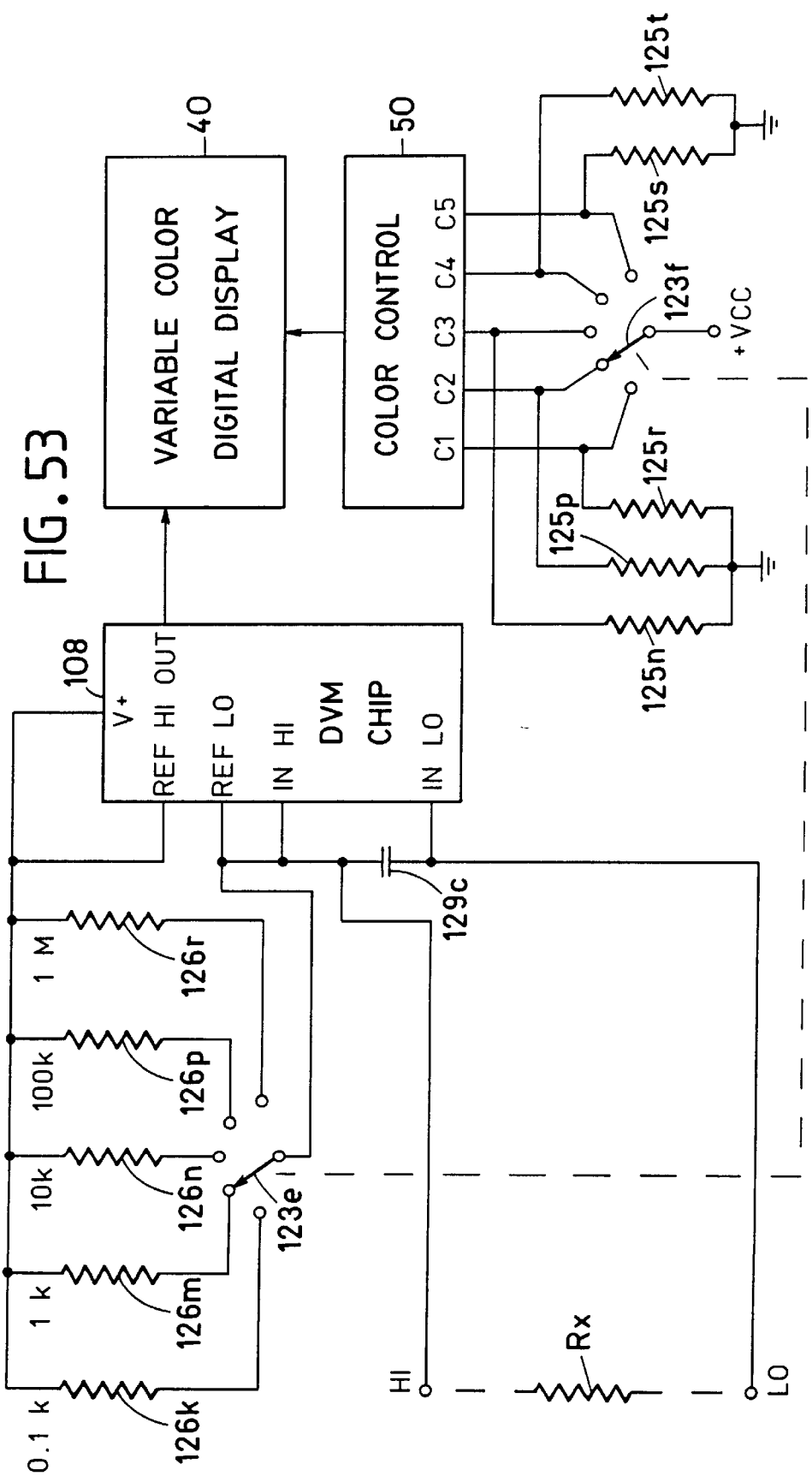
FIG. 53 is a simplified schematic diagram of a digital ohmmeter with variable color range indication.

In FIG. 53 is shown a simplified schematic diagram of a digital ohmmeter with variable color range indication. The precision standard resistors 126k, 126m, 126n, 126p, and 126r, selectable by a rotary range switch 123e, are connected such that the selected one of the standard resistors is in series with the measured resistance Rx, in a well known ratiometric arrangement. The invention resides in the addition of a second switch 123f, associated with switch 123e, to connect the reference voltage +VCC to the selected input C1, C2, C3, C4, or C5 of color control 50, in accordance with the selected resistance range. By way of an example, display 40 may indicate measured resistance values on 0.1 k range in yellow color, on 1 k range in green color, on 10 k range in blue color, on 100 k range in purple color, and on 1 M range in red color.

The examples of range and precision resistor values shown in FIGS. 51, 52, and 53 should be considered merely as exemplary. Although the switches 123 are shown as rotary switches, they may, alternatively, be of any other type, such are pushbutton switches and relay contacts. Another modification envisions that only certain of the display digits may change color in accordance with the measurement range, while the remaining display digits may change color in accordance with a different quantity. It is readily apparent that the principles of the invention may be effectively applied to autoranging multimeters.

Figure 54:
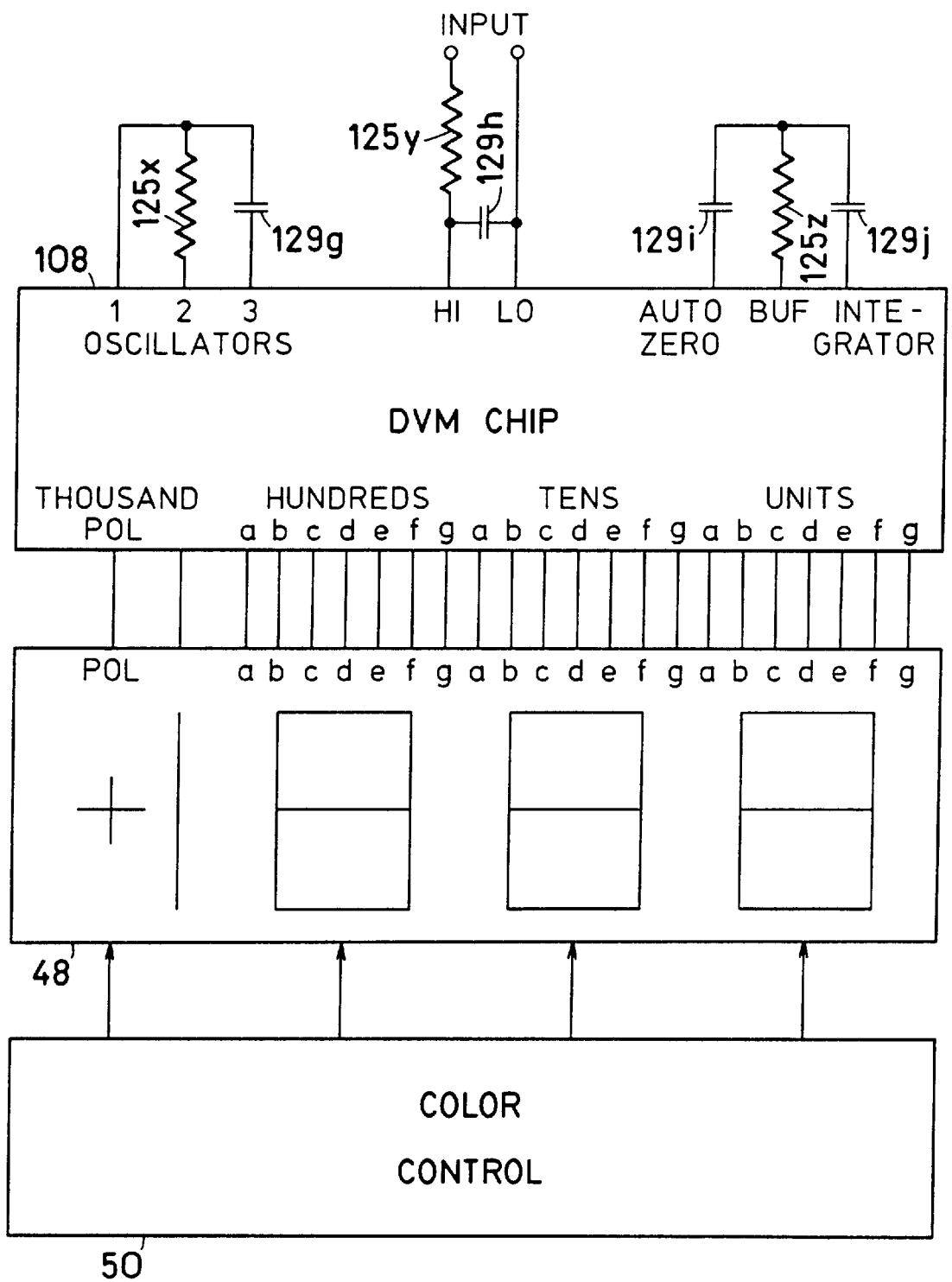
FIG. 54 is a detail of the multimeter shown in FIGS. 51, 52, and 53.

In FIG. 54 is shown a detail of the multimeter of FIGS. 51, 52, and 53 which includes a DVM chip 108 capable of converting an analog voltage applied, via resistor 125y and capacitor 129h, to its inputs HI and LO to signals for directly driving respective segments of a 3½ digit 7-segment variable color display 48. The color control 50 causes display 48 to illuminate in a selected color, as described previously.

Figure 55:
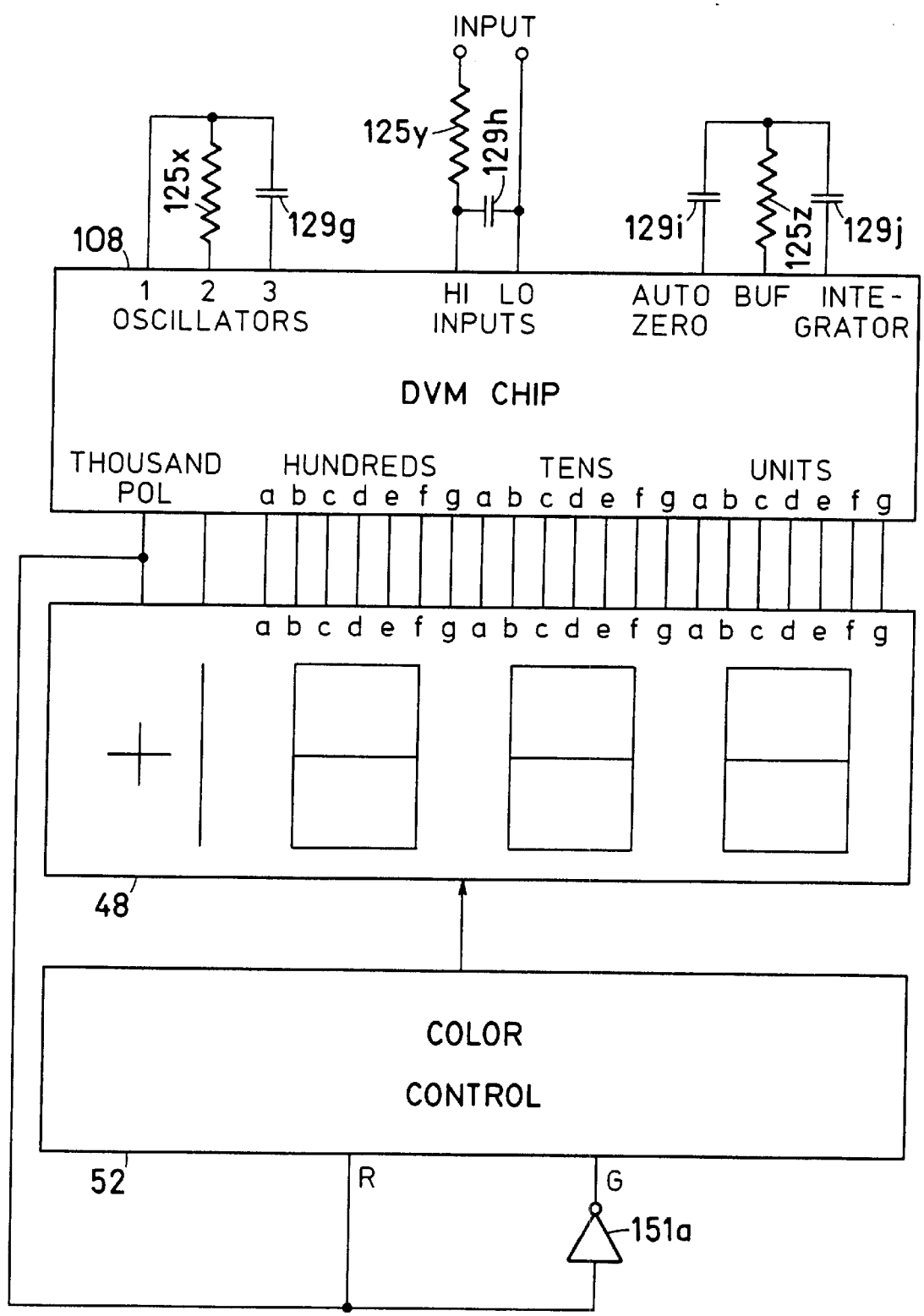
FIG. 55 is a simplified schematic diagram of a digital voltmeter for displaying positive and negative measurement results in respectively different colors.

Commercially known digital multimeters are capable of indicating negative measured results, by displaying a small negative sign at the most significant digit, and positive measured results, usually by not displaying the minus sign. When a series of measurements is performed, it is difficult to distinguish between the positive and negative measurement results displayed on a long character string, particularly when the measurements are performed at a relatively fast rate. In FIG. 55 is shown how this problem may be effectively solved by displaying positive and negative measurement results in respectively different colors on 3½ digit variable color display 48, which is capable of displaying a minus sign by illuminating the segment g in the most significant digit. The polarity output POL of digital voltmeter 108 is directly connected to the input R, and, via inverter 151a, to the input G of color control 52. When the POL output is at a low logic level, to indicate that the displayed number is positive, the minus sign is extinguished. A low logic level at the POL output forces the output of inverter 151a to rise to a high logic level, to activate the input G for causing display 48 to illuminate in green color. When the POL output rises to a high logic level, to indicate that the displayed number is negative, the minus sign is illuminated. A high logic level at the POL output activates the input R for causing display 48 to illuminate in red color. It would be obvious, in the view of the present disclosure, to devise other color combinations.

Figure 56:
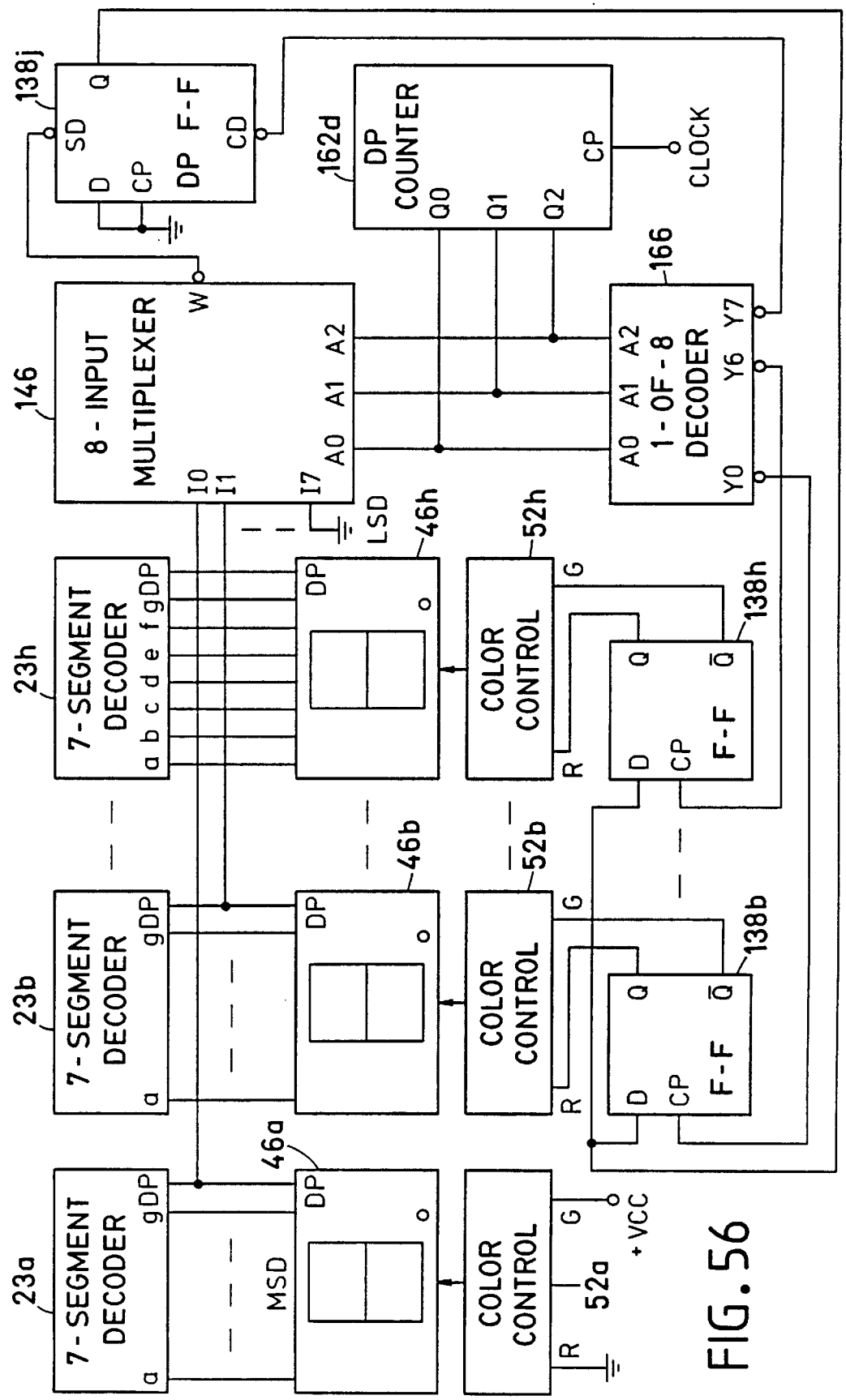
FIG. 56 is a simplified schematic diagram of a variable color display system for displaying decimal numbers such that digits preceding and following the decimal point are displayed in respectively different colors.
Figure 57:
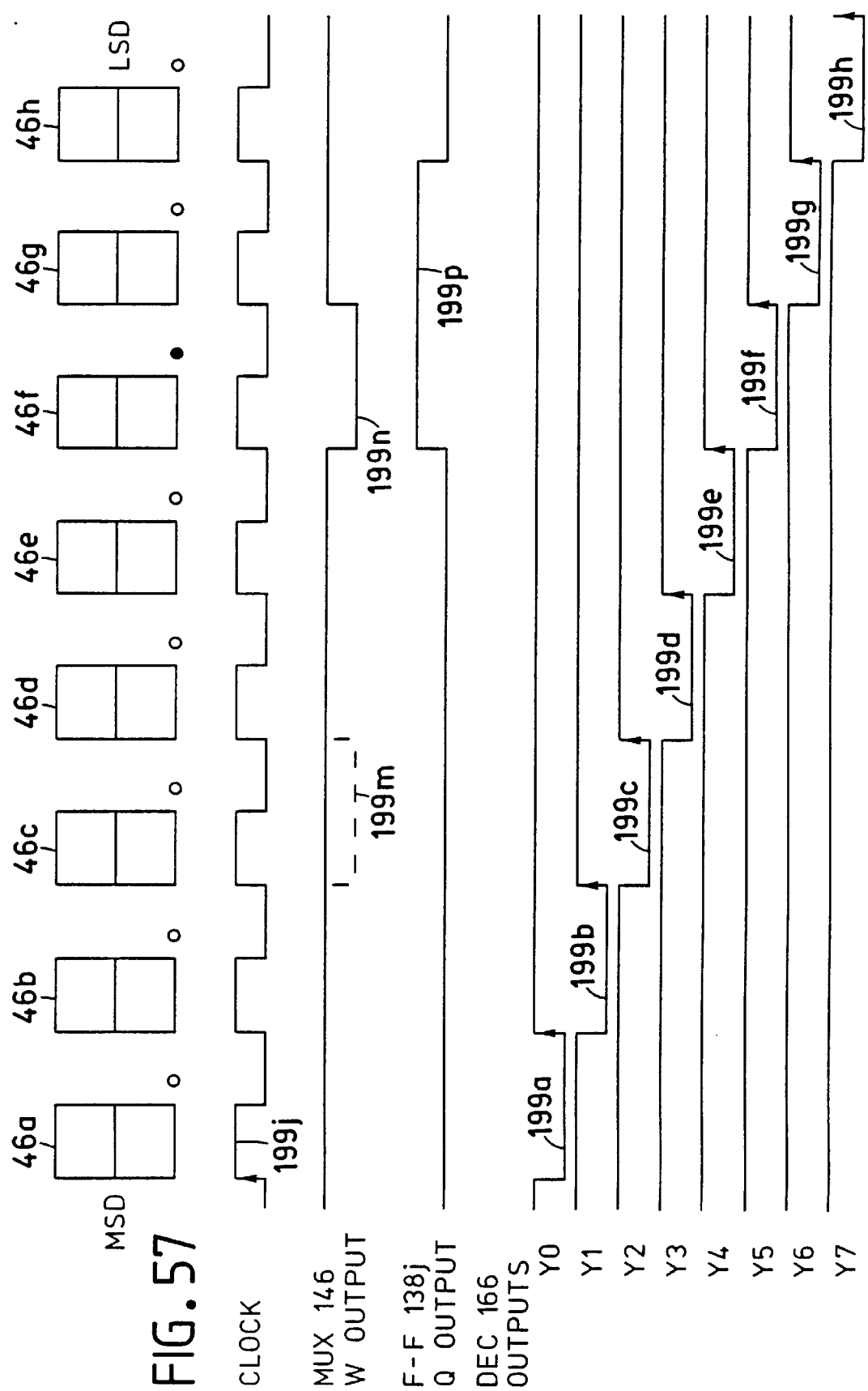
FIG. 57 is a timing diagram of the circuit shown in FIG. 56.

The description of a variable color digital display system shown in FIG. 56, which is capable of emphasizing the position of a decimal point in a string of digits, should be considered together with its accompanying timing diagram shown in FIG. 57. The display system, which in its exemplary embodiment utilizes eight single-digit variable color displays 46a to 46h, of which only displays 46a, 46b, and 46h are shown, is capable of detecting the position of a decimal point in a string of displayed digits and of displaying all digits that precede the decimal point in a first color and all digits that follow the decimal point in a second color. The decimal point outputs DP of common-cathode 7-segment decoders 23a, 23b to 23h, which may receive displayable data in a conventional manner (not shown), are continuously scanned in a sequence by a multiplexer 146 which is incremented by a counter 162d driven by clock 199j of a suitable frequency. When an active high DP output is detected on certain of decoders 23a, 23b to 23h, the inverting output W of multiplexer 146, which is connected to the Set Direct input SD of DP flip-flop 138j, drops to a low logic level 199n, to force the latter to its set condition. The Q output of DP flip-flop 138j, which is connected to the D inputs of all flip-flops 138b to 138h, rises to a high logic level for the remaining time of the scanning cycle, to thereby indicate, as may be best observed in FIG. 57 in the line designated F-F 138*j* Q OUTPUT at waveform 199*p*, the position of the detected decimal point in reference to the scanning cycle. The decoder 166 is incremented synchronously with multiplexer 146, and, as a result, its outputs Y0 to Y7 are sequentially driven to a low logic level, to trigger in a sequence flip-flops 138*b* to 138*h* to states determined by the conditions of their D inputs, respectively, at the time of triggering, as may be best observed in FIG. 57 in the lines designated DEC 166 OUTPUTS Y0 to Y7 at waveforms 199*a* to 199*h*. All flip-flops 138*b* to 138*h*, which were triggered before the decimal point was located during the scanning cycle, are triggered to their reset states, while all remaining flip-flops 138*b* to 138*h*, which were triggered after the decimal point was located, are triggered to their set states. The Y7 output of decoder 166 is connected to the Clear Direct input CD of DP flip-flop 138*j*, to force the latter to its reset condition at the end of each scanning cycle. The outputs Q and $\overline{Q}$ of flip-flops 138*b* to 138*h* are respectively connected to color control inputs R and G of color controls 52*b* to 52*h*, to thereby cause all display digits 46*b* to 46*h* that precede the instant decimal point to be illuminated in green color, and all remaining display digits 46*b* to 46*h* that follow the decimal point to be illuminated in red color. It would be obvious that other color combinations may be devised.

Figure 58:
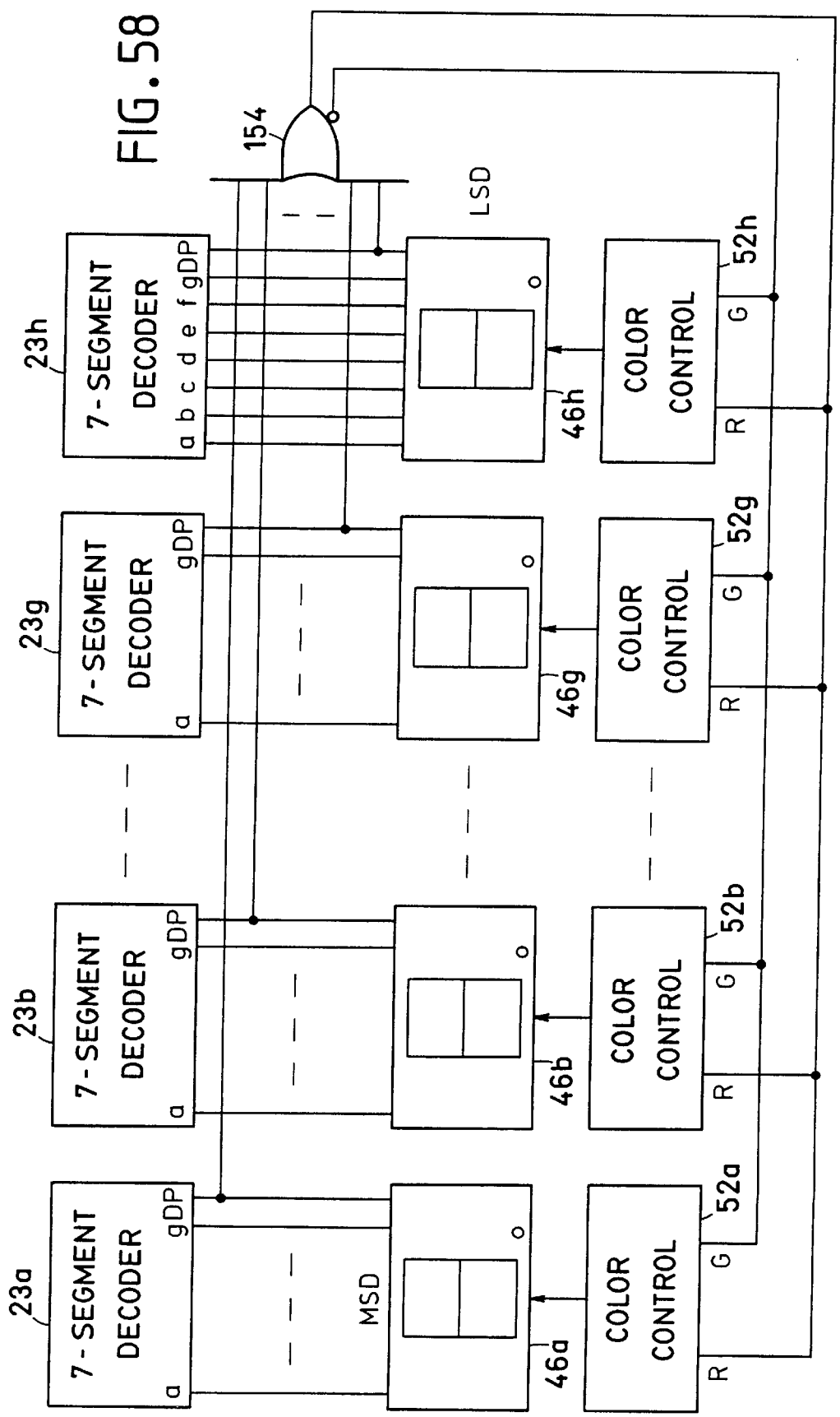
FIG. 58 is a simplified schematic diagram of a variable color display system for displaying integers and decimal numbers in respectively different colors.

The display system shown in FIG. 58 is capable of detecting the presence or absence of a decimal point in the displayed digital string, and accordingly of displaying digital strings with decimal point (decimal numbers) in a first color, and digital strings without decimal point (integers) in a different color. The Decimal Point outputs DP of all common-cathode 7-segment decoders 23*a*, 23*b* to 23*g*, 23*h* are respectively connected to the inputs of an OR gate 154. When a decimal point is present in the displayed digital string, the appropriate DP output rises to a high logic level, thereby forcing the non-inverting output of OR gate 154, which is connected to interconnected color control inputs R of all color controls 52*a*, 52*b* to 52*g*, 52*h*, to rise to a high logic level, to thereby cause all displays 46*a*, 46*b* to 46*g*, 46*h* to illuminate in red color. When no decimal point is detected in the displayed digital string, the inverting output of OR gate 154, which is connected to interconnected color control inputs G of all color controls 52*a*, 52*b* to 52*g*, 52*h*, rises to a high logic level, to thereby cause all displays 46*a*, 46*b* to 46*g*, 46*h* to illuminate in green color.

Figure 59:
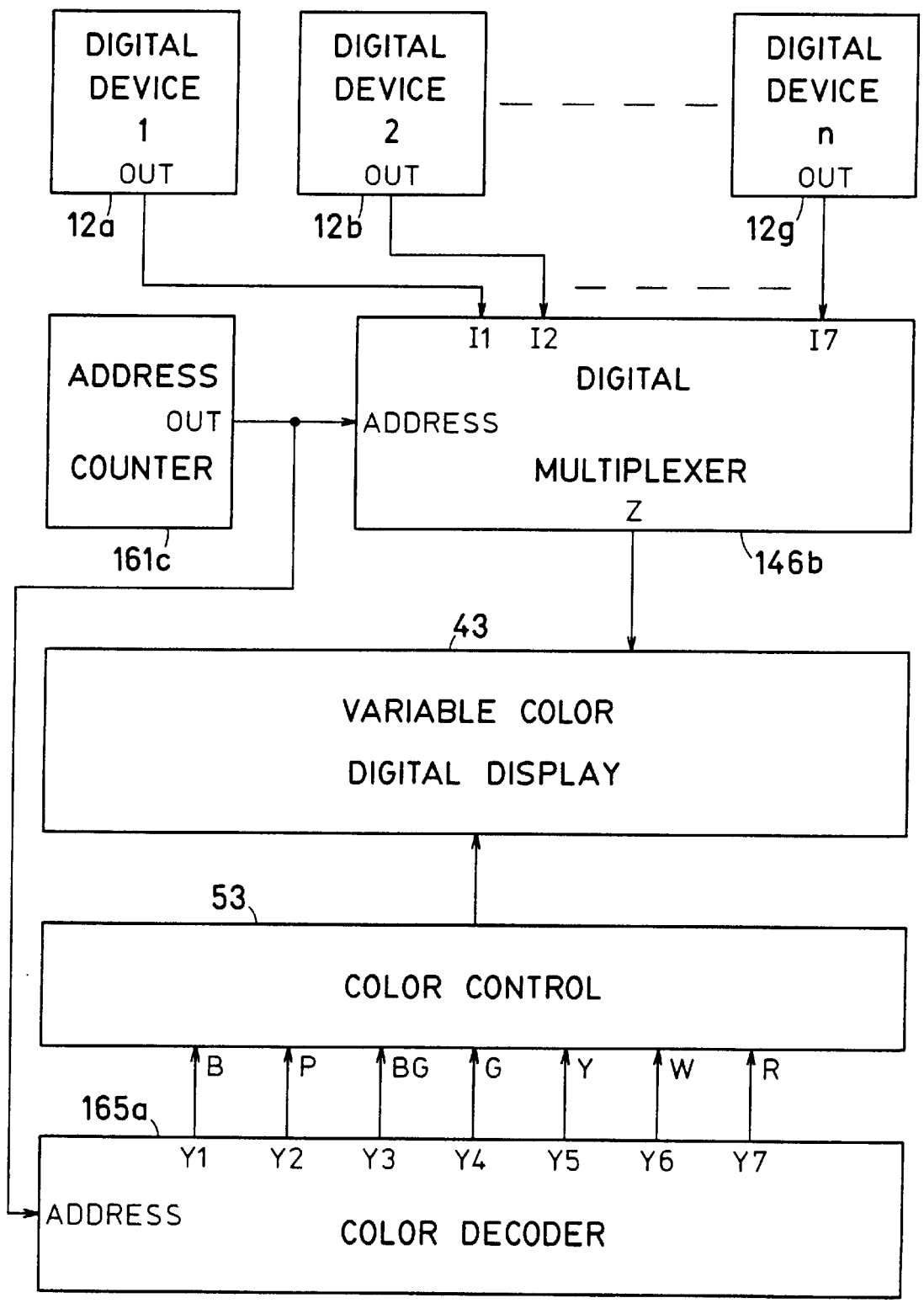
FIG. 59 is a block diagram of a variable color display device for selectively displaying output digital data from different digital devices in respectively different colors.

In FIG. 59 is shown a block diagram of a variable color digital display system for selectively indicating output values of seven digital devices 12*a*, 12*b* to 12*g* in digital format and in respectively different colors. The outputs of digital devices 12*a*, 12*b* to 12*g* are respectively connected to the inputs I1 to I7 of a digital multiplexer 146*b*, which is addressed by address counter 161*c*. Displayable digital data are routed from one of the inputs of digital multiplexer 146*b*, selected by the instant output code of address counter 161*c*, to its output Z and to variable color digital display 43, to be displayed thereon in digital format. The address counter 161*c* simultaneously addresses color decoder 165*a*, to activate one of seven inputs B, P, BG, G, Y, W, or R of color control 53, in accordance with the selected input of digital multiplexer 146*b*. By way of an example, when the output code 010 (binary) of address counter 161*c* is applied to the address inputs of digital multiplexer 146*b*, the input I2 is selected, and data from digital device 12*b* are indicated on display 43 in digital format. Simultaneously, the output code of counter 161*c* causes the output Y2 of color decoder 165*a* to be active, thereby activating the input P of color control 53 for causing display 43 to illuminate in purple color. Digital devices 12*a*, 12*b* to 12*g* may include certain of those disclosed earlier.

Figure 60:
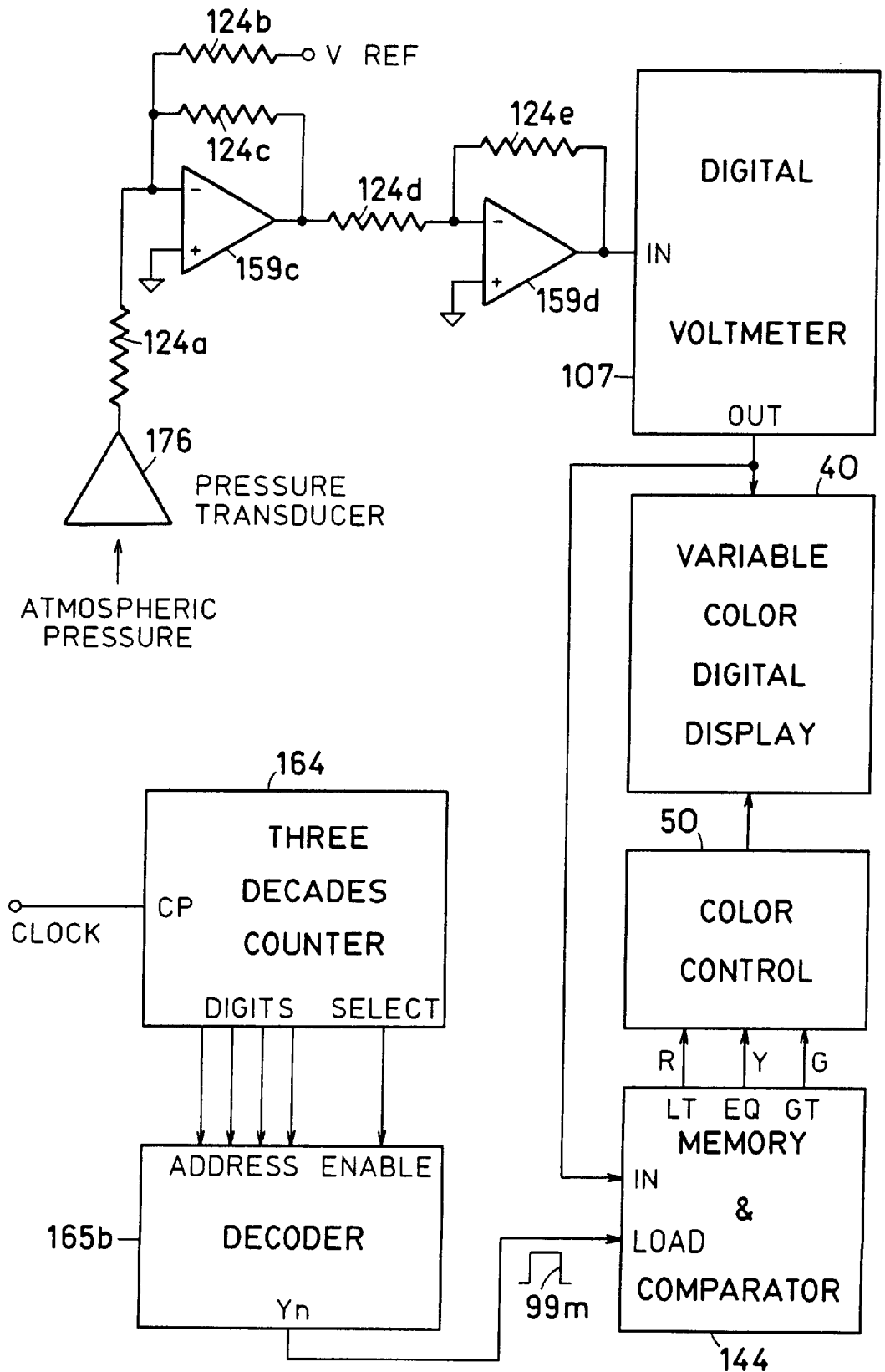
FIG. 60 is a simplified schematic diagram of a variable color digital barometer.

In FIG. 60 is shown an expanded block diagram of a variable color digital barometer with memory, for indicating measured values of atmospheric pressure in digital format and in a color depending on previous measured values. A scaling circuit consisting of op amps 159*c*, 159*d* and resistors 124*a*, 124*b*, 124*c*, 124*d*, 124*e* shifts and scales output voltage of a pressure transducer 176, which is linearly proportional to atmospheric pressure, such that voltage at the input of digital voltmeter 107 directly corresponds to the atmospheric pressure, either in milibars or in mm Hg, depending on the values of resistor 124*e* and V REF voltage. The digital voltmeter 107 converts the instant analog voltage at its input to a digital code which is simultaneously applied to variable color digital display 40, to be indicated thereon in digital format, and to the data input of a combined memory and comparator 144, to be stored therein from time to time. The invention resides in the addition of color control 50 for illuminating display 40 in a color depending on the result of comparison between the instant measured value of atmospheric pressure and previously stored one, to thereby indicate whether the atmospheric pressure is either rising, or falling, or remains unchanged. A three decades counter 164, or other suitable device for keeping time, is incremented in regular intervals by a clock, and its DIGITS outputs indicate the instant count. A decoder 165*b* has its ADDRESS inputs connected, in a rather simplified manner, to the counter's DIGITS outputs and utilizes the counter's SELECT output as a strobe. As a result of continuous counting, at regular time intervals there will appear relatively short pulses 99 m at the selected output Yn of decoder 165*b*, which is connected to the LOAD input of memory and comparator 144, to load the instant output data of digital voltmeter 107 into memory 144. The comparator 144 effects a comparison of the data currently stored in its memory with the instant output data of digital voltmeter 107 and accordingly develops output signals LT (Less Than), EQ (Equal), and GT (Greater Than). The comparator's outputs LT, EQ, GT are respectively connected to the inputs R, Y, and G of color control 50, to cause display 40 to illuminate in red color when the comparator's output LT is active (atmospheric pressure is falling), in yellow color when the output EQ is active (atmospheric pressure is unchanged), and in green color when the output GT is active (atmospheric pressure is rising). The above description may serve as a background for consideration of more sophisticated barometric systems capable of comparing instant measured values with values PIE obtained by virtue of arithmetic and logic operations, such are average or peak values of previous measurements, and of displaying measured values in a variety of colors depending on the rate of increase or decrease of measured values.

Figure 61:
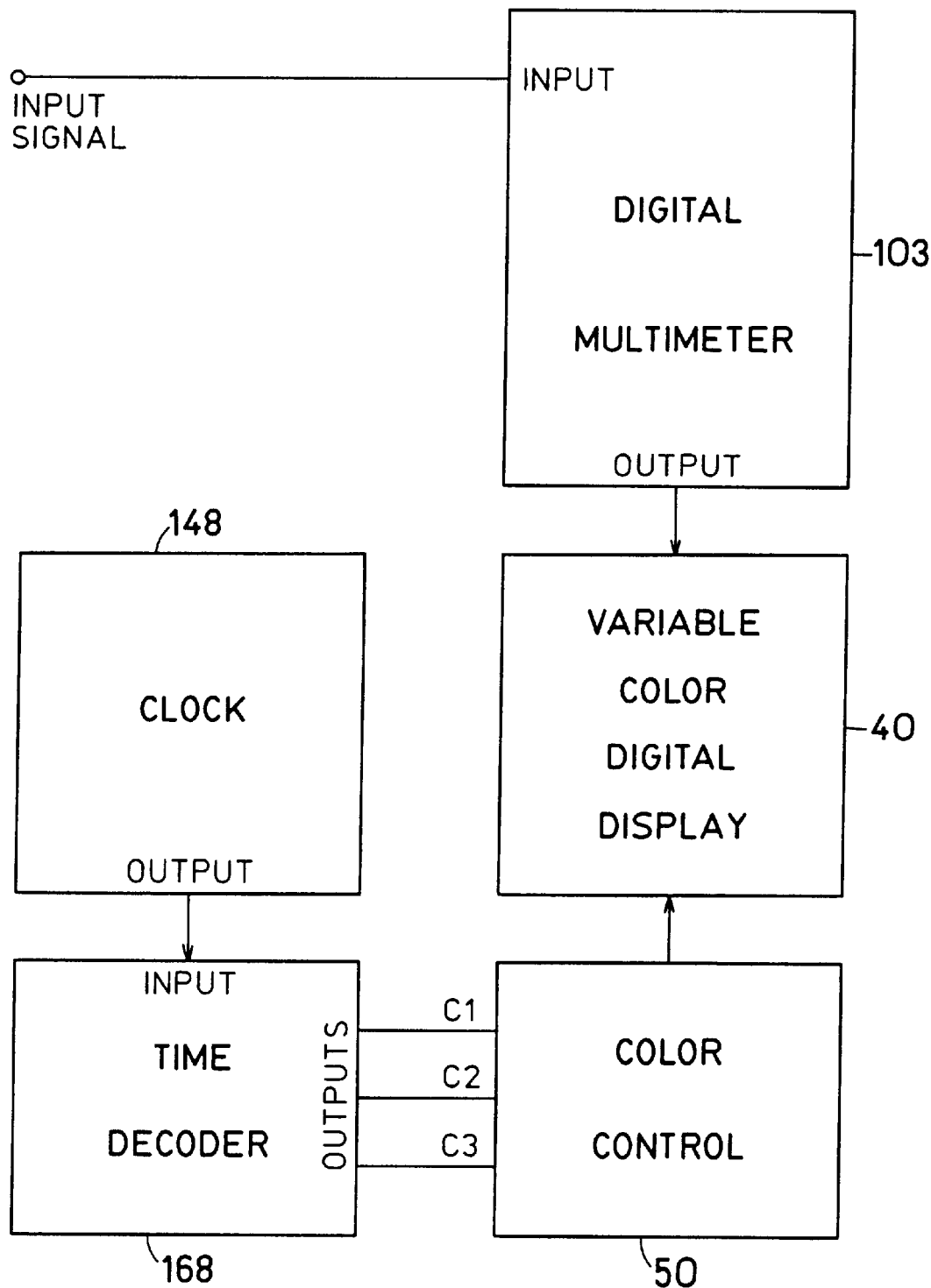
FIG. 61 is a simplified schematic diagram of a digital multimeter for displaying measurement results in accordance with time.

In FIG. 61 is shown a block diagram of a digital multimeter 103, for making series of measurements, in combination with a clock 148, for keeping time. The time signals developed by clock 148 are decoded by a suitable time decoder 168 and converted to color control signals C1, C2 and C3. Values measured by multimeter 103 are indicated on display 40 in digital format and in a color having relation to time.

Figure 62:
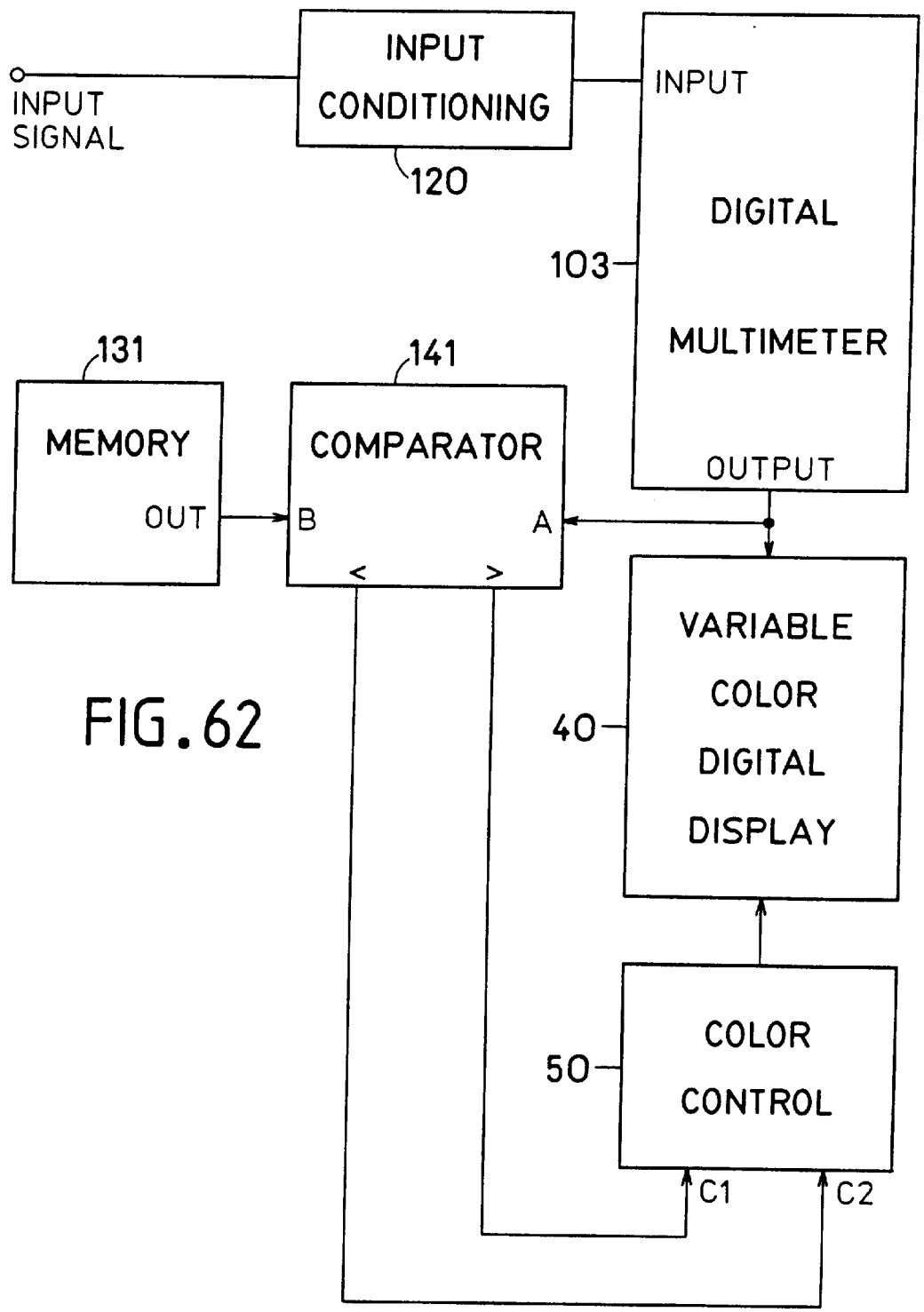
FIG. 62 is a block diagram of a variable color digital multimeter with comparator and memory.

FIG. 62 is a block diagram of a multimeter which includes a memory 131, containing a reference measured value, and a comparator 141. Measured values of input signal, which is applied to an input conditioning circuit 120, wherein it may be switched, scaled, attenuated, rectified, and filtered (not shown), are compared with the reference value stored in memory 131 and indicated on display 40 in digital format and in a color depending on the relationship between the measured value and the reference one. The memory 131 may include electronic storage elements, such are flip-flops, latches, RAMs, ROMs, and the like, or mechanical storage elements, such are binary switches and the like. When the instant measured value is less than the reference value, the output '<' of comparator 141 is active, thereby activating the input C2 of color control 50 for causing display 40 to illuminate in the color C2. When the instant measured value is greater than the reference one, the output '>' of comparator 141 is active, and the measured value is displayed on display 40 in the color C1. Alternatively, the instant measured value may be displayed in a color indicating its deviation, absolute or relative, from the reference value.

Figure 63:
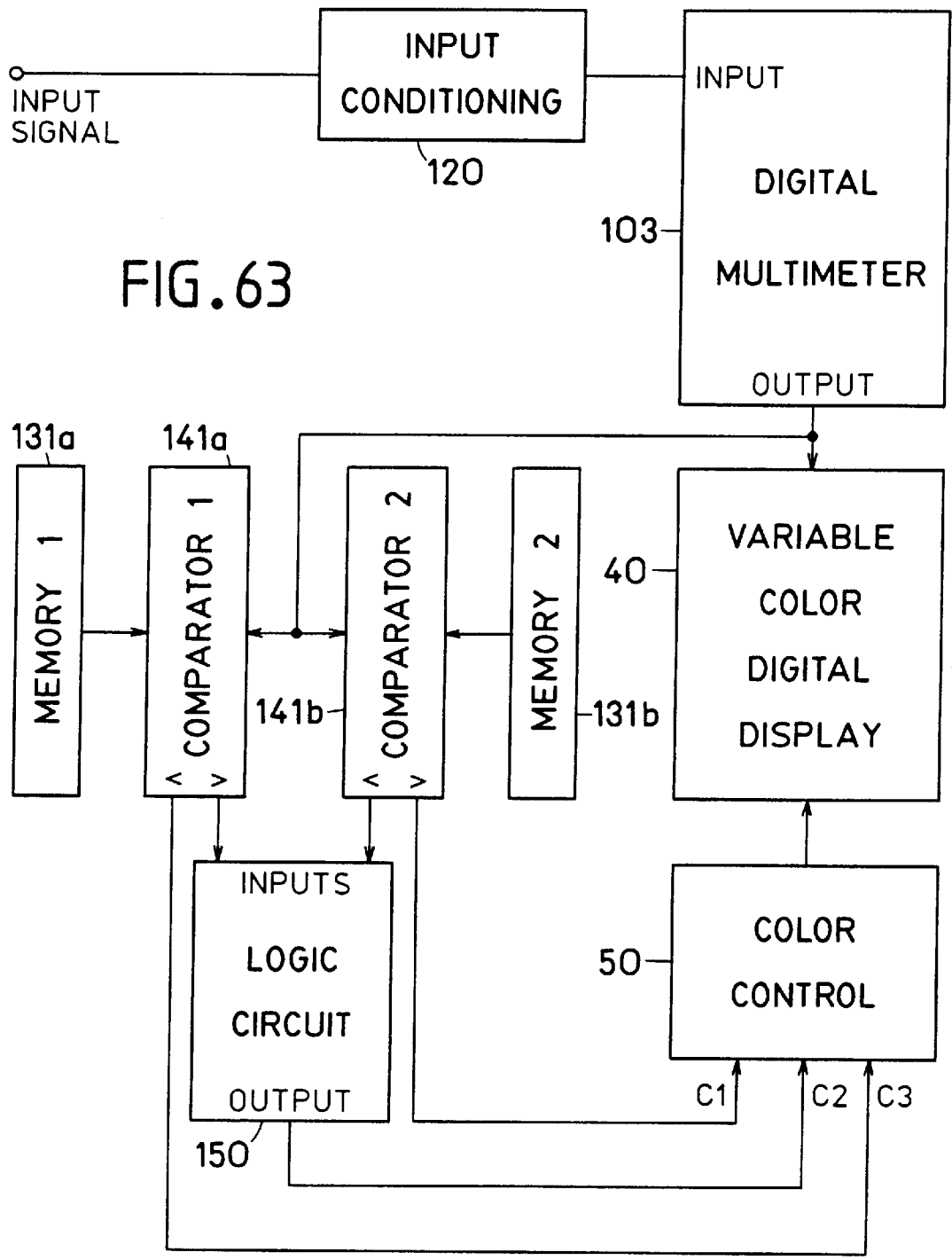
FIG. 63 is a block diagram of a variable color digital multimeter with comparator and memory for high and low limits.

FIG. 63 is a block diagram of a multimeter which includes a memory 131 a for storing a low measurement limit, memory 131b for storing a high measurement limit, and comparators 141a, 141b. The measured values are compared with the high and low measurement limits and are indicated on display 40 in digital format and in a color depending on the relationship between the measured value and the low and high measurement limits. When the measured value is lower than the low measurement limit, stored in memory 131a, the output '<' of comparator 141a is active, thereby activating the input C3 of color control 50 for causing display 40 to illuminate in the color C3. When the measurement value is higher that the high measurement limit, stored in memory 131b, the output '>' of comparator 141b is active, thereby activating the input C1 of color control 50 for causing display 40 to illuminate in the color C1. When the measured value is higher than the low measurement limit and lower than the high measurement limit, the active outputs '>' of comparator 141a and '<' of comparator 141b are combined in a logic fashion by a logic circuit 150, thereby activating the input C2 of color control 50 for causing display 40 to illuminate in the color C2.

Figure 64:
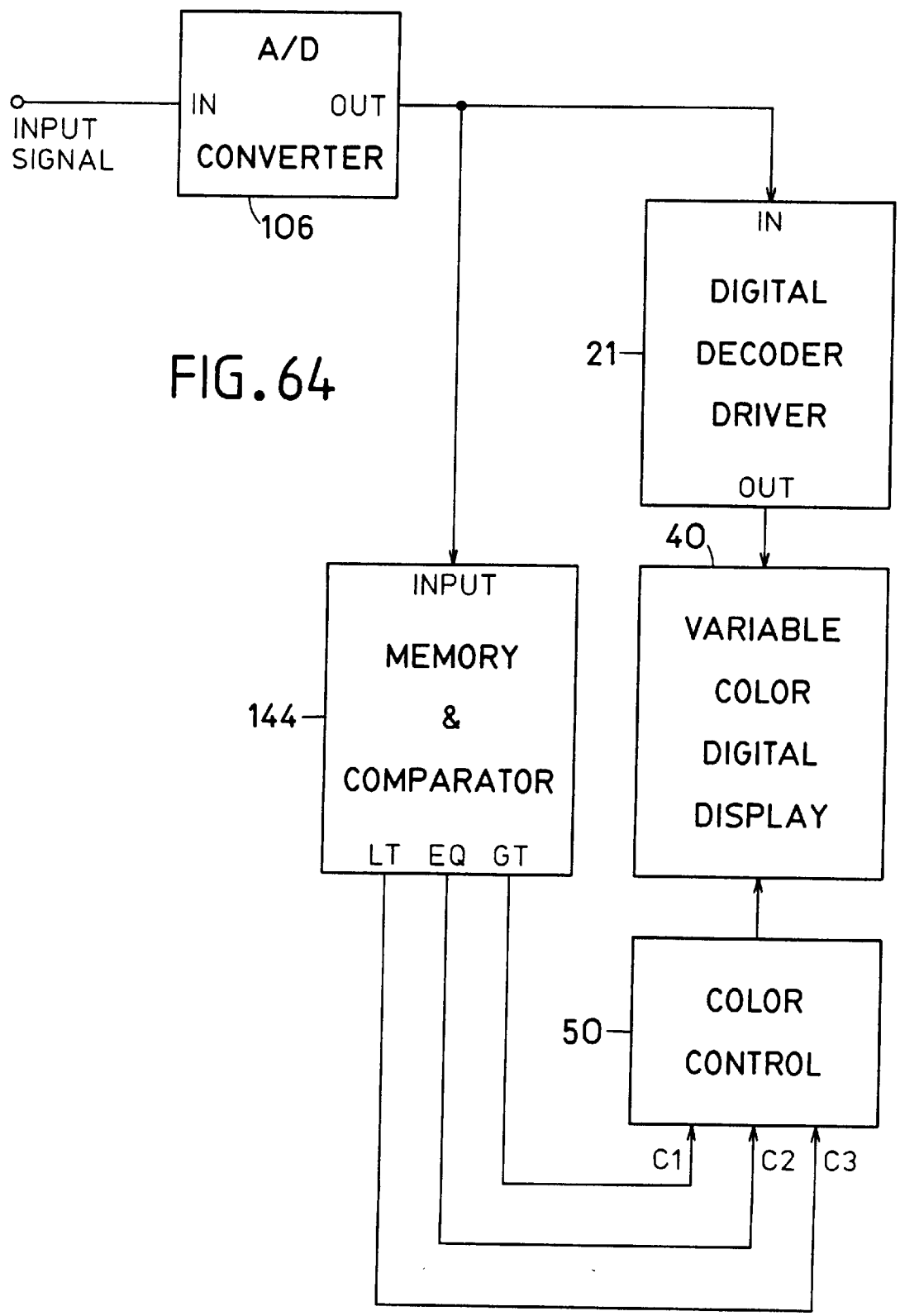
FIG. 64 is a block diagram of a variable color digital multimeter with comparator and memory for previous measurement values.

FIG. 64 is a block diagram of a multimeter for making repeated measurements, which includes an A/D converter 106 and combined memory and comparator circuit 144. The instant measured value of an input signal, converted to digital format by A/D converter 106, may be from time to time stored in memory and comparator 144, so that subsequent measurements could be compared with the stored values. The instant measured value is displayed on display 40 in digital format and in a color depending on the result of comparison with the value stored in memory and comparator 144. When the instant measured value is less than that stored in memory and comparator 144, its output LT (Less Than) is active, thereby activating the input C3 of color control 50 for causing display 40 to exhibit the measured value in the color C3. When the instant measured value is equal to that stored in memory and comparator 144, its output EQ (Equal) is active, thereby activating the input C2 of color control 50 for causing display 40 to exhibit the measured value in the color C2. When the instant measured value is greater than that stored in memory and comparator 144, its output GT (Greater Than) is active, thereby activating the input C1 of color control 50 for causing display 40 to exhibit the measured value in the color C1.

Figure 65:
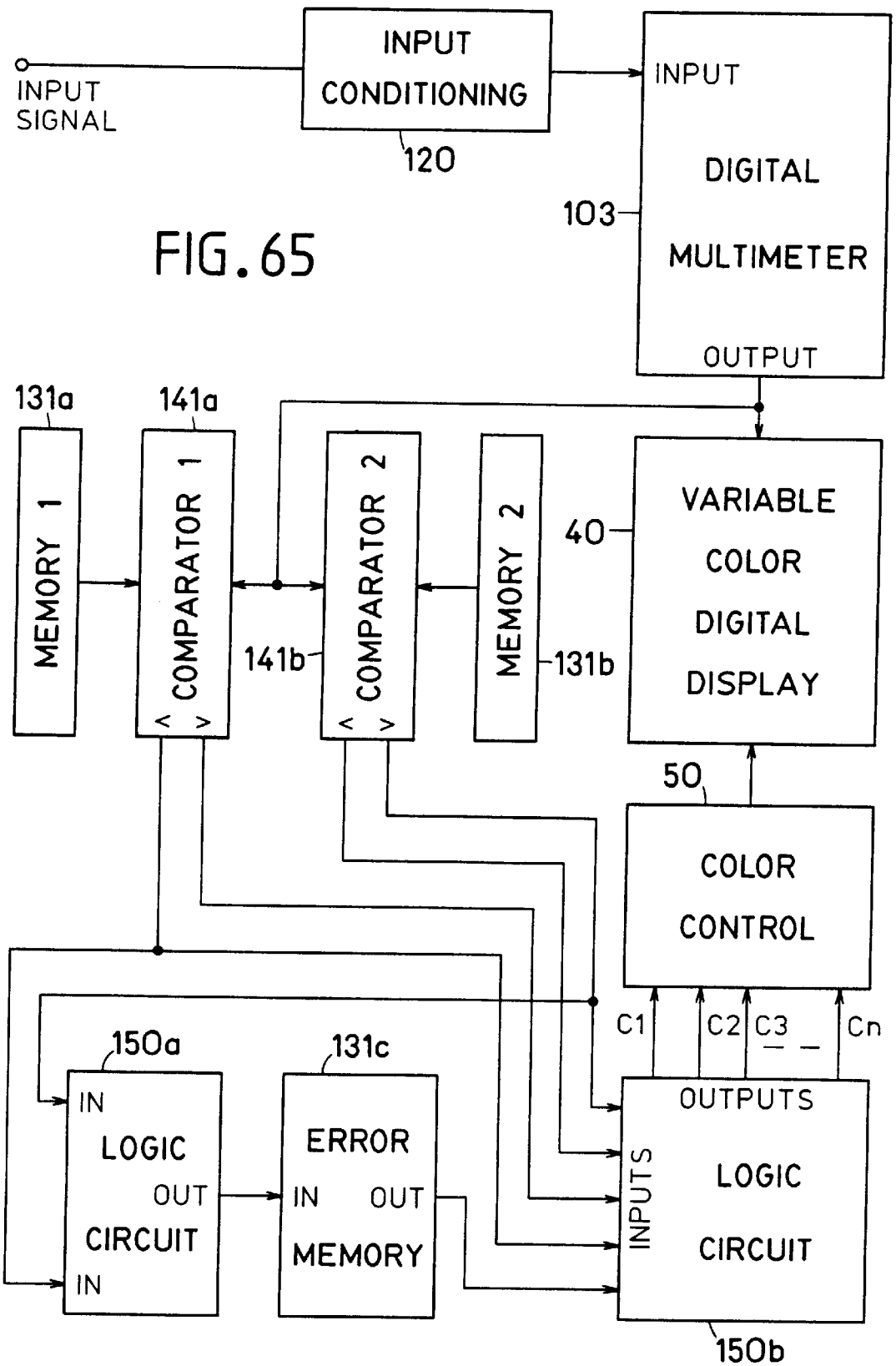
FIG. 65 is a block diagram of a variable color digital multimeter with memory for previous measurement errors.

FIG. 65 is a block diagram of a multimeter for making a series of measurements and for comparing each measured value, by comparators 141a and 141b, with low and high measurement limits stored in memories 131a and 131b, respectively. An additional error memory 131c, which may include an error counter, and logic circuit 150a are provided for storing the number of measurement errors. The instant measured value is indicated on display 40 in digital format and in a color depending, firstly, on its relationship with the applicable low and high measurement limits, and, secondly, on the number of previous measurement errors. Various kinds of decisions may be made, by a logic circuit 150b, based on the contents of error memory 131c. The decisions may be as simple as merely display measurement results in the color C1 for no previous measurement errors and in the color C2 for some previous errors, or may involve sophisticated color selections based on the number of previous errors and total number of measurements, arrived at by virtue of arithmetic and logic operations.

Figure 66:
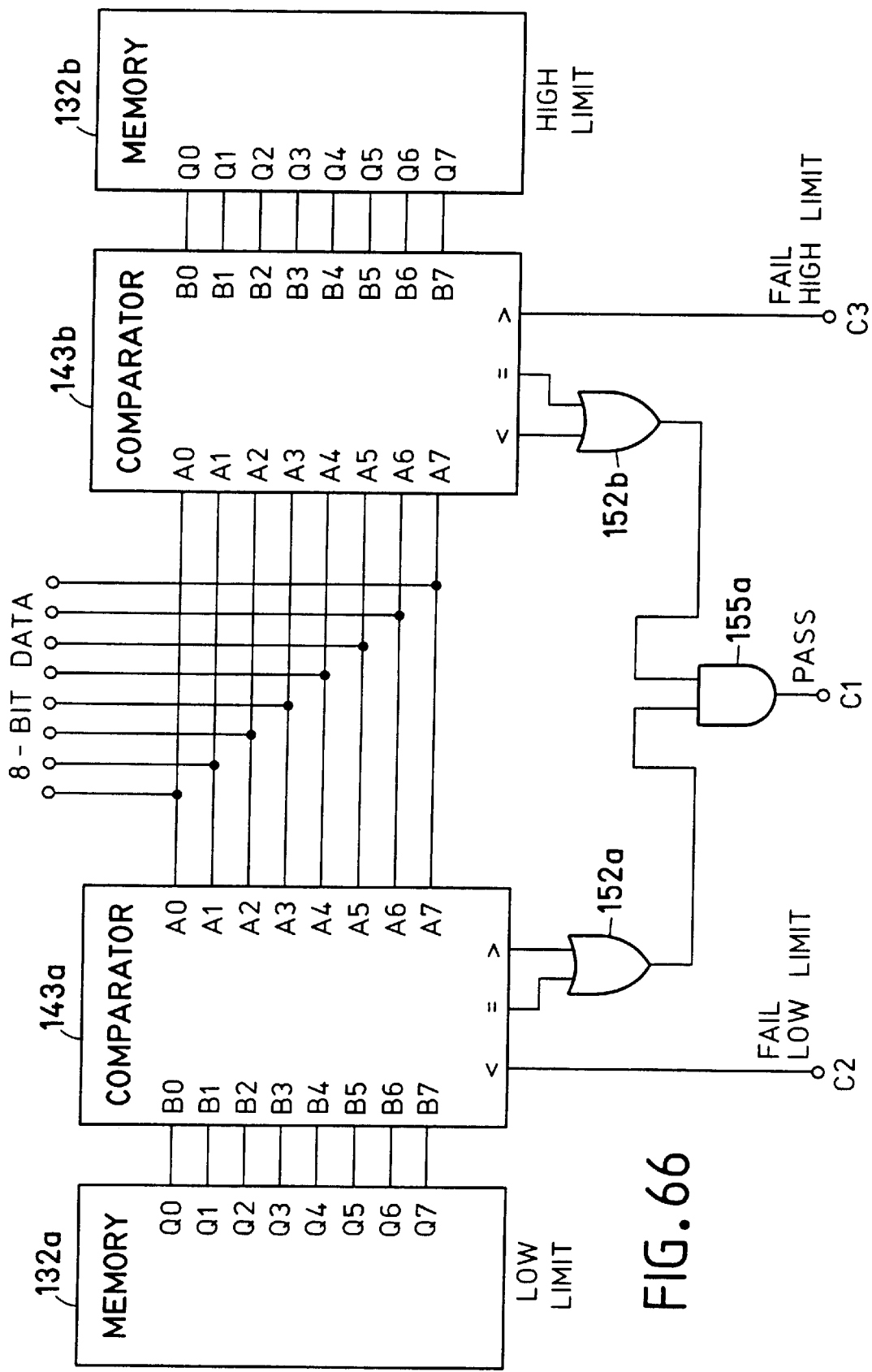
FIG. 66 is a schematic diagram of a comparator with low and high measurement limits.

In FIG. 66 is shown an exemplary simplified schematic diagram of the limit memory and limit comparator combination, generally shown in FIG. 65, for 8-bit measurement data (two BCD digits). The 8-bit data stored in a memory 132a, representing a low measurement limit, are applied to respective inputs B0 to B7 of a digital comparator 143a; the 8-bit data stored in a like memory 132b, representing a high measurement limit, are applied to respective inputs B0 to B7 of a comparator 143b. The 8-bit measurement data, having relation to the instant measured value, are applied to respective inputs A0 to A7 of comparators 143a and 143b, interconnected in parallel.

The comparators 143a and 143b effect a comparison between the measurement data and the instant low and high measurement limits and accordingly develop their output signals '<', '=', '>'. When the instant measurement data are less than the low measurement limit, the '<' output of comparator 143a rises to a high logic level to generate active signal FAIL LOW LIMIT. When the instant measurement data are greater than the high measurement limit, the '>' output of comparator 143b rises to a high logic level to generate active signal FAIL HIGH LIMIT. When the instant measurement data are between the low and high measurement limits, one of the inputs of each OR gate 152a, 152b rises to a high logic level, thereby forcing both inputs of AND gate 155a to rise to a high logic level, which in turn causes its output to rise to a high logic level to generate active signal PASS. The outputs PASS, FAIL LOW LIMIT, and FAIL HIGH LIMIT may be connected to respective inputs C1, C2, and C3 of color control 50. By way of an example, display 40 may illuminate in green color for pass, in yellow color for fail on the low limit, and in red color for fail on the high limit.

Figure 67:
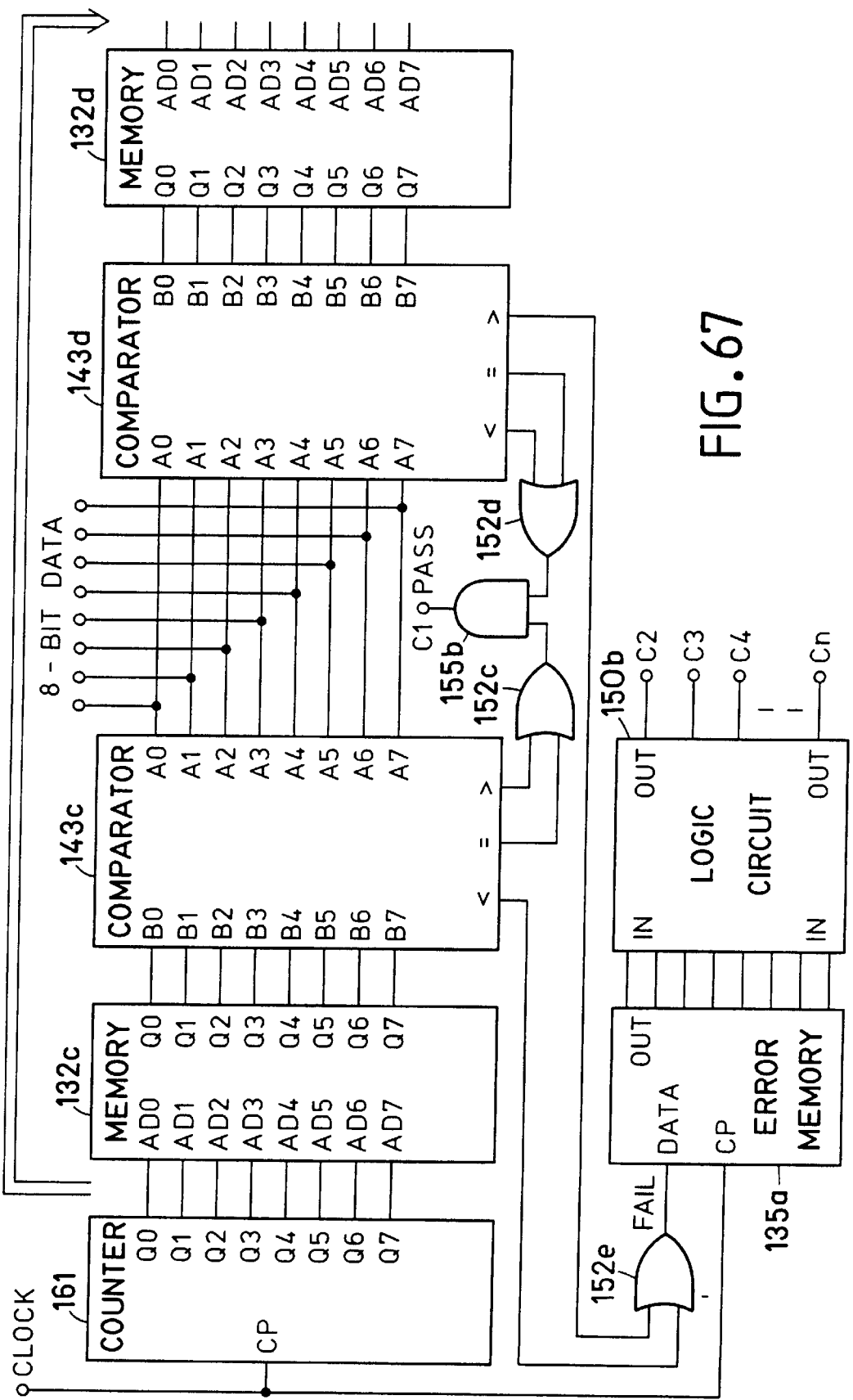
FIG. 67 is a schematic diagram of a comparator and error counter.

In FIG. 67 is shown a simplified schematic diagram of the limit memory, limit comparator, and error memory combination, in a digital multimeter for making a series of measurements. A memory 132c contains data representing low measurement limits for each measurement step. A like memory 132d contains data representing high measurement limits for each measurement step. An 8-bit counter 161, which is incremented for each measurement step by a suitable clock pulse, is used to simultaneously address both memories 132c and 132d. When addressed for a particular measurement step, memories 132c and 132d present the data residing at such address to the inputs B0 to B7 of comparators 143c and 143d, respectively, as the instant low and high measurement limits. The comparison of the instant measurement data with the instant measurement limits is performed by comparators 143c and 143d at each measurement step. When the measurement passes, the PASS output rises to a high logic level. When the measurement fails, either on the low or high measurement limit, the FAIL output of OR gate 152e rises to a high logic level, and error memory 135a is incremented by the next clock pulse. Thus error memory 135a contains data representing the total number of measurement errors. A logic circuit 150*b* converts the instant data of error memory 135*a* to color control signals C2 to Cn, whereby the instant measured value is displayed in the color C1 on pass, and in a certain of the colors C2 to Cn on fail, depending on the total number of previous measurement errors, as will be more fully explained later.

Figure 68:
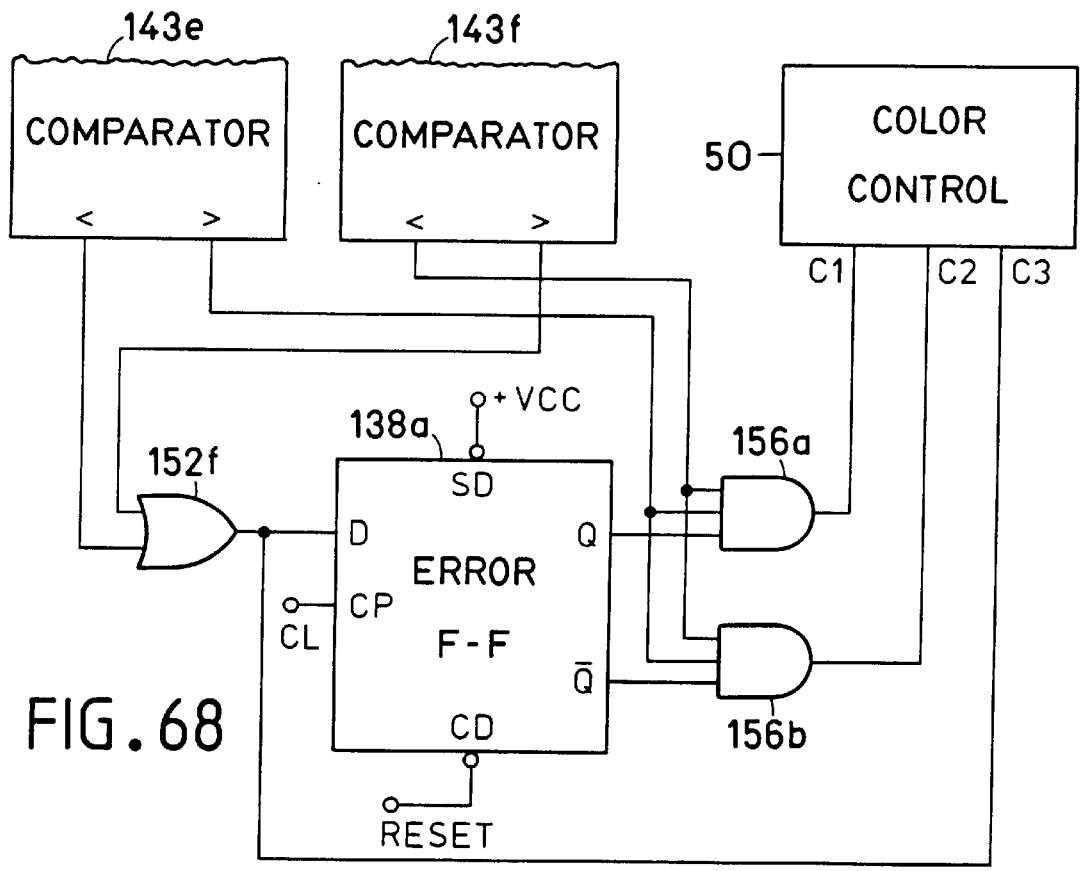
FIG. 68 is a detail of the comparator, error flip-flop, and color control combination.

In FIG. 68 is shown a detail of the comparator, error flip-flop, and color control combination generally shown in FIG. 65. When a measurement error occurs, either on the low or high measurement limit, the output of OR gate 152*f*, which is connected to the D input of error flip-flop 138*a*, rises to a high logic level, and error flip-flip 138*a* will be set by the next clock pulse, to indicate that there was a measurement error. The error flip-flop 138*a* may be suitably reset (not shown), e.g., at the beginning of each measurement series. Results of the measurements are indicated on display 40 in digital format and in a color depending on the result of comparison with the instant low and high measurement limits and on the condition of error flip-flop 138*a*. By way of an example, the measurements may be displayed in green color on pass, in yellow color on fail with no previous measurement errors, and in red color on fail with previous measurement errors.

Figure 69:
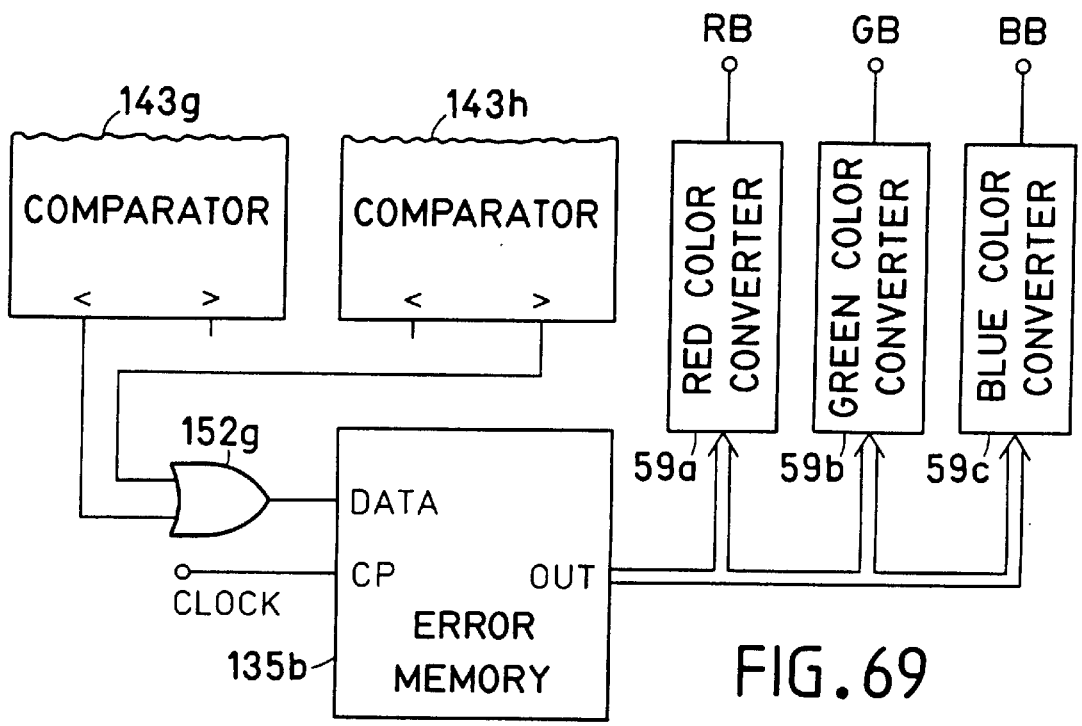
FIG. 69 is a detail of the comparator, error memory, and color converter combination.

FIG. 69 is another exemplary detail of the comparator, error memory, and color converter combination generally shown in FIG. 67. When a measurement error occurs, the output of OR gate 152*g*, which is connected to the DATA input of error memory 135*b*, rises to a high logic level, and the contents of error memory 135*b* will be incremented by the next clock pulse. The error memory 135*b* thus contains data indicating the total number of previous measurement errors. The outputs of error memory 135*b* are applied to interconnected inputs of red color converter 59*a*, green color converter 59*b*, and blue color converter 59*c*, which develop drive signals for energizing red bus 5, green bus 6, and blue bus 7 of display 40 to illuminate it in a color related to the total number of previous measurement errors.

Figure 70:
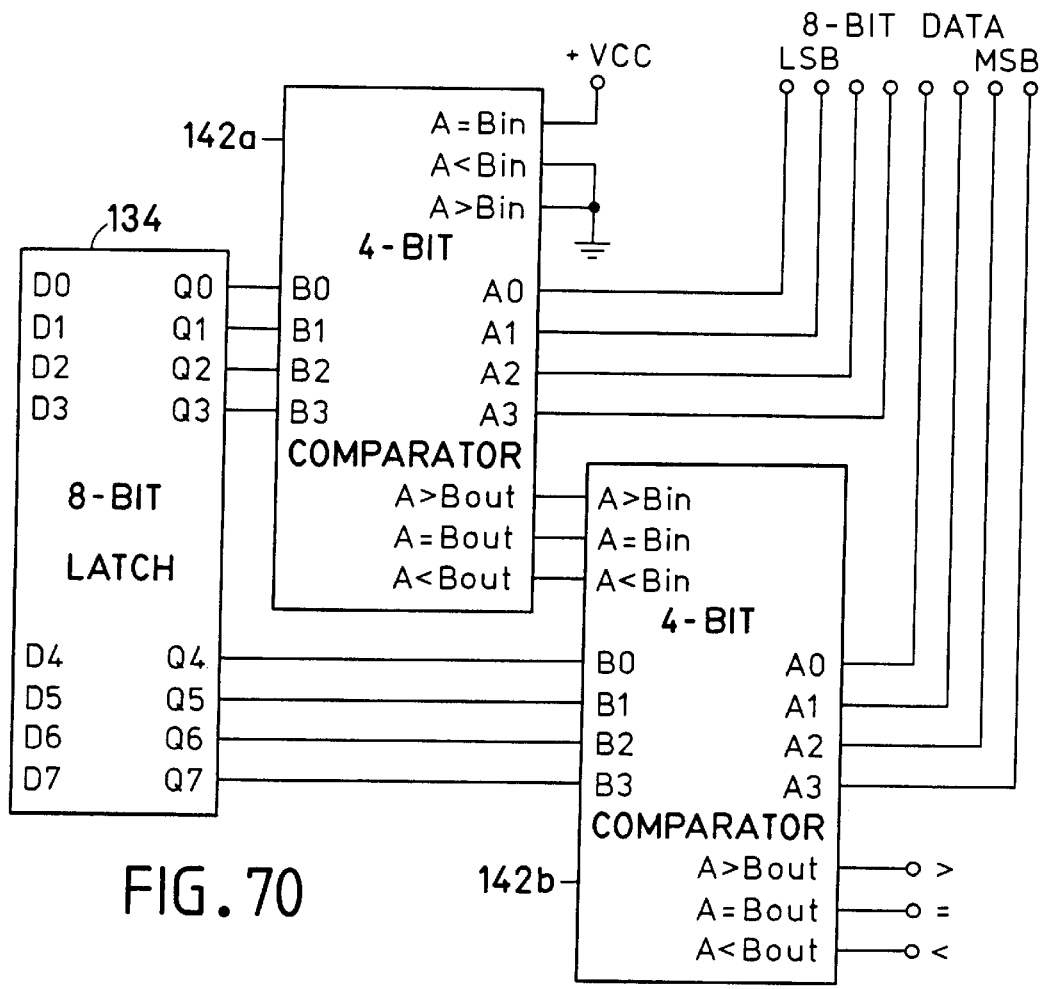
FIG. 70 is a detail of the low measurement limit memory and comparator combination.

FIG. 70 is a detail of the low limit memory and comparator combination shown in FIG. 66. An 8-bit latch 134 stores data representing the instant low measurement limit, which may be from time to time entered via its inputs D0 to D7 (not shown). Two 4-bit digital comparators 142*a* and 142*b* are cascaded to form an 8-bit digital comparator, in a manner well understood by those skilled in the art.

Figure 71:
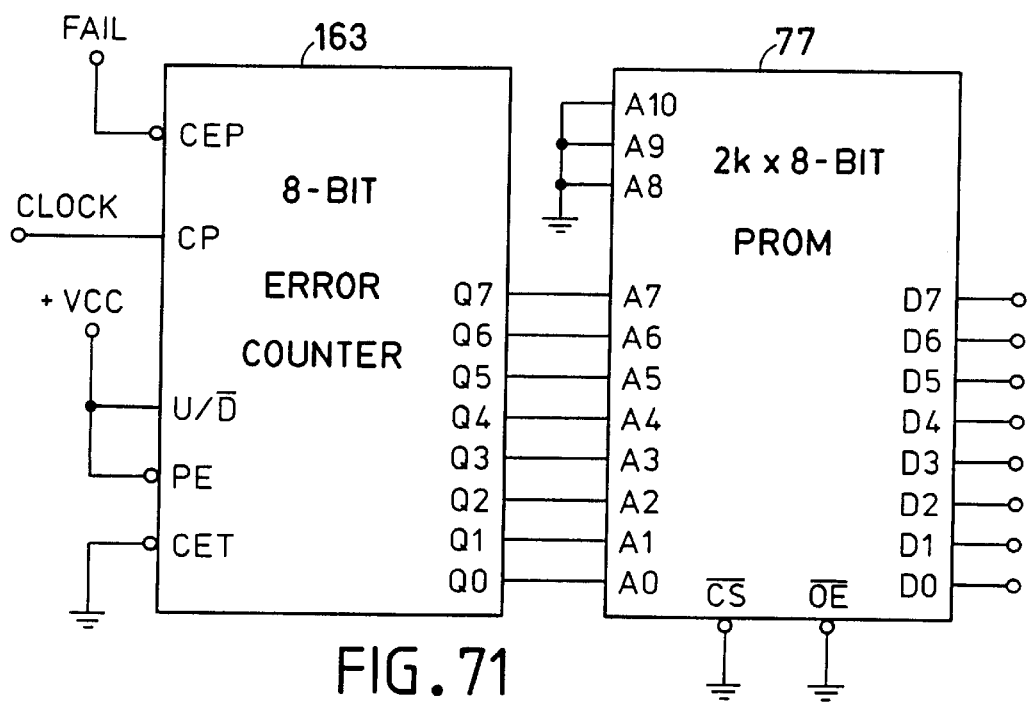
FIG. 71 is a detail of the error counter and PROM combination.

FIG. 71 is an exemplary detail of the error counter and PROM combination of FIG. 69. An 8-bit counter 163, which contains the count indicating the total number of previous measurement errors, is employed to address, via its outputs Q0 to Q7, a PROM 77 containing the color conversion data which may be used to develop drive signals for red bus 5, green bus 6, and blue bus 7, as previously shown in FIG. 35, to illuminate display 40 in a color depending on the total number of previous measurement errors.

Figure 72:
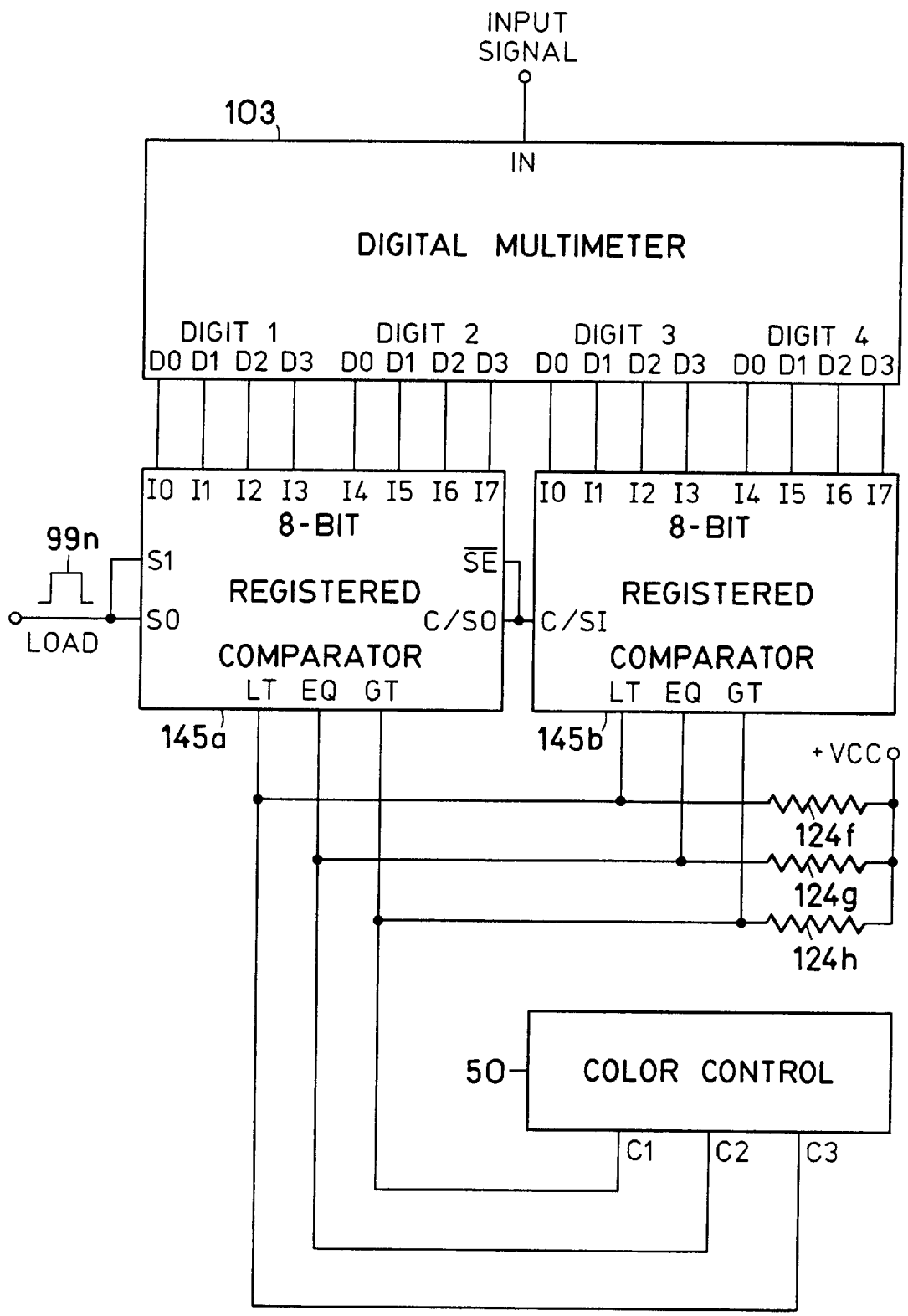
FIG. 72 is a schematic diagram of a variable color digital multimeter with registered comparator for comparing instant measured values with previously stored ones.

The schematic diagram shown in FIG. 72 includes a digital multimeter 103, for making repeated measurements of input signals applied ti its input IN and for developing at its outputs a 4-digit BCD code having relation to the magnitude of the instant input signal, and two cascaded registered comparators 145*a* and 145*b*, for comparing the instant measured value with the value previously stored. From time to time, a short positive pulse 99*n* may be applied to interconnected Load inputs S0 and S1, to cause the instant data at the inputs I0 to I7 of both registered comparators 145*a* and 145*b* to be loaded therein. The subsequent measured values will be compared with the reference value currently stored in registered comparators 145*a* and 145*b*, and interconnected outputs LT (Less Than), EQ (Equal), GT (Greater Than), which are tied to the supply voltage via suitable pull-up resistors 124*f*, 124*g*, and 124*h*, will indicate the result of each comparison. The comparator outputs LT, EQ, and GT are respectively connected to the inputs C1, C2, and C3 of color control 50, to control the color of display 40, shown in FIG. 62, in accordance with the result of the comparison. The display 40 indicates the instant measured value in digital format and in a color depending on the result of comparison with the reference value currently stored in registered comparators 145*a* an 145*b*. By way of an example, display 40 may illuminate in green color when the instant measured value is equal to the reference value, in yellow color when it is less than the reference value, and in red color when it is larger than the reference value.

Figure 73:
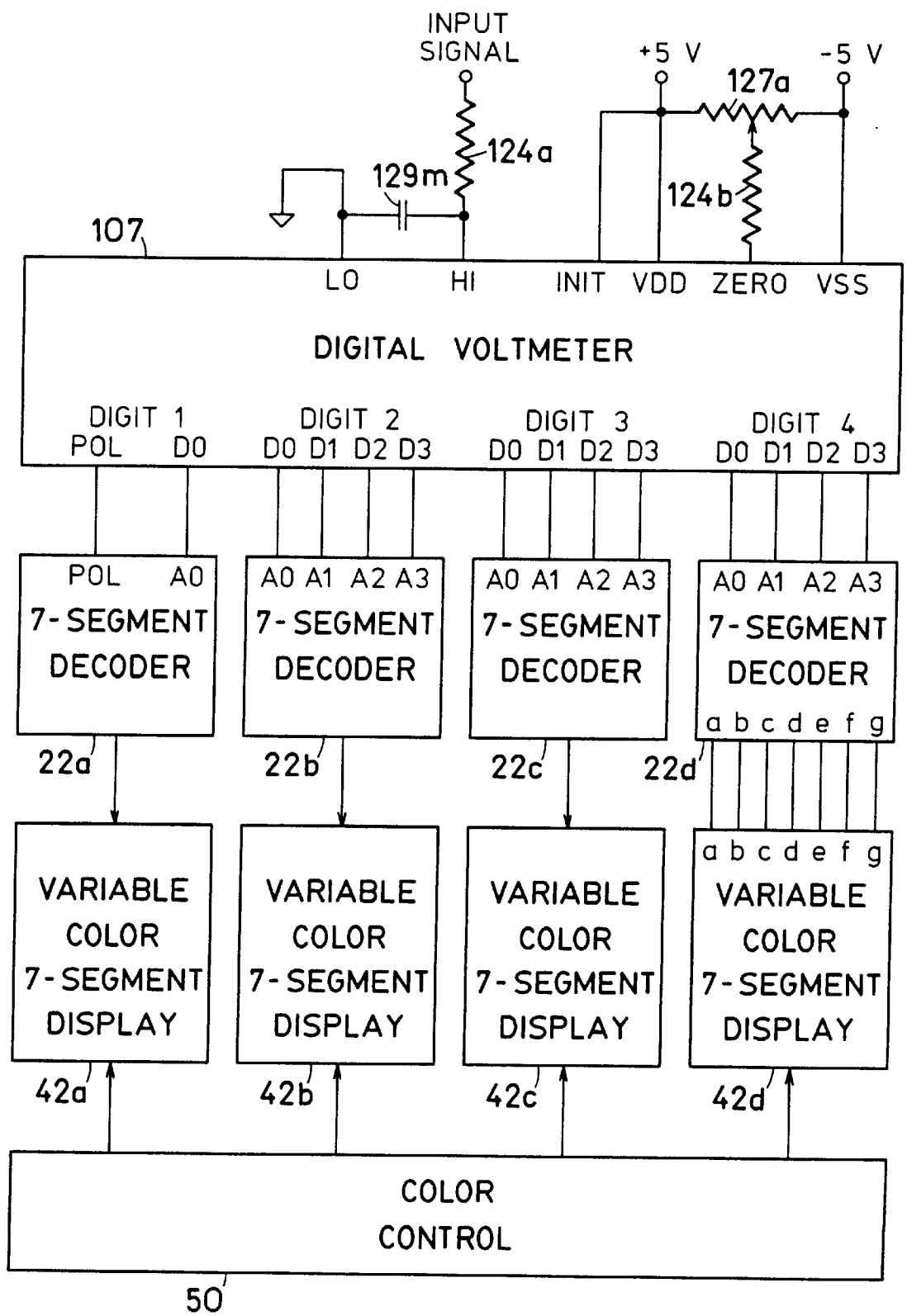
FIG. 73 is a block diagram of a variable color digital multimeter with uniform color control for all display digits.

In FIG. 73 is shown a simplified schematic diagram of a digital voltmeter with 3½ digit variable color display. The digital voltmeter 107 is configured, by having its initialize conversion input INIT connected to a high logic level, to continuously convert input analog voltage, applied to its input terminal HI via resistor 124*a* and decoupling capacitor 129*m*, to 3½ digit BCD code corresponding to the magnitude of instant input voltage. The BCD codes for the respective digits are converted, by 7-segment decoders 22*a*, 22*b*, 22*c*, and 22*d*, to signals for directly energizing the segments of variable color display digits 42*a*, 42*b*, 42*c*, and 42*d*, respectively, in a manner well understood by those skilled in the art. The color control 50 causes all four display digits 42*a*, 42*b*, 42*c*, and 42*d* to illuminate uniformly in a selected color.

Figure 74:
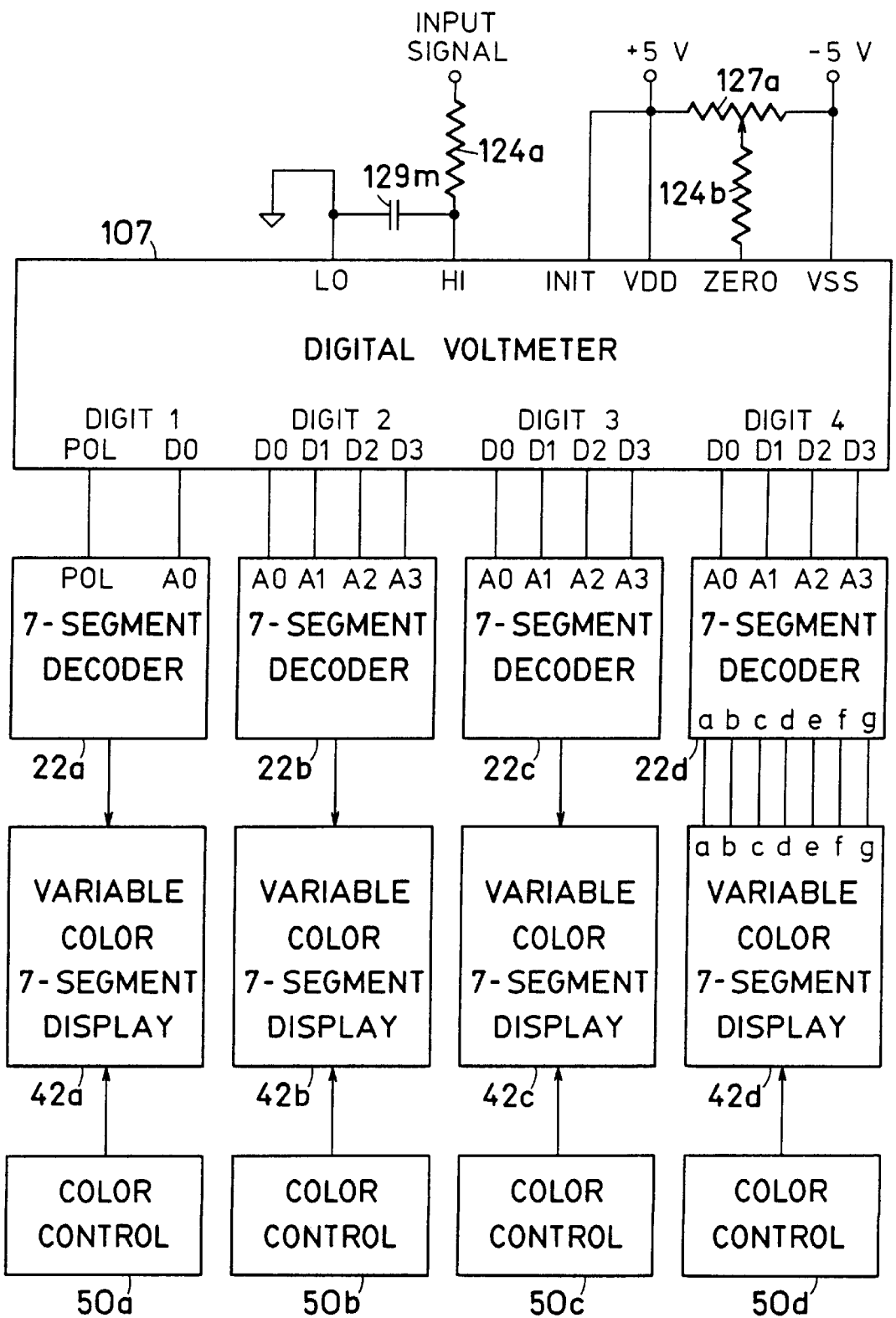
FIG. 74 is a block diagram of a variable color digital multimeter with independent color control for each display digit.

A like block diagram shown in FIG. 74 differs in that four color controls 50*a*, 50*b*, 50*c*, and 50*d* are employed to independently control the colors of display digits 42*a*, 42*b*, 42*c*, and 42*d*.

Figure 75:
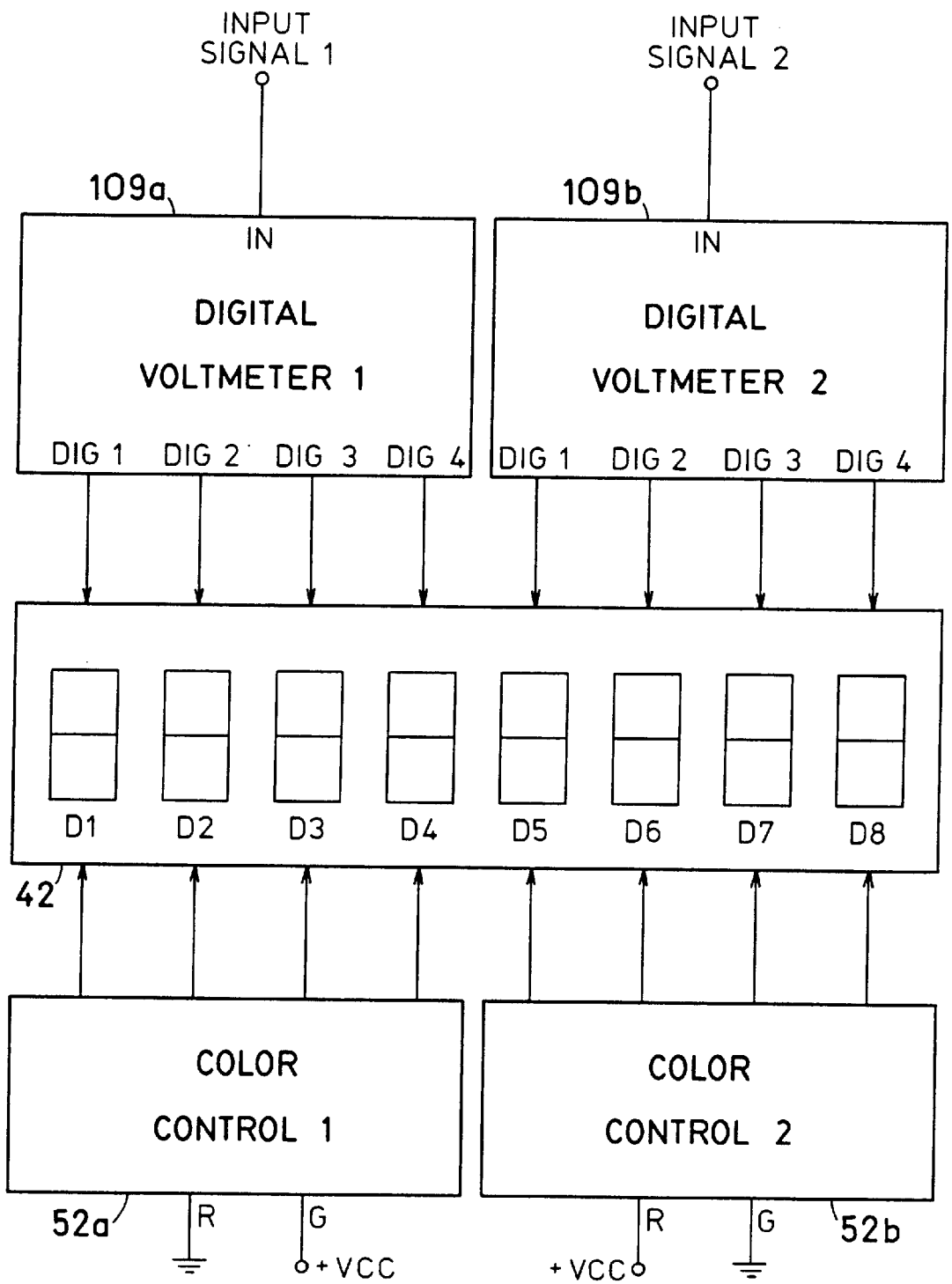
FIG. 75 is a block diagram of a dual digital voltmeter with single variable color digital display.

In FIG. 75 is shown, in a block diagram configuration, a multimeter utilizing two digital voltmeters 109*a* and 109*b* for respectively measuring INPUT SIGNAL 1 and INPUT SIGNAL 2. The measured values of both input signals are simultaneously indicated on a single 8-digit variable color display element 42 such that the four most significant display digits D1 to D4 indicate the output of digital voltmeter 109*a*, and the four least significant display digits D5 to D8 indicate the output of digital voltmeter 109*b*. In order to clearly distinguish between the two measured values, without the need for a visual gap therebetween, color control 52*a* has its input G connected to a high logic level, to illuminate the four most significant display digits D1 to D4 in green color, and like color control 52*b* has its input R connected to a high logic level, to illuminate the four least significant digits D5 to D8 in red color.

Figure 76:
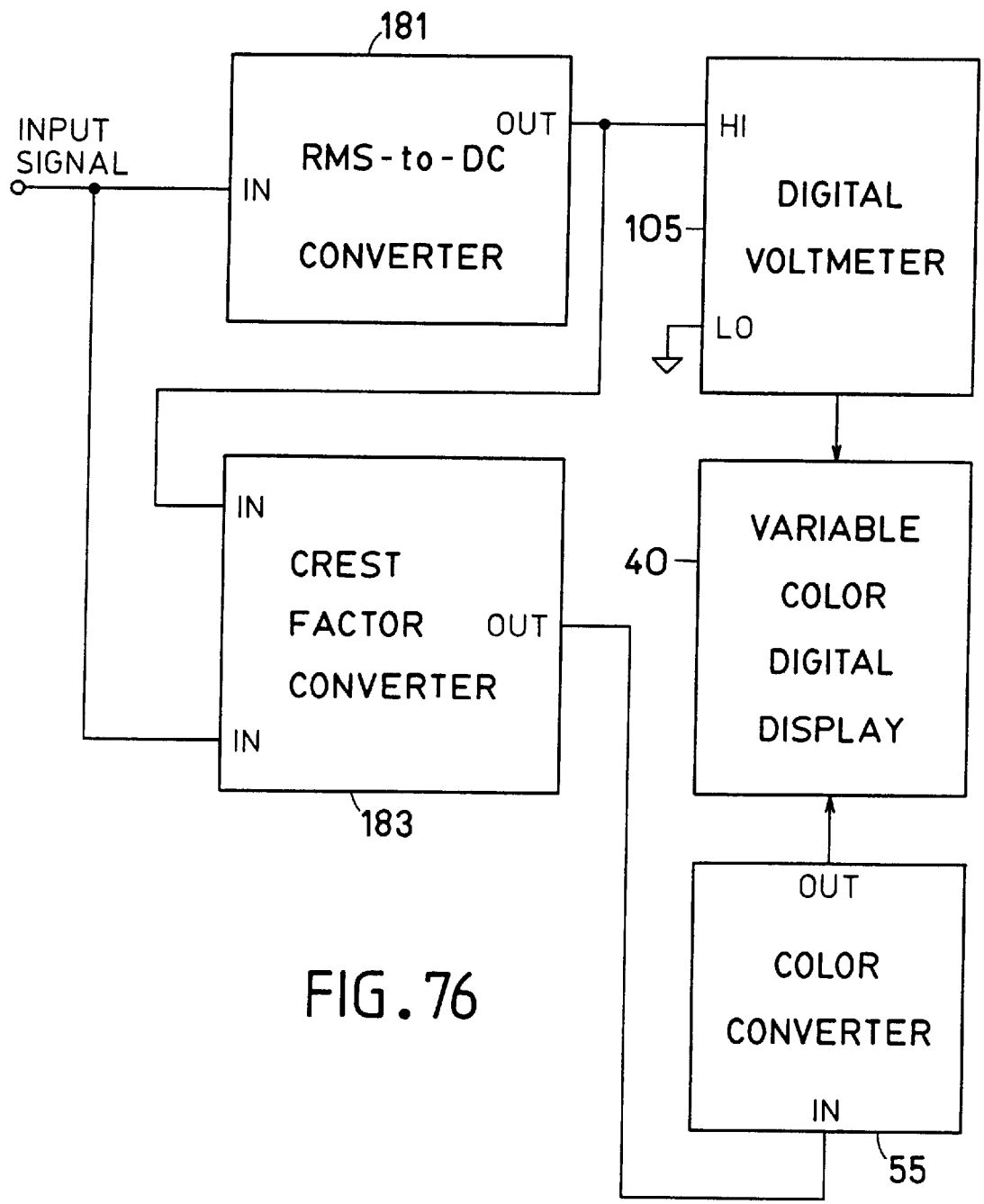
FIG. 76 is a block diagram of a variable color RMS digital voltmeter with variable color crest factor indication.

FIG. 76 is a block diagram of an RMS digital voltmeter with variable color crest factor indication. The RMS (Root Mean Square) value of the measured waveform is its heating value when applied to a resistor; it indicates the magnitude of the measured waveform regardless of its shape. The Crest Factor is the peak signal value divided by the RMS value; it indicates what type of a waveform it is.

The digital voltmeter includes an RMS-to-DC converter 181 for converting an input measured signal to a DC value representative of the energy content of the measured signal. The DC value from RMS converter 181 is applied to the HI input terminal of digital voltmeter 105 which develops at its outputs signals to directly drive variable color digital display 40, to thereby indicate the measured RMS value in digital format, in a manner well known to those having ordinary skill in the art.

The invention resides in the addition of a crest factor converter 183 for computing the crest factor value of the measured waveform, and of a color converter 55 for controlling the color of display 40 in accordance with the crest factor value. The RMS digital voltmeter of the present invention will simultaneously indicate the RMS value of the measured waveform in digital format and in a color indicative of the crest factor value of the measured waveform, to thereby simultaneously indicate its magnitude and shape.

Figure 77:
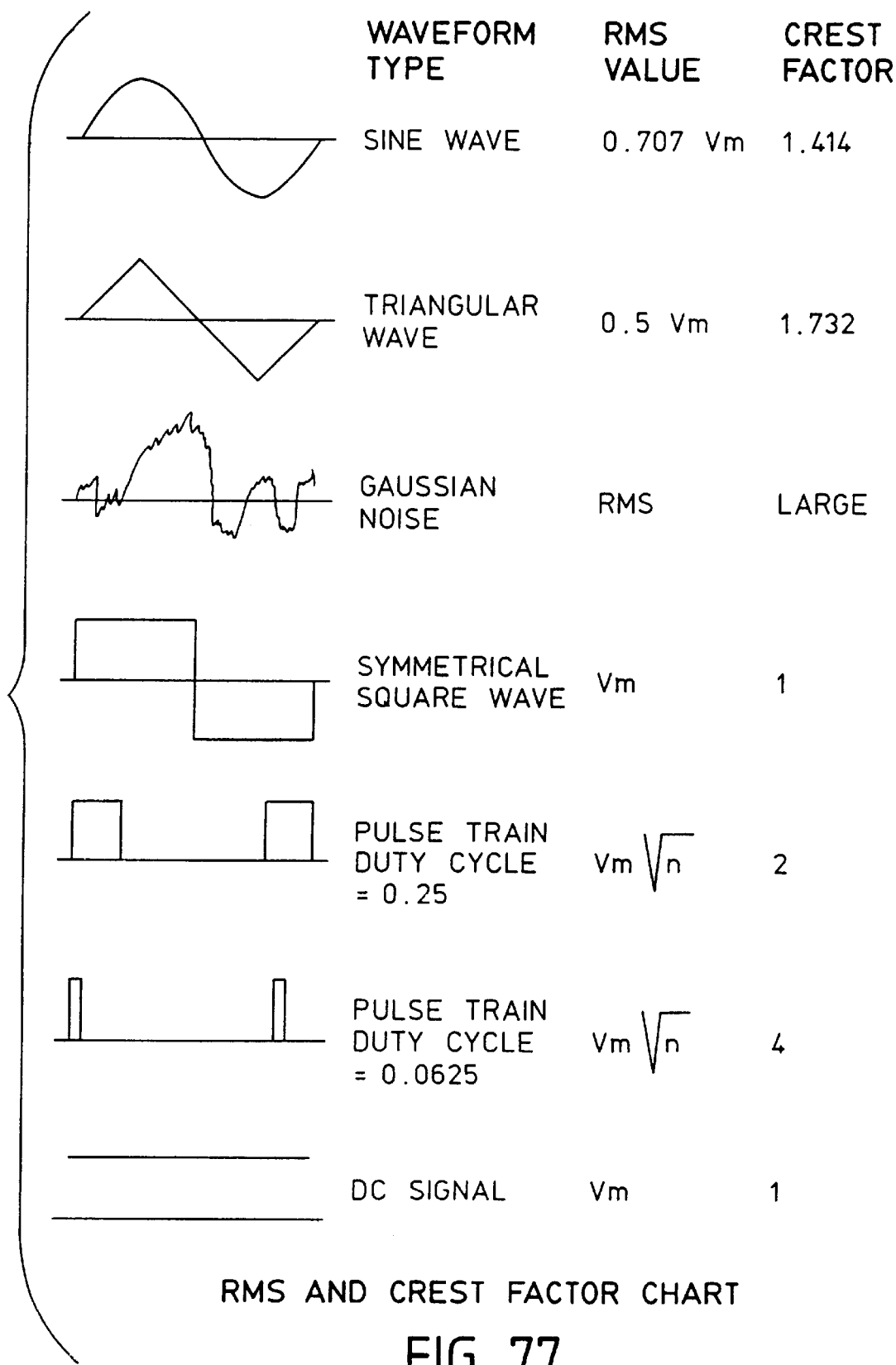
FIG. 77 is an RMS and crest factor chart.

FIG. 77 is a comparison chart of RMS and crest factor values for several exemplary waveforms. It is readily apparent that the crest factor value is a good indication of the waveform shape. The unity value of the crest factor indicates that the measured signal is either a symmetrical waveform or a DC signal. Small values of the crest factor (less than 2) usually indicate either a sine wave, triangle wave, or a low duty cycle pulse train. High values of the crest factor (greater than 4) usually indicate a noise signal or a pulse train with a high duty cycle.

Figure 78:
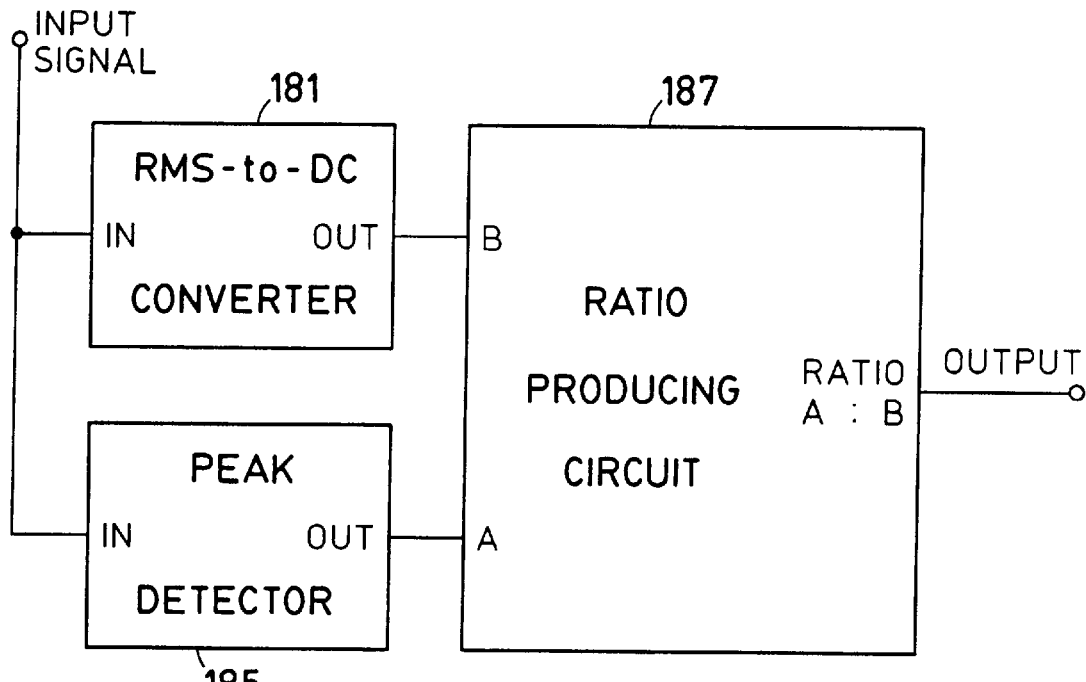
FIG. 78 is an expanded block diagram of a crest factor converter with ratio producing circuit.

As illustrated in FIG. 78, the crest factor converter includes a ratio producing circuit 187 that develops at its output RATIO A:B a signal representative of the ratio of signals applied to its inputs A and B. The peak signal value, obtained from the output of peak detector 185, is applied to the input A. The RMS signal value, obtained from the output of RMS-to-DC converter 181, is applied to the input B. The computed ratio of the peak signal value to the RMS signal value, developed at the output RATIO A:B, is by definition a crest factor value of the measured signal.

Figure 79:
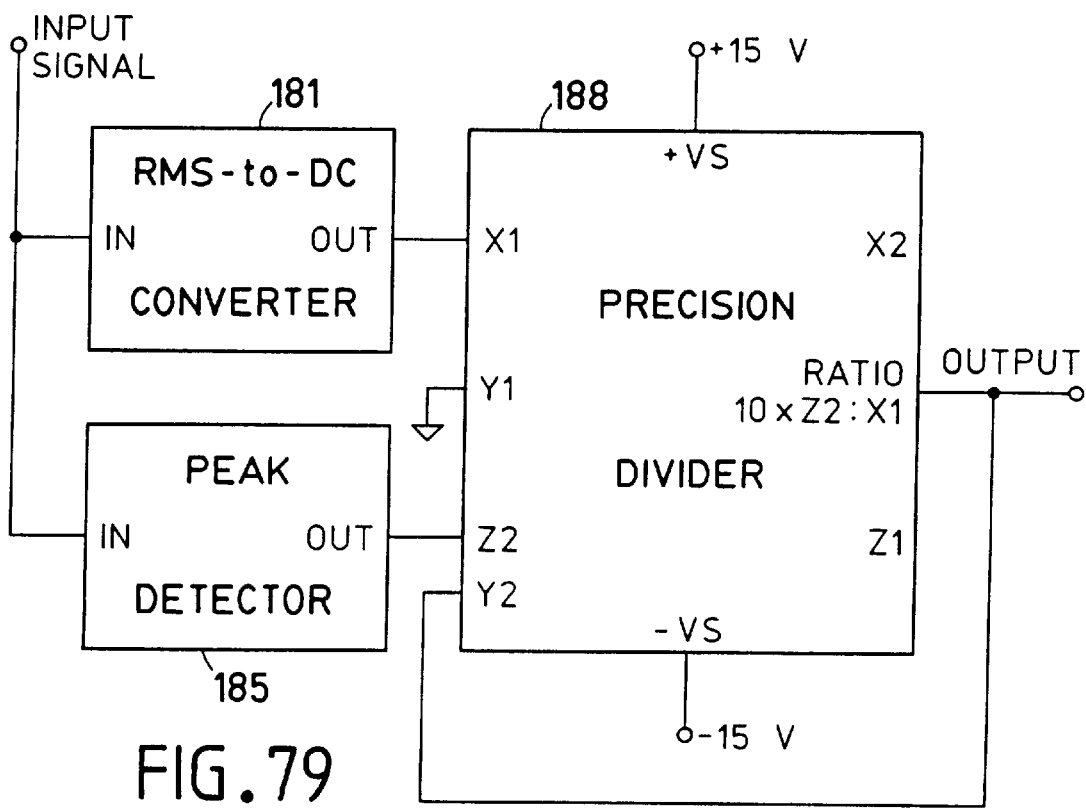
FIG. 79 is an expanded block diagram of a crest factor converter with precision divider.

In a simplified exemplary schematic diagram of a ratio producing circuit, shown in FIG. 79, the output DC voltage of RMS-to-DC converter 181 is applied to the X1 input of a precision divider 188, while the output DC voltage of peak detector 185 is applied to its input Z2. The precision divider 188 develops at its output suitably scaled DC voltage representing the ratio of the signals Z2 to X1.

Figure 80:
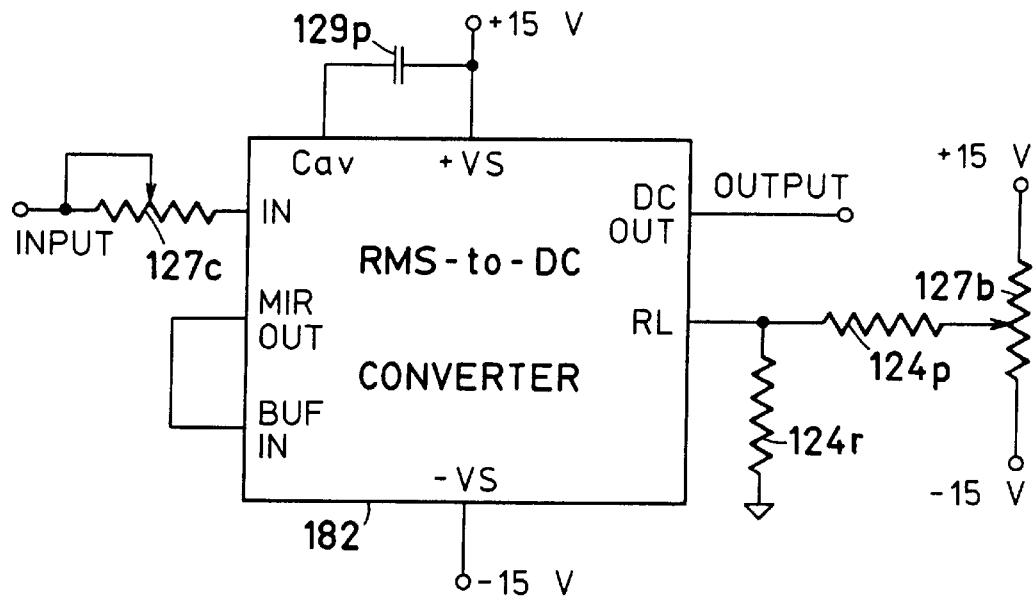
FIG. 80 is a schematic diagram of an RMS-to-DC converter.

In an exemplary detail of the RMS-to-DC converter, shown in FIG. 80, the measured signal is applied, via suitable potentiometer 127c, to the input IN of RMS-to-DC converter 182, which develops at its output a DC voltage corresponding to RMS value of the measured signal. The potentiometer 127b and resistors 124p and 124r are used to adjust offset voltage; the capacitor 129p is selected to set a suitable averaging time constant.

Figure 81:
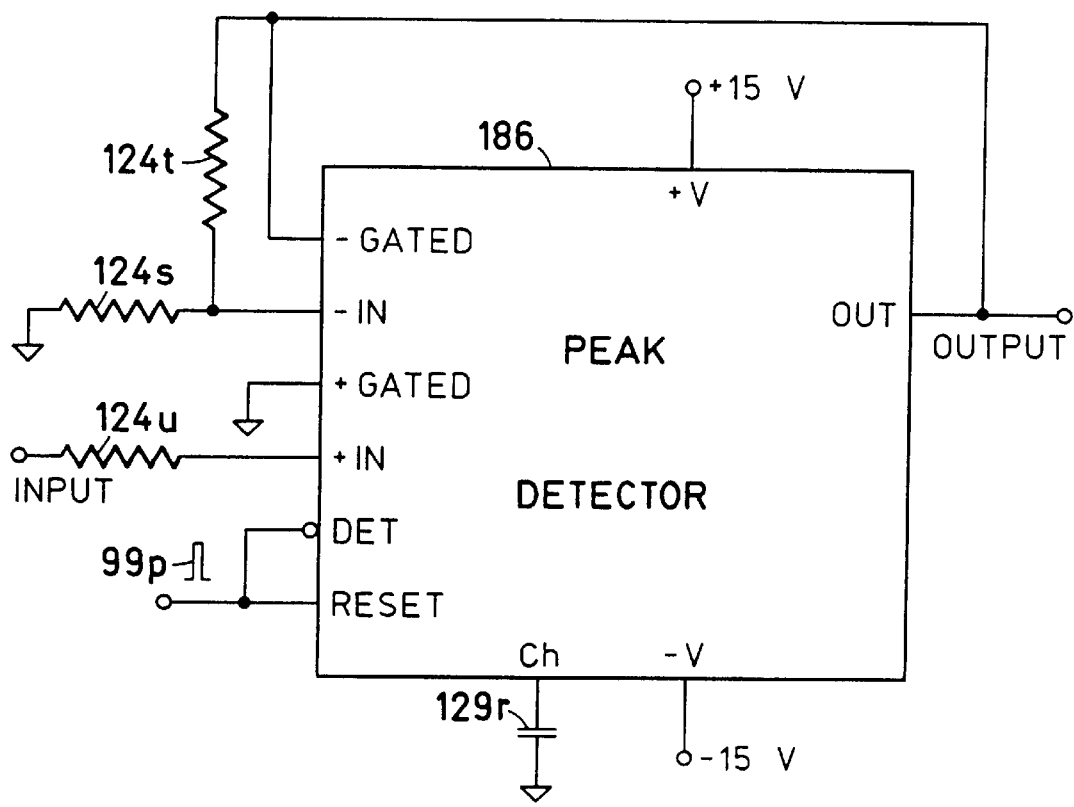
FIG. 81 is a schematic diagram of a peak detector.

FIG. 81 is an exemplary detail of the peak detector circuit, in which a measured signal is applied, via a suitable resistor 124u, to the input +IN of peak detector 186, which develops at its output a DC voltage, retained on a hold capacitor 129r, representing the maximum value of the input signal. Th present peak value may be from time to time reset, by applying a relatively short positive pulse 99p to interconnected inputs DET and RESET. When pulse 99p returns to a low logic level, new peak of the input signal may be measured.

Figures 82, 83:
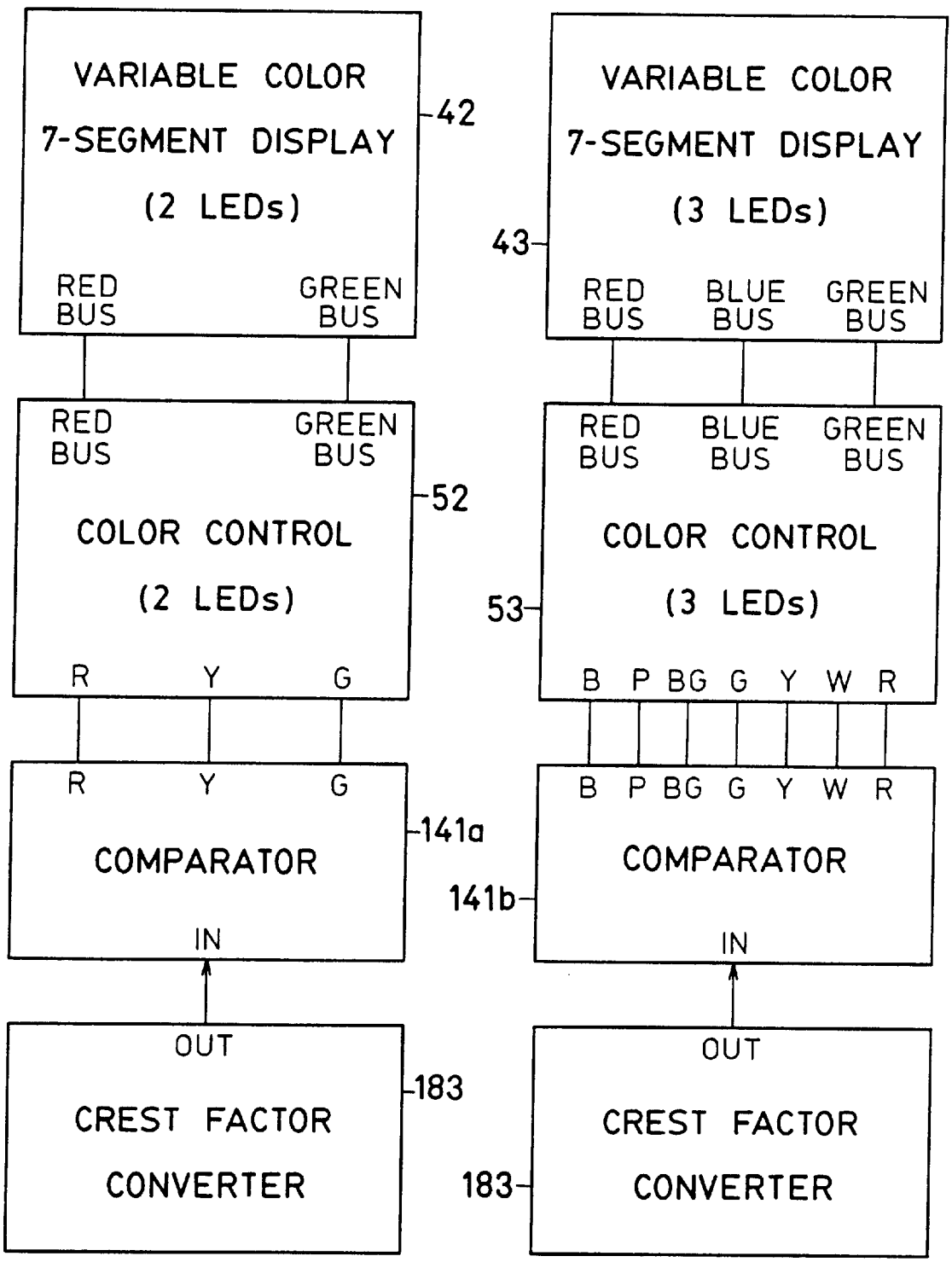
FIG. 82 is an expanded block diagram of 2-primary color control for the crest factor converter.
FIG. 83 is an expanded block diagram of 3-primary color control for the crest factor converter.

As shown in FIG. 82 in a block diagram form, the output voltage of crest factor converter 183, which indicates the instant measured value of the crest factor, may be applied to the input of a suitable comparator 141a, such as the one shown in FIG. 23, to develop color control logic signals R, Y, and G for color control 52, to illuminate display element 42 in one of three colors in accordance with the value of the crest factor. By way of an example, the comparator 141a may be set to develop active color control signal G for values of the crest factor less than 1.5, to illuminate display element 42 in green color, active color control signal Y for values of the crest factor between 1.5 and 2.5, to illuminate display element 42 in yellow color, and active color control signal R for values of the crest factor greater than 2.5, to illuminate display element 42 in red color.

A similar block diagram shown in FIG. 83 differs in that a comparator 141b, such as the one shown in FIG. 25, and color control 53 are used to illuminate display element 43 in one of seven colors, in accordance with the value of the crest factor. By way of an example, comparator 141b may develop active color control signal B for values of the crest factor less than 1.1, to illuminate display element 43 in blue color, active color control signal P for values of the crest factor between 1.1 and 1.4, to illuminate display element 43 in purple color, active color control signal BG for crest factor values between 1.4 and 1.7, to illuminate display element 43 in blue-green color, active color control signal G for crest factor values between 1.7 and 2.0, to illuminate display element 43 in green color, active color control signal Y for crest factor values between 2.0 and 2.5, to illuminate display element 43 in yellow color, active color control signal W for crest factor values between 2.5 and 3.0, to illuminate display element 43 in white color, and active color control signal R for crest factor values greater than 3.0, to illuminate display element 43 in red color.

As shown in FIG. 84, the output voltage of crest factor converter 183 is applied to the input of a scaling circuit 80a, such as the one shown in FIG. 31, to be scaled and shifted to a voltage range suitable for 2-LED continuous color converter 57, which will develop drive signals for controlling red bus 5 and green bus 6, respectively, of display element 42, to illuminate it in a color related to the instant measured value of the crest factor.

A like block diagram shown in FIG. 85 differs in that 3-LED continuous color converter 58 is used to develop drive signals for red bus 5, green bus 6, and blue bus 7, respectively, of display element 43, to illuminate it in a color related to the measured value of the crest factor. The relationship between the crest factor values and the color of display element 43 may be defined at will, e.g., by programming suitable data into PROMs contained in continuous color converter 58, as previously described.

Figure 86:
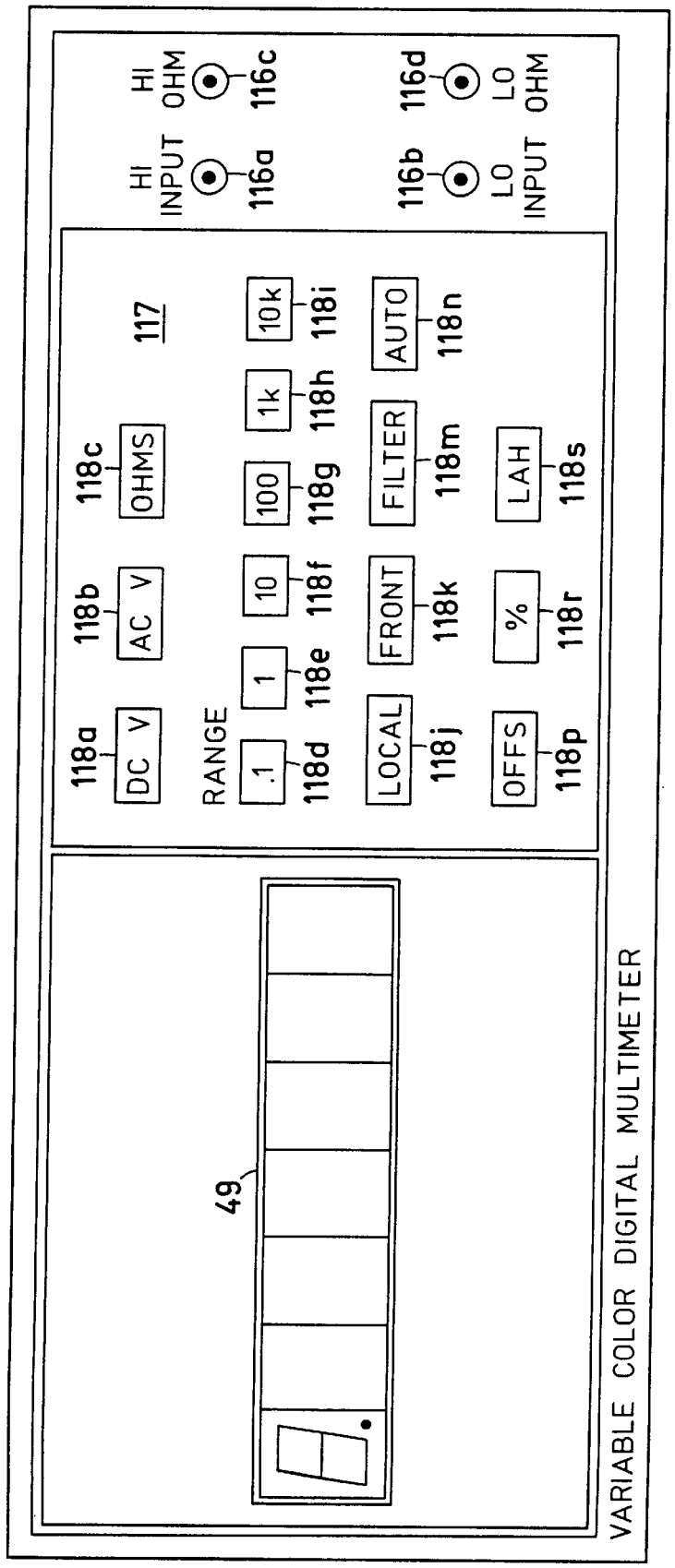
FIG. 86 is a front view of a variable color digital multimeter of the present invention.

In FIG. 86 is shown a front view of a digital multimeter which includes a 6½ digit variable color digital display 49, keyboard 117, and suitable terminals 116a to 116d for attaching thereto measuring cords. The keyboard 117 includes a DC V key 118a for setting the multimeter to its DC voltage mode, AC V key 118b for setting the multimeter to its AC voltage mode, OHMS key 118c for setting the multimeter to its OHMS mode, RANGE keys 118d, 118e, 118f, 118g, 118h, and 118i for setting the multimeter to a selected range, LOCAL key 118j for setting the multimeter to its local mode, FRONT key 118k for selecting front measurement terminals, FILTER key 118m for setting the multimeter to its filter mode, AUTO key 118n for setting the multimeter to its autoranging mode, OFFS key 118p, '%' key 118r, and LAH key 118s for setting the multimeter to certain of its mathematical modes. The HI INPUT terminal 116a and LO INPUT terminal 116b may be used for voltage measurements; like HI OHM terminal 116c and LO OHM terminal 116d may be used for resistance measurements.

Figure 87:
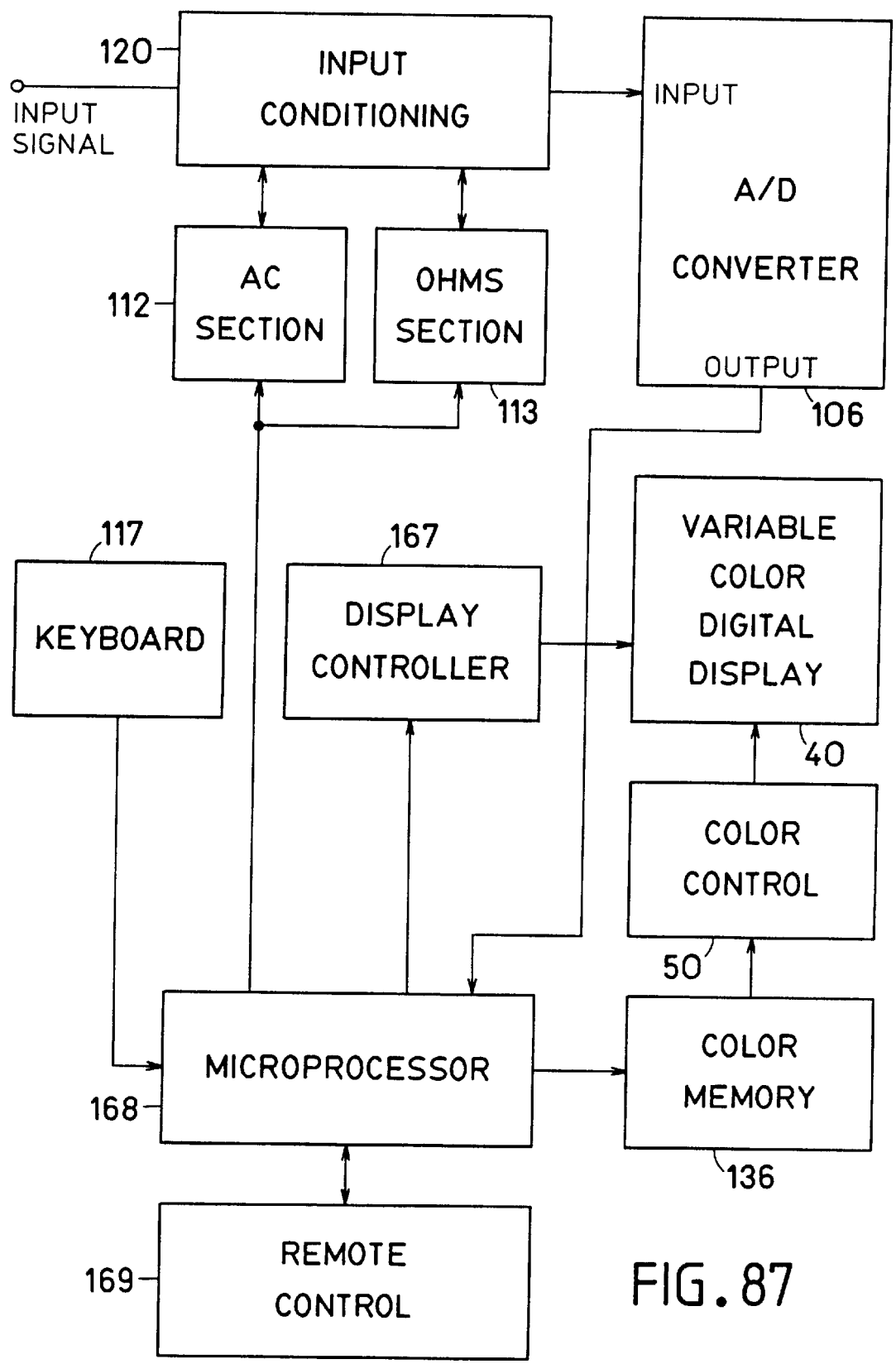
FIG. 87 is a block diagram of a variable color digital multimeter controlled by a microprocessor.

In FIG. 87 is shown a block diagram of a variable color digital multimeter controlled by a microprocessor or microcomputer 168, which can be influenced either locally, by entering commands via the keyboard 117, or remotely, by sending commands over a bus via remote control 169. When properly commanded, microprocessor 168 can control the input conditioning section 120, AC section 112, and OHMS section 113, to selectively switch, scale, attenuate, rectify, and filter measured signals, before being applied to the input of an A/D converter 106, which repeatedly performs analog-to-digital conversions and develops output data indicative of the magnitude of the instant measured signal. The microprocessor 168 can from time to time read output data of converter 106 and send same to display controller 167, which causes the data to be indicated on display 40 in digital format. The invention resides in the addition of a color memory 136, wherein data symbolizing a selected color may be stored, and color control 50 for illuminating display 40 in the selected color. It is contemplated that the color of display 40 may be controlled in accordance with certain of the following operating modes:

a. Local/remote mode: The multimeter may be set either to its local mode, e.g., by actuating LOCAL key 118*j* on the front panel, wherein all commands are entered via keyboard 117, and remote control 169 is disabled, or to its remote mode wherein all commands are sent via remote control 169, and keyboard 117 is disabled. When in its local mode, microprocessor 168 will send data to color memory 136 commanding color control 50 to illuminate display 40 in a first color (e.g., green); when in its remote mode, microprocessor 168 will send different data to color memory 136 commanding that display 40 be illuminated in a second color (e.g., red), so that an operator may readily distinguish the two modes.

b. Normal/offset mode: The multimeter may be set to its offset mode, e.g., by actuating OFFS key 118*p* on the front panel, wherein a numeric constant (an offset) is stored in internal memory of microprocessor 168, to calculate and display the difference between a measured value and the offset; when in its normal mode, the multimeter displays true measured values. To indicate in which mode the multimeter currently operates, microprocessor 168 will send data to color memory 136 commanding that display 40 be illuminated in a first color when in its normal mode and in a second color when in its offset mode.

c. Standard/percent mode: The multimeter may be set to its percent mode, e.g., by actuating the '%' key 118*r* on the front panel, wherein a percent deviation of a measured value from a value stored in the internal memory of microprocessor 168 (reference value) is calculated and displayed; when in its standard mode, true measured values are displayed. To indicate in which mode the multimeter currently operates, microprocessor 168 will send data to color memory 136 commanding that display 40 be illuminated in a first color for the standard mode and in a second color for the percent mode.

d. LAH/standard mode: The multimeter may be set to its LAH (Low, Average, High) mode, e.g., by actuating the LAH key 118*s* on the front panel, wherein the multimeter will store the most positive and most negative measured values, calculate the average measured value, and count the number of measurements during the LAH cycle; when in its standard mode, true measured values are displayed. To indicate whether the multimeter currently operates in the standard or LAH mode, microprocessor 168 will send data to color memory 136 commanding that display 40 be illuminated in a first color for the standard mode and in a second color for the LAH mode.

Figure 88:
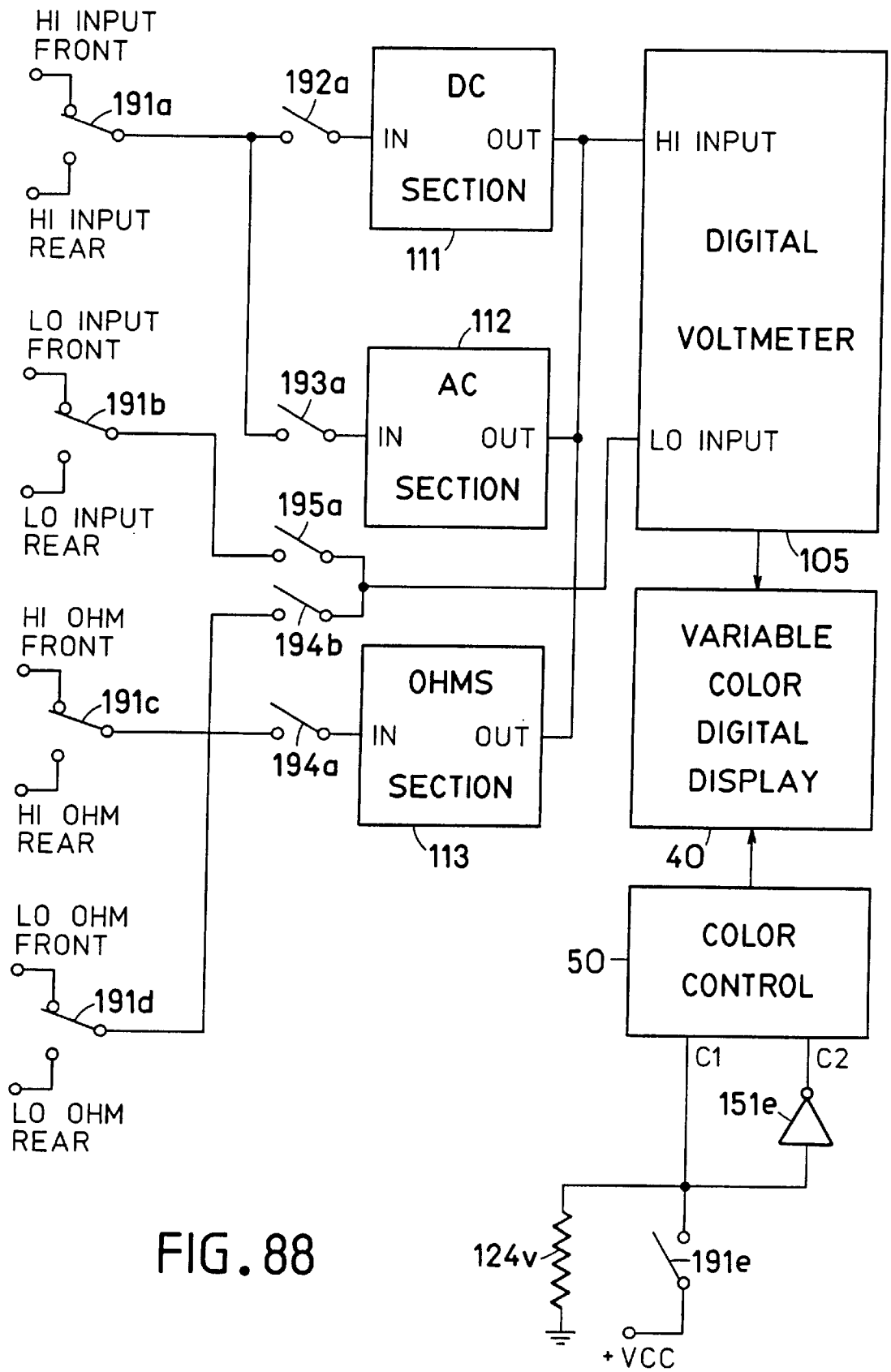
FIG. 88 is an expanded block diagram of a variable color digital multimeter for indicating front and rear measurements in different colors.

In FIG. 88 is shown an expanded block diagram of a digital multimeter with a DC section 111 for processing DC signals, AC section 112 for processing AC signals, and OHMS section 113 for performing resistance measurements, as will be more fully explained later. The multimeter includes input terminals HI INPUT 116*a*, LO INPUT 116*b*, HI OHM 116*c*, LO OHM 116*d* on the front panel shown in FIG. 86, and like input terminals on the rear panel (not shown), which may be selectively connected to the input of digital voltmeter 105. To select between the front and rear measurements, FRONT key 118*k* may be actuated, which toggles a front/rear relay 191 between its energized and disenergized conditions. To facilitate the illustration, a convention was adopted that a particular relay is designated in the drawings by a certain numeral, and its associated contacts are designated by same numeral with character 'a', 'b', etc, appended. By way of an example, relay 191 has contacts 191*a*, 191*b*, 191*c*, 191*d*, and 191*e*. When relay 191 is not energized, its contacts 191*a* to 191*e* are in the positions as illustrated, thereby making available the front input terminals for connection to the input of digital voltmeter 105. When relay 191 is energized, its contacts 191*a* to 191*e* switch to their other positions, respectively, thereby making available the rear input terminals for connection to the input of digital voltmeter 105. The invention resides in the addition of relay contact 191*e*, associated with contacts 191*a* to 191*d*, such that the front and rear measurements are indicated in digital format and in respectively different colors. When the measurements via the front input terminals are performed, as illustrated, relay contact 191*e* is open, and the input C1 of color control 50 is pulled to a low logic level by a suitable pull-down resistor 124*v*, thereby forcing, via an inverter 151*e*, the input C2 of color control 50 to rise to a high logic level, to cause display 40 to be illuminated in the color C2 (e.g., red). When the measurements via the rear input terminals are performed, by causing relay 191 to be energized to switch its contacts 191*a* to 191*e* to their other positions, respectively, contact 191*e* is closed to apply a high logic level from the source +VCC to the input C1 of color control 50, and to simultaneously force, via inverter 151*e*, the input C2 of color control 50 to a low logic level, to cause display 40 to be illuminated in the color C1 (e.g., green).

Figure 89:
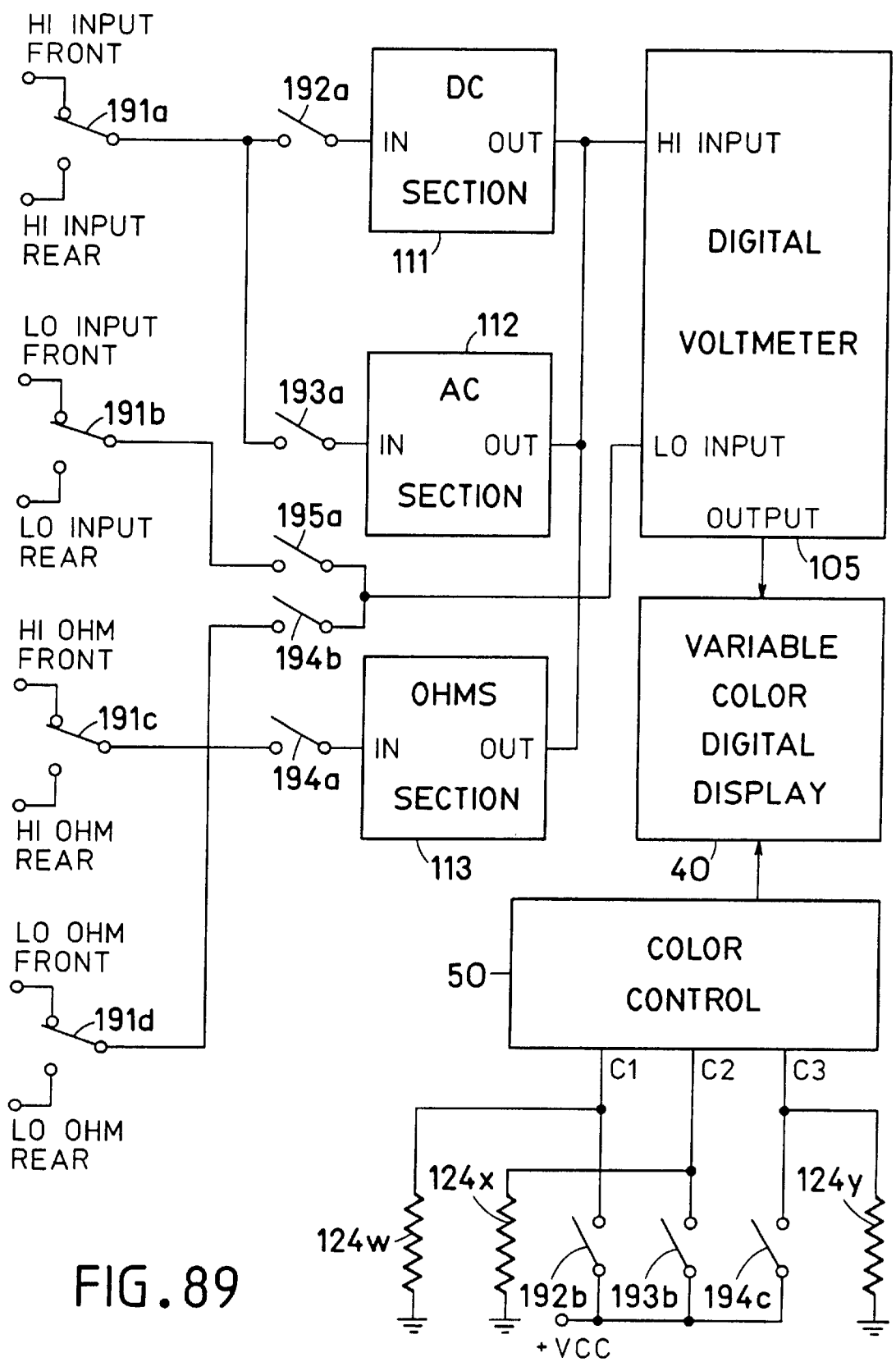
FIG. 89 is an expanded block diagram of a variable color digital multimeter for indicating DC, AC, and OHMS measurements in respectively different colors.

In FIG. 89 is shown a like block diagram of a digital multimeter for selectively performing DC, AC, and OHMS measurements and for indicating measured values in digital format and in respectively different colors. To perform DC measurements, DC relay 192 is energized, e.g., by actuating DC V key 118*a* on the front panel of the multimeter, to connect the HI INPUT terminal, via contact 191*a* and closed contact 192*a*, and via DC section 111, to the HI input of digital voltmeter 105. Simultaneously, LO relay 195 is energized to connect the LO INPUT terminal, via contact 191*b* and closed contact 195*a*, to the LO input of digital voltmeter 105. Measured DC values of the input signal are indicated on display 40 in digital format, in a manner well understood by those skilled in the art. The invention resides in the provision of a relay contact 192*b*, associated with contact 192*a*, to apply a high logic level to the input C1 of color control 50, to cause display 40 to illuminate in the color C1 (e.g., red).

To perform AC measurements, AC relay 193 is energized, e.g., by actuating AC V key 118*b* on the front panel of the multimeter, to connect the HI INPUT terminal, via contact 191*a* and closed contact 193*a*, and via AC section 112, to the HI input of digital voltmeter 105. Simultaneously, LO relay 195 is energized to connect the LO INPUT terminal to the LO input of digital voltmeter 105. Measured AC values of the input signal are indicated on display 40 in digital format, in a manner well understood. The relay contact 193*b*, associated with contact 193*a*, closes when relay 193 is energized, to apply a high logic level to the input C2 of color control 50, to cause display 40 to illuminate in the color C2 (e.g., yellow).

To perform OHMS measurements, the OHMS relay 124 is energized, e.g., by actuating OHMS key 118c on the front panel of the multimeter, to connect the HI OHM terminal, via closed contact 194a, and via OHMS section 113, to the HI input of digital voltmeter 105. The LO OHM terminal is connected, via closed contact 194 b, to the LO input of digital voltmeter 105. Measured resistance values are indicated on display 40 in digital format, in a manner well known. The relay contact 194c, associated with contacts 194a and 194b, closes when relay 194 is energized, to apply a high logic level to the input C3 of color control 50, to cause display 40 to illuminate in the color C3 (e.g., green).

Figure 90:
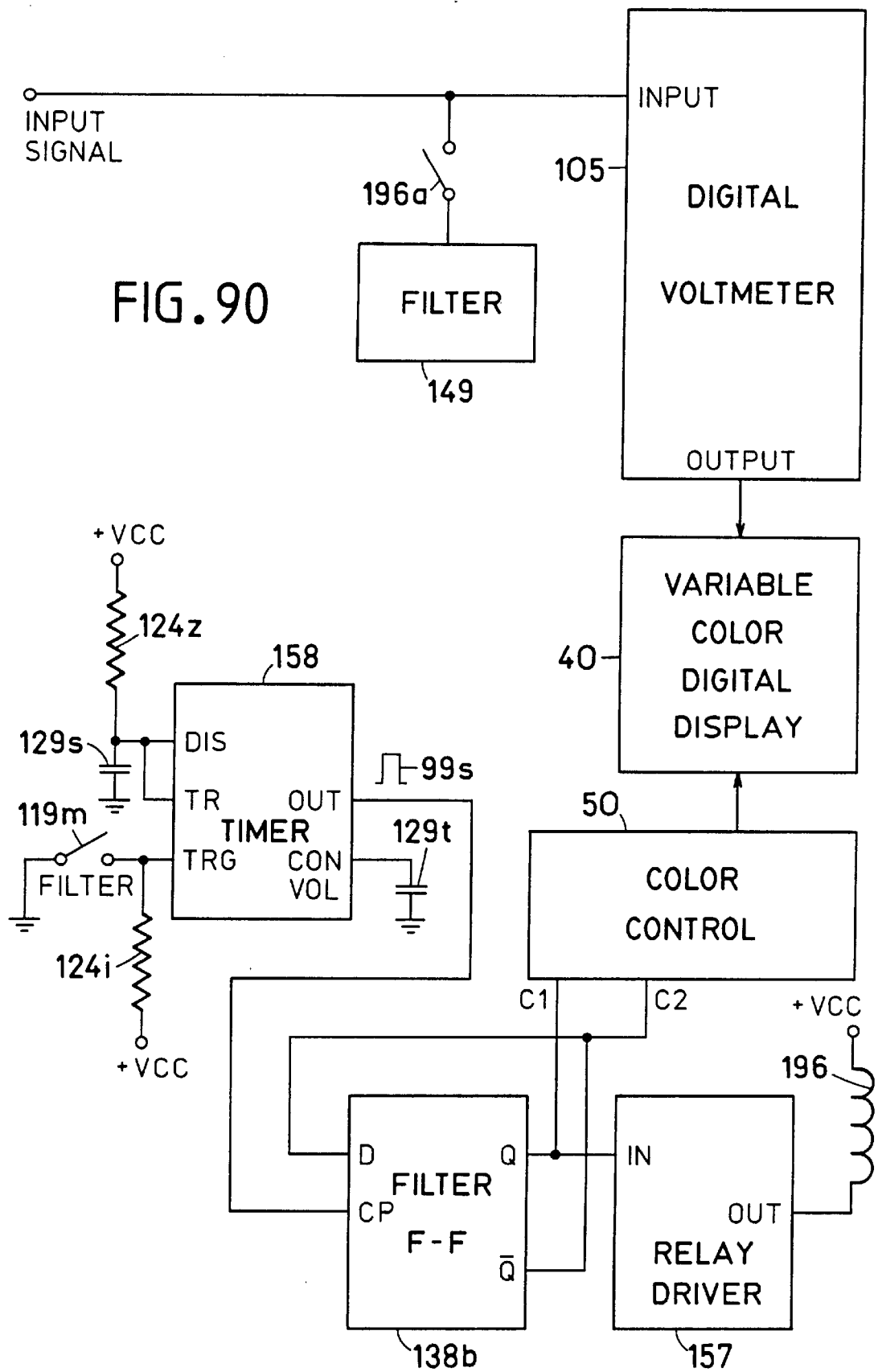
FIG. 90 is an expanded block diagram of a variable color digital multimeter for indicating measurements with filter and without filter in different colors.

The digital voltmeter shown in FIG. 90 may be set to its filter mode wherein the measured signal is filtered to remove high frequency noise. The invention resides in the addition of a filter flip-flop 138b for activating color control 50 to illuminate display 40 in the color C1 for the filter mode turned on and in the color C2 for the filter mode turned off. The filter mode may be turned on and off by actuating FILTER key 118m, to toggle filter flip-flop 138b. When FILTER key 118m is actuated, its associated keyswitch 119m momentarily closes, to connect a low logic level to the trigger input TRG of a timer 158, which is normally tied to a high logic level via its pull-up resistor 124i, to produce at the timer's output OUT a relatively short positive going pulse 99s, to trigger filter flip-flop 138b to its opposite state. The width of pulse 99s may be set by selecting suitable values of resistor 124z and capacitor 129s, to eliminate the problem of possible bouncing of keyswitch 119m. When flip-flop 138b is in its set condition, its output Q, which is connected to the input of a relay driver 157, rises to a high logic level to activate the latter for energizing filter relay 196. The associated relay contact 196a closes to connect filter circuit 149 to the input of digital voltmeter 105. The outputs Q and $\overline{Q}$ of flip-flop 138b are respectively connected to the inputs C1 and C2 of color control 50 to cause display 40 to illuminate in a color in accordance with the condition of flip-flop 138b.

In brief summary, the invention describes a variable color display system for exhibiting a display unit in a color in accordance with the value of a limit. The color of the exhibited display unit is controlled substantially continuously by applying color control signals to the color control input, in accordance with the value of the limit.

It would be obvious that numerous modifications can be made in the construction of the preferred embodiments shown herein, without departing from the spirit of the invention as defined in the appended claims. It is contemplated that the principles of the invention may be also applied to numerous diverse types of display devices, such as luminescent display devices, liquid crystal display devices, plasma display devices, cathode ray tube devices, or the like.

CORRELATION TABLE
This is a correlation table of reference characters used in the drawings herein, their descriptions, and examples of commercially available parts

| # | DESCRIPTION | EXAMPLE |
|---|---|---|
| 1 | display segment | |
| 2 | red LED | |
| 3 | green LED | |
| 4 | blue LED | |
| 5 | red bus | |
| 6 | green bus | |

-continued

CORRELATION TABLE
This is a correlation table of reference characters used in the drawings herein, their descriptions, and examples of commercially available parts

| # | DESCRIPTION | EXAMPLE |
|---|---|---|
| 7 | blue bus | |
| 10 | device developing electric signals | |
| 11 | analog voltage source | |
| 12 | digital device | |
| 15 | segment body | |
| 16 | light scattering material | |
| 20 | decoder | |
| 21 | digital decoder driver | |
| 22 | 7-segment display decoder driver | |
| 23 | common cathode 7-segment decoder driver | 74LS49 |
| 24 | common anode 7-segment decoder driver | 74LS47 |
| 30 | monochromatic digital display | |
| 40 | variable color digital display | |
| 41 | multiplexed variable color display | |
| 42 | variable color 7-segment display element (2 LEDs) | |
| 43 | variable color 7-segment display element (3 LEDs) | |
| 46 | variable color display element (2 LEDs) | |
| 47 | variable color display element (3 LEDs) | |
| 48 | 3½ digit variable color display | |
| 49 | 6½ digit variable color 7-segment display | |
| 50 | color control | |
| 51 | step variable color control | |
| 52 | color control (2 LEDs) | |
| 53 | color control (3 LEDs) | |
| 55 | color converter | |
| 56 | continuously variable color converter | |
| 57 | 2-primary color converter | |
| 58 | 3-primary color converter | |
| 59 | single color converter | |
| 60 | 2-input OR gate | 74HC32 |
| 61 | 4-input OR gate | 4072 |
| 62 | non-inverting buffer | 74LS244 |
| 63 | inverting buffer | 74LS240 |
| 64 | inverter | part of 74LS240,4 |
| 65 | inverter | 74HC04 |
| 66 | 2-input AND gate | 74HC08 |
| 67 | priority encoder | 74HC147 |
| 68 | 3-to-8 line decoder | 74HC138 |
| 69 | logic circuit | |
| 71 | 8-bit counter | 74F579 |
| 73 | D type flip-flop | 74HC74 |
| 74 | A/D converter | |
| 75 | 8-bit A/D converter | AD570 |
| 76 | memory | |
| 77 | 2k × 8 bit PROM | 2716 |
| 80 | scaling circuit | |
| 81 | op amp | LM741 |
| 82 | analog comparator | LM339 |
| 85 | signal converter | |
| 90 | resistor | |
| 91 | resistor | |
| 92 | potentiometer | |
| 93 | capacitor | |
| 99 | pulse | |
| 101 | multimeter | |
| 102 | multimeter with multiplexed outputs | |
| 103 | digital multimeter | |
| 105 | digital voltmeter | |
| 106 | A/D converter | |
| 107 | Teledyne DVM chip | TSC8750 |
| 108 | Teledyne DVM chip | TSC7107 |
| 109 | Intersil DVM chip | ILS7107 |
| 111 | DC section | |
| 112 | AC section | |
| 113 | OHMS section | |
| 115 | control section | |
| 116 | measuring terminal | |
| 117 | keyboard | |
| 118 | key | |
| 119 | keyswitch | |
| 120 | input conditioning | |
| 121 | selector | |
| 123 | rotary switch | |

-continued

CORRELATION TABLE
This is a correlation table of reference characters used in the drawings herein, their descriptions, and examples of commercially available parts

| # | DESCRIPTION | EXAMPLE |
|---|---|---|
| 124 | resistor | |
| 125 | resistor | |
| 126 | precision resistor | |
| 127 | potentiometer | |
| 128 | signal diode | 1N4148 |
| 129 | capacitor | |
| 131 | memory | |
| 132 | 8-bit wide memory | |
| 134 | 8-bit latch | 74HC273 |
| 135 | error memory | |
| 136 | color memory | |
| 138 | D-type flip-flop | 74HC74 |
| 141 | comparator | |
| 142 | 4-bit digital comparator | 74HC85 |
| 143 | 8-bit digital comparator | |
| 144 | memory & comparator | |
| 145 | registered comparator | 74F524 |
| 146 | 8-channel digital multiplexer | 74HC151 |
| 147 | analog multiplexer | 4051 |
| 148 | clock | |
| 149 | filter | |
| 150 | logic circuit | |
| 151 | inverter | 74HC04 |
| 152 | 2-input OR gate | 74HC32 |
| 154 | 8-input OR/NOR gate | 74HC4078 |
| 155 | 2-input AND gate | 74HC08 |
| 156 | 3-input AND gate | 74HC11 |
| 157 | relay driver | 1416 |
| 158 | timer | NE555 |
| 159 | op amp | LM741 |
| 161 | counter | |
| 162 | 4-bit binary counter | 74HC161 |
| 163 | 8-bit binary counter | 74F579 |
| 164 | 3-decade counter | 14553 |
| 165 | decoder | |
| 166 | 1-to-8 lines decoder | 74HC138 |
| 167 | display controller | ICM7218A |
| 168 | microprocessor | 8085 |
| 169 | remote control | |
| 172 | temperature transducer | |
| 173 | pressure transducer | |
| 174 | physiological transducer | |
| 176 | SenSym pressure transducer | LX1802AN |
| 177 | Kelvin temperature transducer | |
| 178 | Celsius temperature transducer | LM35 |
| 179 | Fahrenheit temperature transducer | LM34 |
| 181 | RMS to DC converter | |
| 182 | RMS converter chip | AD536A |
| 183 | crest factor converter | |
| 185 | peak detector | |
| 186 | peak detector chip | PKD-01 |
| 187 | ratio producing circuit | |
| 188 | precision divider chip | AD535 |
| 191 | front/rear relay | JDT21 |
| 192 | DC section relay | JDT7 |
| 193 | AC section relay | JDT7 |
| 194 | OHMS section relay | JDT15 |
| 195 | LO input relay | JWD-107 |
| 196 | filter relay | JWD-107 |
| 199 | pulse | |

The examples of commercially available components should be considered as merely illustrative. It will be appreciated that other components may be readily and effectively used. The integrated circuits used in the description of the invention are manufactured by several well known companies, such are Analog Devices, Inc., Fairchild Camera and Instrument Corporation, Intel Corporation, Intersil, Inc., Motorola Semiconductor Products Inc., National Semiconductor Incorporated, Precision Monolithics Incorporated, Teledyne Semiconductor, Texas Instruments Inc., etc.

TABLE 1

DATA PORTIONS

| Input Voltage (Volts) | PROM Address (Hex) | 'Red' PROM (Hex) | red | green |
|---|---|---|---|---|
| 0.0 | 00 | 00 | 0.0 | 1.0 |
| 0.039 | 01 | 00 | 0.0 | 1.0 |
| 0.078 | 02 | 00 | 0.0 | 1.0 |
| 0.117 | 03 | 00 | 0.0 | 1.0 |
| 0.156 | 04 | 00 | 0.0 | 1.0 |
| 0.195 | 05 | 00 | 0.0 | 1.0 |
| 0.234 | 06 | 00 | 0.0 | 1.0 |
| 0.273 | 07 | 00 | 0.0 | 1.0 |
| 0.312 | 08 | 00 | 0.0 | 1.0 |
| 0.352 | 09 | 00 | 0.0 | 1.0 |
| 0.391 | 0A | 00 | 0.0 | 1.0 |
| 0.430 | 0B | 00 | 0.0 | 1.0 |
| 0.469 | 0C | 00 | 0.0 | 1.0 |
| 0.508 | 0D | 00 | 0.0 | 1.0 |
| 0.547 | 0E | 00 | 0.0 | 1.0 |
| 0.586 | 0F | 00 | 0.0 | 1.0 |
| 0.625 | 10 | 40 | 0.25 | 0.75 |
| 0.664 | 11 | 40 | 0.25 | 0.75 |
| 0.703 | 12 | 40 | 0.25 | 0.75 |
| 0.742 | 13 | 40 | 0.25 | 0.75 |
| 0.781 | 14 | 40 | 0.25 | 0.75 |
| 0.820 | 15 | 40 | 0.25 | 0.75 |
| 0.859 | 16 | 40 | 0.25 | 0.75 |
| 0.898 | 17 | 40 | 0.25 | 0.75 |
| 0.937 | 18 | 40 | 0.25 | 0.75 |
| 0.977 | 19 | 40 | 0.25 | 0.75 |
| 1.016 | 1A | 40 | 0.25 | 0.75 |
| 1.055 | 1B | 40 | 0.25 | 0.75 |
| 1.094 | 1C | 40 | 0.25 | 0.75 |
| 1.133 | 1D | 40 | 0.25 | 0.75 |
| 1.172 | 1E | 40 | 0.25 | 0.75 |
| 1.211 | 1F | 40 | 0.25 | 0.75 |
| 1.250 | 20 | 80 | 0.5 | 0.5 |
| 1.289 | 21 | 80 | 0.5 | 0.5 |
| 1.328 | 22 | 80 | 0.5 | 0.5 |
| 1.367 | 23 | 80 | 0.5 | 0.5 |
| 1.406 | 24 | 80 | 0.5 | 0.5 |
| 1.445 | 25 | 80 | 0.5 | 0.5 |
| 1.484 | 26 | 80 | 0.5 | 0.5 |
| 1.523 | 27 | 80 | 0.5 | 0.5 |
| 1.562 | 28 | 80 | 0.5 | 0.5 |
| 1.602 | 29 | 80 | 0.5 | 0.5 |
| 1.641 | 2A | 80 | 0.5 | 0.5 |
| 1.680 | 2B | 80 | 0.5 | 0.5 |
| 1.719 | 2C | 80 | 0.5 | 0.5 |
| 1.758 | 2D | 80 | 0.5 | 0.5 |
| 1.797 | 2E | 80 | 0.5 | 0.5 |
| 1.836 | 2F | 80 | 0.5 | 0.5 |
| 1.875 | 30 | C0 | 0.75 | 0.25 |
| 1.914 | 31 | C0 | 0.75 | 0.25 |
| 1.953 | 32 | C0 | 0.75 | 0.25 |
| 1.992 | 33 | C0 | 0.75 | 0.25 |
| 2.031 | 34 | C0 | 0.75 | 0.25 |
| 2.070 | 35 | C0 | 0.75 | 0.25 |
| 2.109 | 36 | C0 | 0.75 | 0.25 |
| 2.148 | 37 | C0 | 0.75 | 0.25 |
| 2.187 | 38 | C0 | 0.75 | 0.25 |
| 2.227 | 39 | C0 | 0.75 | 0.25 |
| 2.266 | 3A | C0 | 0.75 | 0.25 |
| 2.305 | 3B | C0 | 0.75 | 0.25 |
| 2.344 | 3C | C0 | 0.75 | 0.25 |
| 2.389 | 3D | C0 | 0.75 | 0.25 |
| 2.422 | 3E | C0 | 0.75 | 0.25 |
| 2.461 | 3F | C0 | 0.75 | 0.25 |
| 2.500 | 40 | FF | 1.0 | 0.0 |
| 2.539 | 41 | FF | 1.0 | 0.0 |
| 2.578 | 42 | FF | 1.0 | 0.0 |
| 2.617 | 43 | FF | 1.0 | 0.0 |
| 2.656 | 44 | FF | 1.0 | 0.0 |
| 2.695 | 45 | FF | 1.0 | 0.0 |
| 2.734 | 46 | FF | 1.0 | 0.0 |
| 2.773 | 47 | FF | 1.0 | 0.0 |
| 2.812 | 48 | FF | 1.0 | 0.0 |

TABLE 1-continued

DATA PORTIONS

| Input Voltage (Volts) | PROM Address (Hex) | 'Red' PROM (Hex) | red | green |
|---|---|---|---|---|
| 2.852 | 49 | FF | 1.0 | 0.0 |
| 2.891 | 4A | FF | 1.0 | 0.0 |
| 2.930 | 4B | FF | 1.0 | 0.0 |
| 2.969 | 4C | FF | 1.0 | 0.0 |
| 3.008 | 4D | FF | 1.0 | 0.0 |
| 3.047 | 4E | FF | 1.0 | 0.0 |
| 3.086 | 4F | FF | 1.0 | 0.0 |
| 3.125 | 50 | 00 | 0.0 | 1.0 |
| 3.164 | 51 | 00 | 0.0 | 1.0 |
| 3.203 | 52 | 00 | 0.0 | 1.0 |
| 3.242 | 53 | 00 | 0.0 | 1.0 |
| 3.281 | 54 | 00 | 0.0 | 1.0 |
| 3.320 | 55 | 00 | 0.0 | 1.0 |
| 3.359 | 56 | 00 | 0.0 | 1.0 |
| 3.398 | 57 | 00 | 0.0 | 1.0 |
| 3.437 | 58 | 00 | 0.0 | 1.0 |
| 3.477 | 59 | 00 | 0.0 | 1.0 |
| 3.516 | 5A | 00 | 0.0 | 1.0 |
| 3.555 | 5B | 00 | 0.0 | 1.0 |
| 3.594 | 5C | 00 | 0.0 | 1.0 |
| 3.633 | 5D | 00 | 0.0 | 1.0 |
| 3.672 | 5E | 00 | 0.0 | 1.0 |
| 3.711 | 5F | 00 | 0.0 | 1.0 |
| 3.750 | 60 | 40 | 0.25 | 0.75 |
| 3.789 | 61 | 40 | 0.25 | 0.75 |
| 3.828 | 62 | 40 | 0.25 | 0.75 |
| 3.867 | 63 | 40 | 0.25 | 0.75 |
| 3.906 | 64 | 40 | 0.25 | 0.75 |
| 3.945 | 65 | 40 | 0.25 | 0.75 |
| 3.984 | 66 | 40 | 0.25 | 0.75 |
| 4.023 | 67 | 40 | 0.25 | 0.75 |
| 4.062 | 68 | 40 | 0.25 | 0.75 |
| 4.102 | 69 | 40 | 0.25 | 0.75 |
| 4.141 | 6A | 40 | 0.25 | 0.75 |
| 4.178 | 6B | 40 | 0.25 | 0.75 |
| 4.219 | 6C | 40 | 0.25 | 0.75 |
| 4.258 | 6D | 40 | 0.25 | 0.75 |
| 4.299 | 6E | 40 | 0.25 | 0.75 |
| 4.336 | 6F | 40 | 0.25 | 0.75 |
| 4.375 | 70 | 80 | 0.5 | 0.5 |
| 4.414 | 71 | 80 | 0.5 | 0.5 |
| 4.453 | 72 | 80 | 0.5 | 0.5 |
| 4.492 | 73 | 80 | 0.5 | 0.5 |
| 4.531 | 74 | 80 | 0.5 | 0.5 |
| 4.570 | 75 | 80 | 0.5 | 0.5 |
| 4.609 | 76 | 80 | 0.5 | 0.5 |
| 4.648 | 77 | 80 | 0.5 | 0.5 |
| 4.687 | 78 | 80 | 0.5 | 0.5 |
| 4.727 | 79 | 80 | 0.5 | 0.5 |
| 4.766 | 7A | 80 | 0.5 | 0.5 |
| 4.805 | 7B | 80 | 0.5 | 0.5 |
| 4.844 | 7C | 80 | 0.5 | 0.5 |
| 4.883 | 7D | 80 | 0.5 | 0.5 |
| 4.922 | 7E | 80 | 0.5 | 0.5 |
| 4.961 | 7F | 80 | 0.5 | 0.5 |
| 5.000 | 80 | C0 | 0.75 | 0.25 |
| 5.039 | 81 | C0 | 0.75 | 0.25 |
| 5.078 | 82 | C0 | 0.75 | 0.25 |
| 5.117 | 83 | C0 | 0.75 | 0.25 |
| 5.156 | 84 | C0 | 0.75 | 0.25 |
| 5.195 | 85 | C0 | 0.75 | 0.25 |
| 5.234 | 86 | C0 | 0.75 | 0.25 |
| 5.273 | 87 | C0 | 0.75 | 0.25 |
| 5.312 | 88 | C0 | 0.75 | 0.25 |
| 5.352 | 89 | C0 | 0.75 | 0.25 |
| 5.391 | 8A | C0 | 0.75 | 0.25 |
| 5.430 | 8B | C0 | 0.75 | 0.25 |
| 5.469 | 8C | C0 | 0.75 | 0.25 |
| 5.508 | 8D | C0 | 0.75 | 0.25 |
| 5.547 | 8E | C0 | 0.75 | 0.25 |
| 5.586 | 8F | C0 | 0.75 | 0.25 |
| 5.625 | 90 | FF | 1.0 | 0.0 |
| 5.664 | 91 | FF | 1.0 | 0.0 |
| 5.703 | 92 | FF | 1.0 | 0.0 |
| 5.742 | 93 | FF | 1.0 | 0.0 |
| 5.781 | 94 | FF | 1.0 | 0.0 |
| 5.820 | 95 | FF | 1.0 | 0.0 |
| 5.859 | 96 | FF | 1.0 | 0.0 |
| 5.898 | 97 | FF | 1.0 | 0.0 |
| 5.937 | 98 | FF | 1.0 | 0.0 |
| 5.977 | 99 | FF | 1.0 | 0.0 |
| 6.016 | 9A | FF | 1.0 | 0.0 |
| 6.055 | 9B | FF | 1.0 | 0.0 |
| 6.094 | 9C | FF | 1.0 | 0.0 |
| 6.133 | 9D | FF | 1.0 | 0.0 |
| 6.172 | 9E | FF | 1.0 | 0.0 |
| 6.211 | 9F | FF | 1.0 | 0.0 |
| 6.250 | A0 | 00 | 0.0 | 1.0 |
| 6.289 | A1 | 00 | 0.0 | 1.0 |
| 6.328 | A2 | 00 | 0.0 | 1.0 |
| 6.367 | A3 | 00 | 0.0 | 1.0 |
| 6.406 | A4 | 00 | 0.0 | 1.0 |
| 6.445 | A5 | 00 | 0.0 | 1.0 |
| 6.484 | A6 | 00 | 0.0 | 1.0 |
| 6.524 | A7 | 00 | 0.0 | 1.0 |
| 6.562 | A8 | 00 | 0.0 | 1.0 |
| 6.602 | A9 | 00 | 0.0 | 1.0 |
| 6.641 | AA | 00 | 0.0 | 1.0 |
| 6.680 | AB | 00 | 0.0 | 1.0 |
| 6.719 | AC | 00 | 0.0 | 1.0 |
| 6.758 | AD | 00 | 0.0 | 1.0 |
| 6.797 | AE | 00 | 0.0 | 1.0 |
| 6.836 | AF | 00 | 0.0 | 1.0 |
| 6.875 | B0 | 40 | 0.25 | 0.75 |
| 6.914 | B1 | 40 | 0.25 | 0.75 |
| 6.953 | B2 | 40 | 0.25 | 0.75 |
| 6.992 | B3 | 40 | 0.25 | 0.75 |
| 7.031 | B4 | 40 | 0.25 | 0.75 |
| 7.070 | B5 | 40 | 0.25 | 0.75 |
| 7.109 | B6 | 40 | 0.25 | 0.75 |
| 7.148 | B7 | 40 | 0.25 | 0.75 |
| 7.187 | B8 | 40 | 0.25 | 0.75 |
| 7.227 | B9 | 40 | 0.25 | 0.75 |
| 7.266 | BA | 40 | 0.25 | 0.75 |
| 7.305 | BB | 40 | 0.25 | 0.75 |
| 7.344 | BC | 40 | 0.25 | 0.75 |
| 7.383 | BD | 40 | 0.25 | 0.75 |
| 7.422 | BE | 40 | 0.25 | 0.75 |
| 7.461 | BF | 40 | 0.25 | 0.75 |
| 7.500 | C0 | 80 | 0.5 | 0.5 |
| 7.539 | C1 | 80 | 0.5 | 0.5 |
| 7.587 | C2 | 80 | 0.5 | 0.5 |
| 7.617 | C3 | 80 | 0.5 | 0.5 |
| 7.656 | C4 | 80 | 0.5 | 0.5 |
| 7.695 | C5 | 80 | 0.5 | 0.5 |
| 7.734 | C6 | 80 | 0.5 | 0.5 |
| 7.773 | C7 | 80 | 0.5 | 0.5 |
| 7.812 | C8 | 80 | 0.5 | 0.5 |
| 7.852 | C9 | 80 | 0.5 | 0.5 |
| 7.891 | CA | 80 | 0.5 | 0.5 |
| 7.930 | CB | 80 | 0.5 | 0.5 |
| 7.969 | CC | 80 | 0.5 | 0.5 |
| 8.008 | CD | 80 | 0.5 | 0.5 |
| 8.047 | CE | 80 | 0.5 | 0.5 |
| 8.086 | CF | 80 | 0.5 | 0.5 |
| 8.125 | D0 | C0 | 0.75 | 0.25 |
| 8.164 | D1 | C0 | 0.75 | 0.25 |
| 8.203 | D2 | C0 | 0.75 | 0.25 |
| 8.242 | D3 | C0 | 0.75 | 0.25 |
| 8.281 | D4 | C0 | 0.75 | 0.25 |
| 8.320 | D5 | C0 | 0.75 | 0.25 |
| 8.359 | D6 | C0 | 0.75 | 0.25 |
| 8.398 | D7 | C0 | 0.75 | 0.25 |
| 8.437 | D8 | C0 | 0.75 | 0.25 |
| 8.477 | D9 | C0 | 0.75 | 0.25 |
| 8.516 | DA | C0 | 0.75 | 0.25 |

TABLE 1-continued

DATA PORTIONS

| Input Voltage (Volts) | PROM Address (Hex) | 'Red' PROM (Hex) | red | green |
|---|---|---|---|---|
| 8.555 | DB | C0 | 0.75 | 0.25 |
| 8.594 | DC | C0 | 0.75 | 0.25 |
| 8.633 | DD | C0 | 0.75 | 0.25 |
| 8.672 | DE | C0 | 0.75 | 0.25 |
| 8.711 | DF | C0 | 0.75 | 0.25 |
| 8.750 | E0 | FF | 1.0 | 0.0 |
| 8.789 | E1 | FF | 1.0 | 0.0 |
| 8.828 | E2 | FF | 1.0 | 0.0 |
| 8.867 | E3 | FF | 1.0 | 0.0 |
| 8.906 | E4 | FF | 1.0 | 0.0 |
| 8.945 | E5 | FF | 1.0 | 0.0 |
| 8.984 | E6 | FF | 1.0 | 0.0 |
| 9.023 | E7 | FF | 1.0 | 0.0 |
| 9.062 | E8 | FF | 1.0 | 0.0 |
| 9.102 | E9 | FF | 1.0 | 0.0 |
| 9.141 | EA | FF | 1.0 | 0.0 |
| 9.180 | EB | FF | 1.0 | 0.0 |
| 9.219 | EC | FF | 1.0 | 0.0 |
| 9.258 | ED | FF | 1.0 | 0.0 |
| 9.299 | EE | FF | 1.0 | 0.0 |
| 9.336 | EF | FF | 1.0 | 0.0 |
| 9.375 | F0 | 00 | 0.0 | 1.0 |
| 9.414 | F1 | 00 | 0.0 | 1.0 |
| 9.453 | F2 | 00 | 0.0 | 1.0 |
| 9.492 | F3 | 00 | 0.0 | 1.0 |
| 9.531 | F4 | 00 | 0.0 | 1.0 |
| 9.570 | F5 | 00 | 0.0 | 1.0 |
| 9.609 | F6 | 00 | 0.0 | 1.0 |
| 9.648 | F7 | 00 | 0.0 | 1.0 |
| 9.687 | F8 | 00 | 0.0 | 1.0 |
| 9.727 | F9 | 00 | 0.0 | 1.0 |
| 9.766 | FA | 00 | 0.0 | 1.0 |
| 9.805 | FB | 00 | 0.0 | 1.0 |
| 9.844 | FC | 00 | 0.0 | 1.0 |
| 9.883 | FD | 00 | 0.0 | 1.0 |
| 9.922 | FE | 00 | 0.0 | 1.0 |
| 9.961 | FF | 00 | 0.0 | 1.0 |

TABLE 2

| Input Voltage (Volts) | PROM Address (Hex) | 'Red' PROM (Hex) | 'Green' PROM (Hex) | 'Blue' PROM (Hex) | PORTIONS red | green | blue |
|---|---|---|---|---|---|---|---|
| 0.0 | 00 | FF | 00 | 00 | 1.0 | 0.0 | 0.0 |
| 0.039 | 01 | FE | 02 | 00 | 0.992 | 0.008 | 0.0 |
| 0.078 | 02 | FC | 04 | 00 | 0.984 | 0.016 | 0.0 |
| 0.117 | 03 | FA | 06 | 00 | 0.976 | 0.024 | 0.0 |
| 0.156 | 04 | F8 | 08 | 00 | 0.969 | 0.031 | 0.0 |
| 0.195 | 05 | F6 | 0A | 00 | 0.961 | 0.039 | 0.0 |
| 0.234 | 06 | F4 | 0C | 00 | 0.953 | 0.047 | 0.0 |
| 0.273 | 07 | F2 | 0E | 00 | 0.945 | 0.055 | 0.0 |
| 0.312 | 08 | F0 | 10 | 00 | 0.937 | 0.063 | 0.0 |
| 0.352 | 09 | EE | 12 | 00 | 0.930 | 0.070 | 0.0 |
| 0.391 | 0A | EC | 14 | 00 | 0.922 | 0.078 | 0.0 |
| 0.430 | 0B | EA | 16 | 00 | 0.914 | 0.086 | 0.0 |
| 0.469 | 0C | E8 | 18 | 00 | 0.906 | 0.094 | 0.0 |
| 0.508 | 0D | E6 | 1A | 00 | 0.899 | 0.101 | 0.0 |
| 0.547 | 0E | E4 | 1C | 00 | 0.891 | 0.109 | 0.0 |
| 0.586 | 0F | E2 | 1E | 00 | 0.883 | 0.117 | 0.0 |
| 0.625 | 10 | E0 | 20 | 00 | 0.875 | 0.125 | 0.0 |
| 0.664 | 11 | DE | 22 | 00 | 0.867 | 0.133 | 0.0 |
| 0.703 | 12 | DC | 24 | 00 | 0.859 | 0.141 | 0.0 |
| 0.742 | 13 | DA | 26 | 00 | 0.851 | 0.149 | 0.0 |
| 0.781 | 14 | D8 | 28 | 00 | 0.844 | 0.156 | 0.0 |
| 0.820 | 15 | D6 | 2A | 00 | 0.836 | 0.164 | 0.0 |
| 0.859 | 16 | D4 | 2C | 00 | 0.828 | 0.172 | 0.0 |

TABLE 2-continued

DATA

| Input Voltage (Volts) | PROM Address (Hex) | 'Red' PROM (Hex) | 'Green' PROM (Hex) | 'Blue' PROM (Hex) | PORTIONS red | green | blue |
|---|---|---|---|---|---|---|---|
| 0.898 | 17 | D2 | 2E | 00 | 0.820 | 0.180 | 0.0 |
| 0.937 | 18 | D0 | 30 | 00 | 0.812 | 0.188 | 0.0 |
| 0.977 | 19 | CE | 32 | 00 | 0.804 | 0.196 | 0.0 |
| 1.016 | 1A | CC | 34 | 00 | 0.796 | 0.204 | 0.0 |
| 1.055 | 1B | CA | 36 | 00 | 0.788 | 0.212 | 0.0 |
| 1.094 | 1C | C8 | 38 | 00 | 0.781 | 0.219 | 0.0 |
| 1.133 | 1D | C6 | 3A | 00 | 0.773 | 0.227 | 0.0 |
| 1.172 | 1E | C4 | 3C | 00 | 0.766 | 0.234 | 0.0 |
| 1.211 | 1F | C2 | 3E | 00 | 0.758 | 0.242 | 0.0 |
| 1.250 | 20 | C0 | 40 | 00 | 0.75 | 0.25 | 0.0 |
| 1.289 | 21 | BE | 42 | 00 | 0.742 | 0.258 | 0.0 |
| 1.328 | 22 | BC | 44 | 00 | 0.734 | 0.266 | 0.0 |
| 1.367 | 23 | BA | 46 | 00 | 0.726 | 0.274 | 0.0 |
| 1.406 | 24 | B8 | 48 | 00 | 0.719 | 0.281 | 0.0 |
| 1.445 | 25 | B6 | 4A | 00 | 0.711 | 0.289 | 0.0 |
| 1.484 | 26 | B4 | 4C | 00 | 0.703 | 0.297 | 0.0 |
| 1.523 | 27 | B2 | 4E | 00 | 0.695 | 0.305 | 0.0 |
| 1.562 | 28 | B0 | 50 | 00 | 0.687 | 0.313 | 0.0 |
| 1.602 | 29 | AE | 52 | 00 | 0.680 | 0.320 | 0.0 |
| 1.641 | 2A | AC | 54 | 00 | 0.672 | 0.328 | 0.0 |
| 1.680 | 2B | AA | 56 | 00 | 0.664 | 0.336 | 0.0 |
| 1.719 | 2C | A8 | 58 | 00 | 0.656 | 0.344 | 0.0 |
| 1.758 | 2D | A6 | 5A | 00 | 0.648 | 0.352 | 0.0 |
| 1.797 | 2E | A4 | 5C | 00 | 0.641 | 0.359 | 0.0 |
| 1.836 | 2F | A2 | 5E | 00 | 0.633 | 0.367 | 0.0 |
| 1.875 | 30 | A0 | 60 | 00 | 0.625 | 0.375 | 0.0 |
| 1.914 | 31 | 9E | 62 | 00 | 0.613 | 0.383 | 0.0 |
| 1.953 | 32 | 9C | 64 | 00 | 0.609 | 0.391 | 0.0 |
| 1.992 | 33 | 9A | 66 | 00 | 0.602 | 0.398 | 0.0 |
| 2.031 | 34 | 98 | 68 | 00 | 0.594 | 0.406 | 0.0 |
| 2.070 | 35 | 96 | 6A | 00 | 0.586 | 0.414 | 0.0 |
| 2.109 | 36 | 94 | 6C | 00 | 0.578 | 0.422 | 0.0 |
| 2.148 | 37 | 92 | 6E | 00 | 0.570 | 0.430 | 0.0 |
| 2.187 | 38 | 90 | 70 | 00 | 0.562 | 0.438 | 0.0 |
| 2.227 | 39 | 8E | 72 | 00 | 0.554 | 0.446 | 0.0 |
| 2.266 | 3A | 8C | 74 | 00 | 0.547 | 0.453 | 0.0 |
| 2.305 | 3B | 8A | 76 | 00 | 0.539 | 0.461 | 0.0 |
| 2.344 | 3C | 88 | 78 | 00 | 0.531 | 0.469 | 0.0 |
| 2.389 | 3D | 86 | 7A | 00 | 0.524 | 0.476 | 0.0 |
| 2.422 | 3E | 84 | 7C | 00 | 0.516 | 0.484 | 0.0 |
| 2.461 | 3F | 82 | 7E | 00 | 0.508 | 0.492 | 0.0 |
| 2.500 | 40 | 80 | 80 | 00 | 0.5 | 0.5 | 0.0 |
| 2.539 | 41 | 7C | 84 | 00 | 0.484 | 0.516 | 0.0 |
| 2.578 | 42 | 78 | 88 | 00 | 0.469 | 0.531 | 0.0 |
| 2.617 | 43 | 74 | 8C | 00 | 0.453 | 0.547 | 0.0 |
| 2.656 | 44 | 70 | 90 | 00 | 0.437 | 0.563 | 0.0 |
| 2.695 | 45 | 6C | 94 | 00 | 0.422 | 0.578 | 0.0 |
| 2.734 | 46 | 68 | 98 | 00 | 0.406 | 0.594 | 0.0 |
| 2.773 | 47 | 64 | 9C | 00 | 0.391 | 0.609 | 0.0 |
| 2.812 | 48 | 60 | A0 | 00 | 0.375 | 0.625 | 0.0 |
| 2.852 | 49 | 5C | A4 | 00 | 0.359 | 0.641 | 0.0 |
| 2.891 | 4A | 58 | A8 | 00 | 0.344 | 0.656 | 0.0 |
| 2.930 | 4B | 54 | AC | 00 | 0.328 | 0.672 | 0.0 |
| 2.969 | 4C | 50 | B0 | 00 | 0.312 | 0.688 | 0.0 |
| 3.008 | 4D | 4C | B4 | 00 | 0.297 | 0.703 | 0.0 |
| 3.047 | 4E | 48 | B8 | 00 | 0.281 | 0.719 | 0.0 |
| 3.086 | 4F | 44 | BC | 00 | 0.266 | 0.734 | 0.0 |
| 3.125 | 50 | 40 | C0 | 00 | 0.25 | 0.75 | 0.0 |
| 3.164 | 51 | 3C | C4 | 00 | 0.234 | 0.766 | 0.0 |
| 3.203 | 52 | 38 | C8 | 00 | 0.219 | 0.781 | 0.0 |
| 3.242 | 53 | 34 | CC | 00 | 0.203 | 0.797 | 0.0 |
| 3.281 | 54 | 30 | D0 | 00 | 0.187 | 0.813 | 0.0 |
| 3.320 | 55 | 2C | D4 | 00 | 0.172 | 0.828 | 0.0 |
| 3.359 | 56 | 28 | D8 | 00 | 0.156 | 0.844 | 0.0 |
| 3.398 | 57 | 24 | DC | 00 | 0.141 | 0.859 | 0.0 |
| 3.437 | 58 | 20 | E0 | 00 | 0.125 | 0.875 | 0.0 |
| 3.477 | 59 | 1C | E4 | 00 | 0.109 | 0.891 | 0.0 |
| 3.516 | 5A | 18 | E8 | 00 | 0.094 | 0.906 | 0.0 |
| 3.555 | 5B | 14 | EC | 00 | 0.078 | 0.922 | 0.0 |
| 3.594 | 5C | 10 | F0 | 00 | 0.062 | 0.938 | 0.0 |
| 3.633 | SD | 0C | F4 | 00 | 0.047 | 0.953 | 0.0 |
| 3.672 | 5E | 08 | F8 | 00 | 0.031 | 0.967 | 0.0 |

TABLE 2-continued

| Input Voltage (Volts) | PROM Address (Hex) | 'Red' PROM (Hex) | 'Green' PROM (Hex) | 'Blue' PROM (Hex) | PORTIONS red | green | blue |
|---|---|---|---|---|---|---|---|
| 3.711 | 5F | 04 | FC | 00 | 0.016 | 0.984 | 0.0 |
| 3.750 | 60 | 00 | FF | 00 | 0.0 | 1.0 | 0.0 |
| 3.789 | 61 | 00 | F8 | 08 | 0.0 | 0.969 | 0.031 |
| 3.828 | 62 | 00 | F0 | 10 | 0.0 | 0.937 | 0.063 |
| 3.867 | 63 | 00 | E8 | 18 | 0.0 | 0.906 | 0.094 |
| 3.906 | 64 | 00 | E0 | 20 | 0.0 | 0.875 | 0.125 |
| 3.945 | 65 | 00 | D8 | 28 | 0.0 | 0.844 | 0.156 |
| 3.984 | 66 | 00 | D0 | 30 | 0.0 | 0.812 | 0.188 |
| 4.023 | 67 | 00 | C8 | 38 | 0.0 | 0.781 | 0.219 |
| 4.062 | 68 | 00 | C0 | 40 | 0.0 | 0.75 | 0.25 |
| 4.102 | 69 | 00 | B8 | 48 | 0.0 | 0.719 | 0.281 |
| 4.141 | 6A | 00 | B0 | 50 | 0.0 | 0.687 | 0.313 |
| 4.178 | 6B | 00 | A8 | 58 | 0.0 | 0.656 | 0.344 |
| 4.219 | 6C | 00 | A0 | 60 | 0.0 | 0.625 | 0.375 |
| 4.258 | 6D | 00 | 98 | 68 | 0.0 | 0.594 | 0.406 |
| 4.299 | 6E | 00 | 90 | 70 | 0.0 | 0.562 | 0.438 |
| 4.336 | 6F | 00 | 88 | 78 | 0.0 | 0.531 | 0.469 |
| 4.375 | 70 | 00 | 80 | 80 | 0.0 | 0.5 | 0.5 |
| 4.414 | 71 | 00 | 78 | 88 | 0.0 | 0.469 | 0.531 |
| 4.453 | 72 | 00 | 70 | 90 | 0.0 | 0.437 | 0.563 |
| 4.492 | 73 | 00 | 68 | 98 | 0.0 | 0.406 | 0.594 |
| 4.531 | 74 | 00 | 60 | A0 | 0.0 | 0.375 | 0.625 |
| 4.570 | 75 | 00 | 58 | A8 | 0.0 | 0.344 | 0.656 |
| 4.609 | 76 | 00 | 50 | B0 | 0.0 | 0.312 | 0.688 |
| 4.648 | 77 | 00 | 48 | B8 | 0.0 | 0.281 | 0.719 |
| 4.687 | 78 | 00 | 40 | C0 | 0.0 | 0.25 | 0.75 |
| 4.727 | 79 | 00 | 38 | C8 | 0.0 | 0.219 | 0.781 |
| 4.766 | 7A | 00 | 30 | D0 | 0.0 | 0.187 | 0.813 |
| 4.805 | 7B | 00 | 28 | D8 | 0.0 | 0.156 | 0.844 |
| 4.844 | 7C | 00 | 20 | E0 | 0.0 | 0.125 | 0.875 |
| 4.883 | 7D | 00 | 18 | E8 | 0.0 | 0.094 | 0.906 |
| 4.922 | 7E | 00 | 10 | F0 | 0.0 | 0.062 | 0.938 |
| 4.961 | 7F | 00 | 08 | F8 | 0.0 | 0.031 | 0.967 |
| 5.000 | 80 | 00 | 00 | FF | 0.0 | 0.0 | 1.0 |
| 5.039 | 81 | 04 | 00 | FC | 0.016 | 0.0 | 0.984 |
| 5.078 | 82 | 08 | 00 | F8 | 0.031 | 0.0 | 0.969 |
| 5.117 | 83 | 0C | 00 | F4 | 0.047 | 0.0 | 0.953 |
| 5.156 | 84 | 10 | 00 | F0 | 0.063 | 0.0 | 0.937 |
| 5.195 | 85 | 14 | 00 | EC | 0.078 | 0.0 | 0.922 |
| 5.234 | 86 | 18 | 00 | E8 | 0.094 | 0.0 | 0.906 |
| 5.273 | 87 | 1C | 00 | E4 | 0.109 | 0.0 | 0.89i |
| 5.312 | 88 | 20 | 00 | E0 | 0.125 | 0.0 | 0.875 |
| 5.352 | 89 | 24 | 00 | DC | 0.141 | 0.0 | 0.859 |
| 5.391 | 8A | 28 | 00 | D8 | 0.156 | 0.0 | 0.844 |
| 5.430 | 8B | 2C | 00 | D4 | 0.172 | 0.0 | 0.828 |
| 5.469 | 8C | 30 | 00 | D0 | 0.188 | 0.0 | 0.812 |
| 5.508 | 8D | 34 | 00 | CC | 0.2 | 0.0 | 0.8 |
| 5.547 | 8E | 38 | 00 | C8 | 0.219 | 0.0 | 0.781 |
| 5.586 | 8F | 3C | 00 | C4 | 0.234 | 0.0 | 0.766 |
| 5.625 | 90 | 40 | 00 | C0 | 0.25 | 0.0 | 0.75 |
| 5.664 | 91 | 44 | 00 | BC | 0.266 | 0.0 | 0.734 |
| 5.703 | 92 | 48 | 00 | B8 | 0.281 | 0.0 | 0.719 |
| 5.742 | 93 | 4C | 00 | B4 | 0.297 | 0.0 | 0.703 |
| 5.781 | 94 | 50 | 00 | B0 | 0.313 | 0.0 | 0.687 |
| 5.820 | 95 | 54 | 0G | AC | 0.328 | 0.0 | 0.672 |
| 5.859 | 96 | 58 | 00 | A8 | 0.344 | 0.0 | 0.656 |
| 5.898 | 97 | 5C | 00 | A4 | 0.359 | 0.0 | 0.641 |
| 5.937 | 98 | 60 | 00 | A0 | 0.375 | 0.0 | 0.625 |
| 5.977 | 99 | 64 | 00 | 9C | 0.391 | 0.0 | 0.609 |
| 6.016 | 9A | 68 | 00 | 98 | 0.406 | 0.0 | 0.594 |
| 6.055 | 9B | 6C | 00 | 94 | 0.422 | 0.0 | 0.578 |
| 6.094 | 9C | 70 | 00 | 90 | 0.438 | 0.0 | 0.562 |
| 6.133 | 9D | 74 | 00 | 8C | 0.453 | 0.0 | 0.547 |
| 6.172 | 9E | 78 | 00 | 88 | 0.469 | 0.0 | 0.531 |
| 6.211 | 9F | 7C | 00 | 84 | 0.484 | 0.0 | 0.516 |
| 6.250 | A0 | 80 | 00 | 80 | 0.5 | 0.0 | 0.5 |
| 6.289 | A1 | 84 | 00 | 7C | 0.516 | 0.0 | 0.484 |
| 6.328 | A2 | 88 | 00 | 78 | 0.531 | 0.0 | 0.469 |
| 6.367 | A3 | 8C | 00 | 74 | 0.547 | 0.0 | 0.453 |
| 6.406 | A4 | 90 | 00 | 70 | 0.563 | 0.0 | 0.437 |
| 6.445 | A5 | 94 | 00 | 6C | 0.578 | 0.0 | 0.422 |
| 6.484 | A6 | 98 | 00 | 68 | 0.594 | 0.0 | 0.406 |
| 6.524 | A7 | 9C | 00 | 64 | 0.609 | 0.0 | 0.391 |
| 6.562 | A8 | A0 | 00 | 60 | 0.625 | 0.0 | 0.375 |
| 6.602 | A9 | A4 | 00 | 5C | 0.641 | 0.0 | 0.359 |
| 6.641 | AA | A8 | 00 | 58 | 0.656 | 0.0 | 0.344 |
| 6.680 | AB | AC | 00 | 54 | 0.672 | 0.0 | 0.328 |
| 6.719 | AC | B0 | 00 | 50 | 0.688 | 0.0 | 0.312 |
| 6.758 | AD | B4 | 00 | 4C | 0.703 | 0.0 | 0.297 |
| 6.797 | AE | B8 | 00 | 48 | 0.719 | 0.0 | 0.281 |
| 6.836 | AF | BC | 00 | 44 | 0.734 | 0.0 | 0.266 |
| 6.875 | B0 | C0 | 00 | 40 | 0.75 | 0.0 | 0.25 |
| 6.914 | B1 | C4 | 00 | 3C | 0.766 | 0.0 | 0.234 |
| 6.953 | B2 | C8 | 00 | 38 | 0.781 | 0.0 | 0.219 |
| 6.992 | B3 | CC | 00 | 34 | 0.797 | 0.0 | 0.203 |
| 7.031 | B4 | D0 | 00 | 30 | 0.813 | 0.0 | 0.187 |
| 7.070 | B5 | D4 | 00 | 2C | 0.828 | 0.0 | 0.172 |
| 7.109 | B6 | D8 | 00 | 28 | 0.844 | 0.0 | 0.156 |
| 7.148 | B7 | DC | 00 | 24 | 0.859 | 0.0 | 0.141 |
| 7.187 | B8 | E0 | 00 | 20 | 0.875 | 0.0 | 0.125 |
| 7.227 | B9 | E4 | 00 | 1G | 0.891 | 0.0 | 0.109 |
| 7.266 | BA | E8 | 00 | 18 | 0.906 | 0.0 | 0.094 |
| 7.305 | BB | EC | 00 | 14 | 0.922 | 0.0 | 0.078 |
| 7.344 | BC | F0 | 00 | 10 | 0.938 | 0.0 | 0.062 |
| 7.383 | BD | F4 | 00 | 0C | 0.953 | 0.0 | 0.047 |
| 7.422 | BE | F8 | 00 | 08 | 0.967 | 0.0 | 0.031 |
| 7.461 | BF | FC | 00 | 04 | 0.984 | 0.0 | 0.016 |

What I claim is:

1. A variable color display device comprising:

means for repeatedly defining a cycle by developing a start signal at the beginning of each said cycle;

input means for receiving a plurality of data representing the portions of a plurality of primary colors;

means for accumulating, in response to said start signal, counts respectively proportional to said data, and for developing, when respective count is accumulated, a respective end of count signal;

a plurality of display areas arranged in a pattern for exhibiting, upon selective activation, a plurality of display units, each said display area including a plurality of light emitting diodes for emitting, when forwardly biased, light signals of respective primary colors, and means for combining said light signals in said display area to obtain a light signal of a composite color;

means for decoding including a decoder input, for receiving an input code defining a selected display unit, and a plurality of decoder outputs, said decoder outputs being coupled to said light emitting diodes in accordance with their positions in said pattern, said decoder outputs producing selective decoder output signals for selecting certain of said display areas, corresponding by their positions in said pattern to the selected display unit, in response to a specific input code;

bistable means including a plurality of bistable outputs, equal in number to the plurality of said primary colors and respectively associated therewith, each said bistable output developing an active signal in response to said start signal and an inactive signal in response to the respective end of count signal; and means for forwardly biasing certain ones of said light emitting diodes, in accordance with said decoder output signals, for emitting the portions of light signals of said primary colors, in accordance with said active signals, respectively.

2. A variable color display device comprising:

means for repeatedly defining a cycle including a predetermined number of pulses by developing a start signal at the beginning of each said cycle;

input means for receiving data representing the portions of a first primary color;

means for accumulating, in response to said start signal, a count proportional to said data, and for developing, when the count is accumulated, an end of count signal;

a plurality of display areas arranged in a pattern for exhibiting, upon selective activation, a plurality of display units, each said display area including a first light emitting diode for emitting, when forwardly biased, light signals of a first primary color, a second light emitting diode for emitting, when forwardly biased, light signals of a second primary color, and means for combining said light signals in said display area to obtain a light signal of a composite color;

means for decoding including a decoder input, for receiving an input code defining a selected display unit, and a plurality of decoder outputs, said decoder outputs being coupled to said light emitting diodes in accordance with their positions in said pattern, said decoder outputs producing selective decoder output signals for selecting certain of said display areas, corresponding by their positions in said pattern to the selected display unit, in response to a specific input code;

bistable means including a bistable output for developing an active signal in response to said start signal and an inactive signal in response to said end of count signal;

first means for forwardly biasing certain ones of said first light emitting diodes, in accordance with said decoder output signals, for causing them to emit the portions of light signals of said first primary color, in accordance with said active signal; and second means for forwardly biasing certain ones of said second light emitting diodes, in accordance with said decoder output signals, for causing them to emit the portions of light signals of said second primary color, in accordance with said inactive signal.

3. A variable color display device comprising:

means for repeatedly defining a cycle including a predetermined number of pulses by developing a start signal at the beginning of each said cycle;

input means for receiving data representing the portions of a first primary color;

means for accumulating, in response to said start signal, a count proportional to said data, and for developing, when the count is accumulated, an end of count signal;

a plurality of display areas arranged in a pattern for exhibiting, upon selective activation, a plurality of display units, each said display area including a first light emitting diode for emitting, when forwardly biased, light signals of a first primary color, a second light emitting diode for emitting, when forwardly biased, light signals of a second primary color, and means for combining said light signals in said display area to obtain a light signal of a composite color;

means for decoding including a decoder input, for receiving an input code defining a selected display unit, and a plurality of decoder outputs, said decoder outputs being coupled to said light emitting diodes in accordance with their positions in said pattern, said decoder outputs producing selective decoder output signals for selecting certain of said display areas, corresponding by their positions in said pattern to the selected display unit, in response to a specific input code;

bistable means including a true output and a complementary output, said true output being set to its active condition in response to said start signal and to its inactive condition in response to said end of count signal, and said complementary output being in the opposite condition;

first means for forwardly biasing certain ones of said first light emitting diodes, in accordance with said decoder output signals, for causing them to emit the portions of light signals of said first primary color, in accordance with said active condition of said true output; and second means for forwardly biasing certain ones of said second light emitting diodes, in accordance with said decoder output signals, for causing them to emit the portions of light signals of said second primary color, in accordance with active condition of said complementary output.

4. A variable color display device comprising:

means for repeatedly defining a cycle by developing a start signal at the beginning of each said cycle;

input means for receiving first data, representing the portions of a first primary color, second data, representing the portions of a second primary color, and third data, representing the portions of a third primary color;

means for accumulating, in response to said start signal, a first count proportional to said first data and for developing when said first count is accumulated a first end of count signal, a second count proportional to said second data and for developing when said second count is accumulated a second end of count signal, and a third count proportional to said third data and for developing when said third count is accumulated a third end of count signal;

a plurality of display areas arranged in a pattern for exhibiting, upon selective activation, a plurality of display units, each said display area including a first light emitting diode for emitting, when forwardly biased, light signals of a first primary color, a second light emitting diode for emitting, when forwardly biased, light signals of a second primary color, a third light emitting diode for emitting, when forwardly biased, light signals of a third primary color, and means for combining said light signals in said display area to obtain a light signal of a composite color;

means for decoding including a decoder input, for receiving an input code defining a selected display unit, and a plurality of decoder outputs, said decoder outputs being coupled to said light emitting diodes in accordance with their positions in said pattern, said decoder outputs producing selective decoder output signals for selecting certain of said display areas, corresponding by their positions in said pattern to the selected display unit, in response to a specific input code;

bistable means including a first bistable output for developing a first active signal in response to said start signal and an inactive signal in response to said first end of count signal, a second bistable output for developing a second active signal in response to said start signal and an inactive signal in response to said second end of count signal, and a third bistable output for developing a third active signal in response to said start signal and an inactive signal in response to said third end of count signal;

first means for forwardly biasing certain ones of said first light emitting diodes, in accordance with said decoder output signals, for emitting the portions of light signals of said first primary color, in accordance with said active signal of said first bistable output;

second means for forwardly biasing certain ones of said second light emitting diodes, in accordance with said decoder output signals, for emitting the portions of light signals of said second primary color, in accordance with said active signal of said second bistable output; and third means for forwardly biasing certain ones of said third light emitting diodes, in accordance with said decoder output signals, for emitting the portions of light signals of said third primary color, in accordance with said active signal of said third bistable output.

5. A variable color display device comprising:

means for repeatedly defining a cycle by developing a start signal at the beginning of each said cycle;

input means for receiving a plurality of data representing the portions of a plurality of primary colors;

means for accumulating, in response to said start signal, counts respectively proportional to said data, and for developing, when respective count is accumulated, a respective end of count signal;

a plurality of display areas arranged in a pattern for exhibiting, upon selective activation, a plurality of display units, each said display area including a plurality of light emitting diodes for emitting, when forwardly biased, light signals of respective primary colors, and means for combining said light signals in said display area to obtain a light signal of a composite color, each said light emitting diode including a first terminal and a second terminal, all said first terminals being of the same polarity, and all said second terminals being of the same polarity, opposite of the polarity of said first terminals;

means for decoding including a decoder input, for receiving an input code defining a selected display unit, and a plurality of decoder outputs, said decoder outputs being coupled to said first terminals of said light emitting diodes in accordance with their positions in said pattern, said decoder outputs producing selective decoder output signals for selecting certain of said display areas, corresponding by their positions in said pattern to the selected display unit, in response to a specific input code;

bistable means including a plurality of bistable outputs, equal in number to the number of said primary colors and respectively associated therewith, each said bistable output developing an active signal in response to said start signal and an inactive signal in response to the respective end of count signal;

a plurality of buses, equal in number to the plurality of said primary colors, to which said second terminals of all said light emitting diodes are coupled in accordance with their colors; and means for energizing said buses, in accordance with said active signals, respectively, for forwardly biasing certain ones of said light emitting diodes, in accordance with said decoder output signals, for emitting the portions of light signals of said primary colors in accordance with said data, respectively.

6. A variable color display device comprising:

means for repeatedly defining a cycle including a predetermined number of pulses by developing a start signal at the beginning of each said cycle;

input means for receiving data representing the portions of a first primary color;

means for accumulating, in response to said start signal, a count proportional to said data, and for developing, when the count is accumulated, an end of count signal;

a plurality of display areas arranged in a pattern for exhibiting, upon selective activation, a plurality of display units, each said display area including a first light emitting diode for emitting, when forwardly biased, light signals of a first primary color, a second light emitting diode for emitting, when forwardly biased, light signals of a second primary color, and means for combining said light signals in said display area to obtain a light signal of a composite color, each said light emitting diode including a first terminal and a second terminal, all said first terminals being of the same polarity, and all said second terminals being of the same polarity, opposite of the polarity of said first terminals;

means for decoding including a decoder input, for receiving an input code defining a selected display unit, and a plurality of decoder outputs, said decoder outputs being coupled to said first terminals of said light emitting diodes in accordance with their positions in said pattern, said decoder outputs producing selective decoder output signals for selecting certain of said display areas, corresponding by their positions in said pattern to the selected display unit, in response to a specific input code;

bistable means including a bistable output for developing an active signal in response to said start signal and an inactive signal in response to said end of count signal;

a first bus to which said second terminals of all said first light emitting diodes are commonly coupled;

a second bus to which said second terminals of all said second light emitting diodes are commonly coupled;

first means for energizing said first bus, in accordance with said active signal, for forwardly biasing certain ones of said first light emitting diodes, in accordance with said decoder output signals, for causing them to emit the portions of light signals of said first primary color in accordance with said data; and second means for energizing said second bus, in accordance with said inactive signal, for forwardly biasing certain ones of said second light emitting diodes, in accordance with said decoder output signals, for causing them to emit the portions of light signals of said second primary color, which are complementary to the portions of said light signals of said first primary color.

7. A variable color display device comprising:

means for repeatedly defining a cycle including a predetermined number of pulses by developing a start signal at the beginning of each said cycle;

input means for receiving data representing the portions of a first primary color;

means for accumulating, in response to said start signal, a count proportional to said data, and for developing, when the count is accumulated, an end of count signal;

a plurality of display areas arranged in a pattern for exhibiting, upon selective activation, a plurality of display units, each said display area including a first light emitting diode for emitting, when forwardly biased, light signals of a first primary color, a second light emitting diode for emitting, when forwardly biased, light signals of a second primary color, and means for combining said light signals in said display area to obtain a light signal of a composite color, each said light emitting diode including a first terminal and a second terminal, all said first terminals being of the same polarity, and all said second terminals being of the same polarity, opposite of the polarity of said first terminals;

means for decoding including a decoder input, for receiving an input code defining a selected display unit, and a plurality of decoder outputs, said decoder outputs being coupled to said first terminals of said light emitting diodes in accordance with their positions in said pattern, said decoder outputs producing selective decoder output signals for selecting certain of said display areas, corresponding by their positions in said pattern to the selected display unit, in response to a specific input code;

bistable means including a true output and a complementary output, said true output being set to its active condition in response to said start signal and to its inactive condition in response to said end of count signal, and said complementary output being in the opposite condition;

a first bus to which said second terminals of all said first light emitting diodes are commonly coupled;

a second bus to which said second terminals of all said second light emitting diodes are commonly coupled;

first means for energizing said first bus, in accordance with said active condition of said true output, for forwardly biasing certain ones of said first light emitting diodes, in accordance with said decoder output signals, for causing them to emit the portions of light signals of said first primary color in accordance with said data; and second means for energizing said second bus, in accordance with the active condition of said complementary output, for forwardly biasing certain ones of said second light emitting diodes, in accordance with said decoder output signals, for causing them to emit the portions of light signals of said second primary color, which are complementary to the portions of said light signals of said first primary color.

8. A variable color display device comprising:

means for repeatedly defining a cycle by developing a start signal at the beginning of each said cycle;

input means for receiving first data, representing the portions of a first primary color, second data, representing the portions of a second primary color, and third data, representing the portions of a third primary color;

means for accumulating, in response to said start signal, a first count proportional to said first data and for developing when said first count is accumulated a first end of count signal, a second count proportional to said second data and for developing when said second count is accumulated a second end of count signal, and a third count proportional to said third data and for developing when said third count is accumulated a third end of count signal;

a plurality of display areas arranged in a pattern for exhibiting, upon selective activation, a plurality of display units, each said display area including a first light emitting diode for emitting, when forwardly biased, light signals of a first primary color, a second light emitting diode for emitting, when forwardly biased, light signals of a second primary color, a third light emitting diode for emitting, when forwardly biased, light signals of a third primary color, and means for combining said light signals in said display area to obtain a light signal of a composite color, each said light emitting diode including a first terminal and a second terminal, all said first terminals being of the same polarity, and all said second terminals being of the same polarity, opposite of the polarity of said first terminals;

means for decoding including a decoder input, for receiving an input code defining a selected display unit, and a plurality of decoder outputs, said decoder outputs being coupled to said first terminals of said light emitting diodes in accordance with their positions in said pattern, said decoder outputs producing selective decoder output signals for selecting certain of said display areas, corresponding by their positions in said pattern to the selected display unit, in response to a specific input code;

bistable means including a first bistable output for developing a first active signal in response to said start signal and an inactive signal in response to said first end of count signal, a second bistable output for developing a second active signal in response to said start signal and an inactive signal in response to said second end of count signal, and a third bistable output for developing a third active signal in response to said start signal and an inactive signal in response to said third end of count signal;

a first bus to which said second terminals of all said first light emitting diodes are commonly coupled;

a second bus to which said second terminals of all said second light emitting diodes are commonly coupled;

a third bus to which said second terminals of all said third light emitting diodes are commonly coupled;

first means for energizing said first bus, in accordance with said first active signal, for forwardly biasing certain ones of said first light emitting diodes, in accordance with said decoder output signals, for emitting the portions of light signals of said first primary color in accordance with said first data;

second means for energizing said second bus, in accordance with said second active signal, for forwardly biasing certain ones of said second light emitting diodes, in accordance with said decoder output signals, for emitting the portions of light signals of said second primary color in accordance with said second data; and third means for energizing said third bus, in accordance with said third active signal, for forwardly biasing certain ones of said third light emitting diodes, in accordance with said decoder output signals, for emitting the portions of light signals of said third primary color in accordance with said third data.

\* \* \* \* \*